US011476249B2

(12) United States Patent
Naito

(10) Patent No.: US 11,476,249 B2
(45) Date of Patent: Oct. 18, 2022

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/799,719

(22) Filed: Feb. 24, 2020

(65) Prior Publication Data

US 2020/0194429 A1 Jun. 18, 2020

Related U.S. Application Data

(63) Continuation of application No. PCT/JP2019/009485, filed on Mar. 8, 2019.

(30) Foreign Application Priority Data

Mar. 15, 2018 (JP) ............................ JP2018-048634

(51) Int. Cl.
*H01L 27/00* (2006.01)
*H01L 27/07* (2006.01)
(Continued)

(52) U.S. Cl.
CPC ...... *H01L 27/0761* (2013.01); *H01L 27/0664* (2013.01); *H01L 29/7397* (2013.01); *H01L 29/8613* (2013.01)

(58) Field of Classification Search
CPC ............. H01L 27/0761; H01L 29/7397; H01L 29/8613; H01L 29/4238; H01L 29/0696;
(Continued)

(56) References Cited

U.S. PATENT DOCUMENTS 8,080,853 B2 * 12/2011 Tsuzuki ............. H03K 17/0828 257/370
9,214,535 B2 * 12/2015 Matsudai .......... H01L 29/66348
(Continued)

FOREIGN PATENT DOCUMENTS

JP 2010283132 A 12/2010
JP 2013065735 A 4/2013
(Continued)

OTHER PUBLICATIONS

International Search Report and (ISA/237) Written Opinion of the International Search Authority for International Patent Application No. PCT/JP2019/009485, mailed by the Japan Patent Office dated Jun. 11, 2019.

*Primary Examiner* — Shouxiang Hu

(57) ABSTRACT

A semiconductor device including a semiconductor substrate, first and second transistor sections and a diode section provided on the substrate, is provided. The diode section is arranged to be adjacent to and sandwiched between the first and second transistor sections in a predetermined arrangement direction. The diode section includes a drift region; a base region above the drift region; first cathode regions and second cathode regions below the drift region. The first and second transistor sections each include a collector region. The first cathode regions are provided continuously between the collector regions of the first and second transistor sections. One end and another end of the first cathode regions in the arrangement direction are in contact with the collector regions of the first and second transistor sections, respectively. The first and second cathode regions are in contact with each other and alternating in a direction orthogonal to the arrangement direction.

15 Claims, 74 Drawing Sheets

(51) Int. Cl.
*H01L 29/739* (2006.01)
*H01L 29/861* (2006.01)
*H01L 27/06* (2006.01)

(58) Field of Classification Search
CPC ... H01L 29/407; H01L 29/36; H01L 29/0603; H01L 27/0727; H01L 29/12; H01L 29/78; H01L 29/0834; H01L 29/1095; H01L 29/861; H01L 29/41708; H01L 27/0664; H01L 29/083; H01L 29/0615
See application file for complete search history.

(56) References Cited

U.S. PATENT DOCUMENTS

| | | | |
|---|---|---|---|
| 10,374,102 | B2 | 8/2019 | Onozawa |
| 10,510,904 | B2 | 12/2019 | Masuoka |
| 2010/0308446 | A1 | 12/2010 | Nakamura |
| 2012/0132954 | A1* | 5/2012 | Kouno ................ H01L 29/0696 257/140 |
| 2014/0361333 | A1 | 12/2014 | Kimura |
| 2015/0262999 | A1 | 9/2015 | Ogura |
| 2016/0351561 | A1 | 12/2016 | Senoo |
| 2018/0138299 | A1 | 5/2018 | Naito |
| 2018/0166279 | A1 | 6/2018 | Tamura |
| 2019/0214379 | A1* | 7/2019 | Senoo ................ H01L 29/0834 |

FOREIGN PATENT DOCUMENTS

| | | | |
|---|---|---|---|
| JP | 2013152996 | A | 8/2013 |
| JP | 2014156849 | A | 8/2014 |
| JP | 2015177057 | A | 10/2015 |
| JP | 2016225345 | A | 12/2016 |
| WO | 2014156849 | A1 | 10/2014 |
| WO | 2016129041 | A1 | 6/2017 |
| WO | 2017146148 | A1 | 8/2017 |

* cited by examiner

100 bb-bb'
200

SEMICONDUCTOR DEVICE

The contents of the following Japanese patent applications are incorporated herein by reference:

NO. 2018-048634 filed in JP on Mar. 15, 2018, and

NO. PCT/JP2019/009485 filed on Mar. 8, 2019.

BACKGROUND

1. Technical Field

The present invention relates to a semiconductor device.

2. Related Art

In the related art, a semiconductor device such as an insulated gate bipolar transistor (IGBT) is known (for example, refer to Patent Document 1). Patent Document 1: WO2016/129041

In the semiconductor device, it is preferable to suppress voltage overshoot upon reverse recovery.

SUMMARY

A first aspect of the present invention provides a semiconductor device. The semiconductor device includes a semiconductor substrate; a transistor section provided on the semiconductor substrate; and a diode section provided on the semiconductor substrate, the diode section and the transistor section being arranged in a predetermined arrangement direction. The diode section includes a first conductivity-type drift region provided in the semiconductor substrate; a second conductivity-type base region being in contact with an upper surface of the semiconductor substrate and provided above the drift region; a plurality of first cathode regions of a first conductivity-type separated from each other and a plurality of second cathode regions separated from each other and having a conductivity type different from that of the first cathode regions, the plurality of first cathode regions and the plurality of second cathode regions being in contact with a lower surface of the semiconductor substrate and provided below the drift region; and a plurality of second conductivity-type floating regions provided to be separated from each other and distributed to all the first cathode regions, and arranged to at least partially overlap the first cathode regions.

The first cathode regions may extend beyond the floating regions in the arrangement direction, as seen from above the semiconductor substrate. The first cathode regions may alternate with the second cathode regions in an extension direction orthogonal to the arrangement direction, as seen from above the semiconductor substrate. The floating regions may be each provided in the extension direction so as to overlap both a corresponding one of the first cathode regions and one of the second cathode regions, as seen from above the semiconductor substrate.

The floating regions may extend beyond the first cathode regions in the extension direction, as seen from above the semiconductor substrate. The first cathode regions may extend beyond the floating regions in an extension direction orthogonal to the arrangement direction.

The first cathode regions may alternate with the second cathode regions in the arrangement direction, as seen from above the semiconductor substrate. The plurality of floating regions may be each provided in the arrangement direction so as to overlap both a corresponding one of the first cathode regions and one of the second cathode regions adjacent to that first cathode region, as seen from above the semiconductor substrate. The floating regions may extend beyond the first cathode regions in the arrangement direction, as seen from above the semiconductor substrate.

A second aspect of the present invention provides a semiconductor device. The semiconductor device includes a semiconductor substrate; a first conductivity-type drift region provided in the semiconductor substrate; and a second conductivity-type base region being in contact with an upper surface of the semiconductor substrate and provided above the drift region. The semiconductor device includes a first cathode region of a first conductivity-type being in contact with a lower surface of the semiconductor substrate and provided below the drift region; a second cathode region of a second conductivity-type being in contact with the lower surface of the semiconductor substrate and provided below the drift region, the second cathode region being sandwiched between first cathode regions, the first cathode regions each being the first cathode region; and a third cathode region of a second conductivity-type being in contact with the lower surface of the semiconductor substrate and provided below the drift region, the first cathode region and the second cathode region being sandwiched between third cathode regions, the third cathode regions each being the third cathode region. In the semiconductor device, a width of the third cathode region in an arrangement direction in which the first cathode region and the second cathode region are arranged may be greater than a width of the second cathode region in the arrangement direction, as seen from above the semiconductor substrate.

A width of the second cathode region in a direction in which the first cathode region and the second cathode region are sandwiched between the third cathode regions is greater than the width of the second cathode region in the arrangement direction, as seen from above the semiconductor substrate. The semiconductor device may include the plurality of the second cathode regions and the plurality of the third cathode regions. The plurality of the second cathode regions may be in contact with the plurality of the third cathode regions, as seen from above the semiconductor substrate.

A third aspect of the present invention provides a semiconductor device. The semiconductor device includes a semiconductor substrate; and one or more diode sections provided on the semiconductor substrate. The diode sections each include a first conductivity-type drift region provided in the semiconductor substrate; and a second conductivity-type base region being in contact with an upper surface of the semiconductor substrate and provided above the drift region. The semiconductor device includes a plurality of first cathode regions of a first conductivity-type separated from each other and a plurality of second cathode regions separated from each other and having a conductivity type different from that of the first cathode regions, the first cathode regions of the first conductivity-type and the second cathode regions being in contact with a lower surface of the semiconductor substrate and provided below the drift region; and a plurality of second conductivity-type floating regions provided to be separated from each other and distributed to all the first cathode regions, and arranged to at least partially overlap the first cathode regions.

The summary of the present invention does not necessarily describe all necessary features of the present invention. The present invention may also be a sub-combination of the features described above.

DESCRIPTION OF EXEMPLARY EMBODIMENTS

Hereinbelow, embodiments of the present invention will be described. However, the embodiments do not limit the invention defined in the claims. Also, all combinations of features described in the embodiments are not necessarily essential to solving means of the invention.

As used herein, one side in a direction parallel to a depth direction of a semiconductor substrate is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a mounting direction of a semiconductor device to a substrate and the like when mounting the same.

As used herein, the technical matters may be described using orthogonal coordinates axes of X-axis, Y-axis and Z-axis, in some cases. As used herein, a plane parallel to the upper surface of the semiconductor substrate is defined as 'XY plane', and a depth direction of the semiconductor substrate is defined as 'Z-axis'.

In each embodiment, an example in which a first conductivity-type is N type and a second conductivity-type is P type is described. However, the first conductivity-type may be P type and the second conductivity-type may be N type. In this case, the conductivity types of the substrate, layers, regions, and the like in each embodiment are reversed.

Figure 1A:
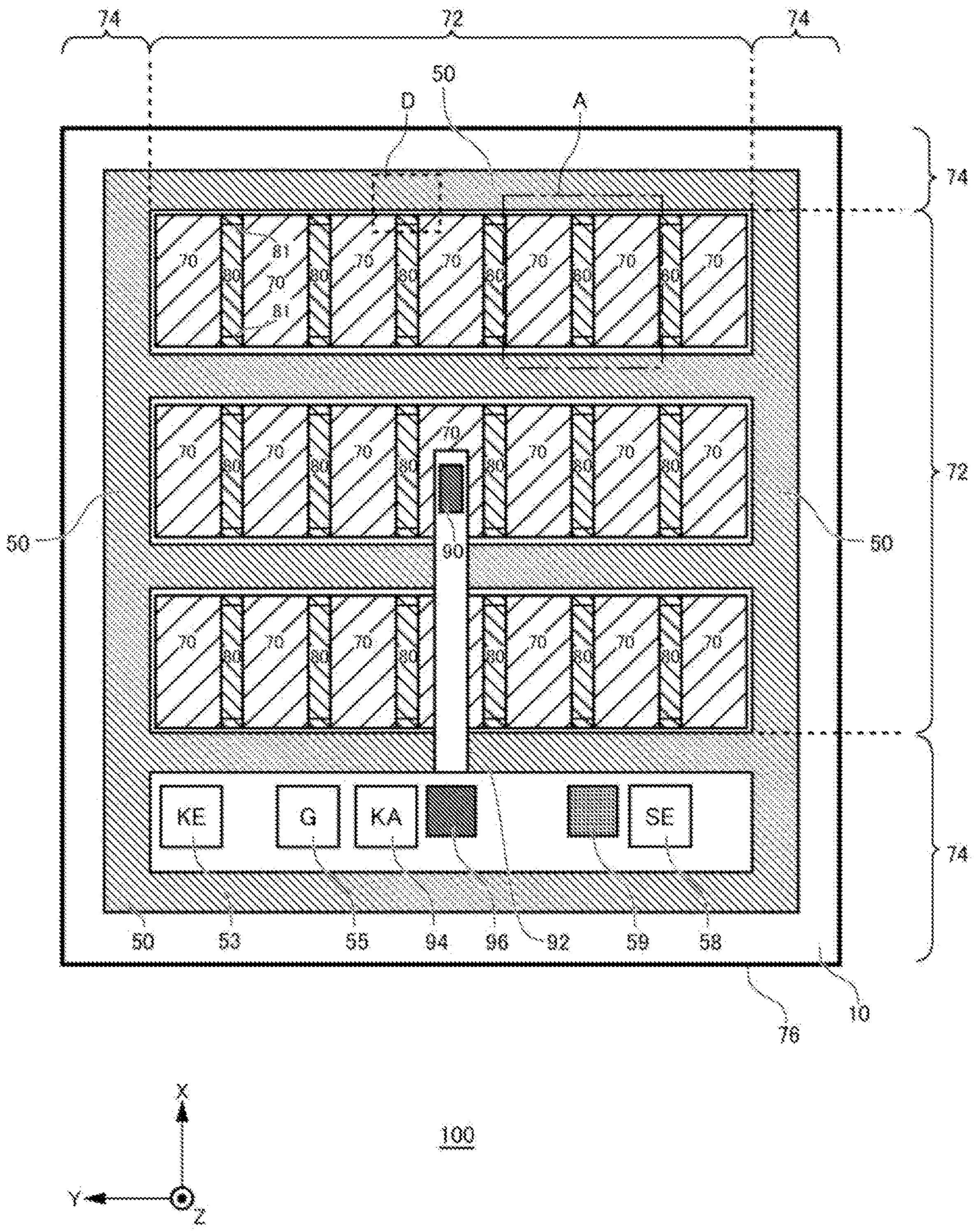
FIG. 1A shows an example of an upper surface of a semiconductor device 100 in accordance with the present embodiment.

As used herein, a doping concentration refers to a concentration of impurities transformed to donors or acceptors. As used herein, there is a case in which a difference of concentration of the donors and acceptors is defined as the doping concentration. Also, there is a case in which a peak value of the doping concentration distribution in a doped region is defined as the doping concentration in the doped region. In a case in which the doping concentration in the doped region is substantially uniform, for example, an average value of doping concentrations in the doped region may be defined as the doping concentration, FIG. 1A shows an example of an upper surface of a semiconductor device 100 in accordance with the present embodiment. The semiconductor device 100 of the present example is a semiconductor chip including transistor sections 70 and diode sections 80. The transistor sections 70 each include a transistor such as an IGBT. The diode sections 80 each include a diode such as an FWD (Free Wheel Diode) provided in the vicinity of the transistor section 70 on an upper surface of the semiconductor substrate 10.

The semiconductor substrate 10 is provided with an active section 72. The active section 72 is a region in which main current flows between the upper surface and a lower surface of the semiconductor substrate 10 when the semiconductor device 100 is controlled to be in an on state. That is, the active section 72 is a region in which current flows in a depth direction in the semiconductor substrate 10 from the upper surface toward the lower surface or from the lower surface toward the upper surface of the semiconductor substrate 10. As used herein, the transistor section 70 and the diode section 80 are respectively referred to as an element section or an element region. A region in which the element section is provided may also be referred to as the active section 72.

In the meantime, a region sandwiched between two element sections as seen from above the semiconductor substrate 10 is also referred to as the active section 72. In the example of FIG. 1A, a region which is sandwiched between the element sections and in which a gate metal layer 50 is provided is also included in the active section 72. The active section 72 may also be a region in which an emitter electrode is provided and a region that is sandwiched between the emitter electrodes, as seen from above the semiconductor substrate 10

In the example of FIG. 1A, an emitter electrode is provided above the transistor section 70 and the diode section 80.

A region between the active section 72 and an outer peripheral end 76 of the semiconductor substrate 10 as seen from above the semiconductor substrate 10 is referred to as an outer periphery region 74. The outer periphery region 74 is provided surrounding the active section 72, as seen from above the semiconductor substrate 10. In the outer periphery region 74, one or more metal pads for connecting the semiconductor device 100 and an external device with a wire or the like may be arranged. The semiconductor device 100 may include an edge termination structure part surrounding the active section 72 in the outer periphery region 74. The edge termination structure part alleviates electric field concentration on the upper surface side of the semiconductor substrate 10. The edge termination structure part may have, for example, a guard ring, a field plate, RESURF and a combined structure thereof.

In the active section 72, a plurality of the transistor sections 70 and a plurality of the diode sections 80 may be provided. The transistor sections 70 may periodically alternate with the diode sections 80 in the XY plane. FIG. 1A shows an example in which the three transistor sections 70 are provided in the X-axis direction and the seven transistor sections 70 are provided in the Y-axis direction, and the three diode sections 80 are provided in the X-axis direction and the six diode sections 80 are provided in the Y-axis direction. The gate metal layer 50 may be provided between the transistor sections 70 facing each other in the X-axis direction.

Each of the diode sections 80 is provided with a first conductivity-type cathode region 81 in the lower surface of the semiconductor substrate 10. As shown in FIG. 1A, the cathode region 81 may be provided in a range that is not in contact with the outer periphery region 74.

The gate metal layer 50 may be provided so as to surround the active section 72 as seen from above the semiconductor substrate 10. The gate metal layer 50 is electrically connected to a gate pad 55 provided in the outer periphery region 74. The gate metal layer 50 may also be provided along the outer peripheral end 76 of the semiconductor substrate 10. The gate pad 55 may be arranged between the outer peripheral end 76 and the active section 72 of the semiconductor substrate 10 in the X-axis direction. Between the gate pad 55 and the outer peripheral end 76, the gate metal layer 50 may be provided to extend in the Y-axis direction.

A temperature sensing part 90 is provided above the active section 72. The temperature sensing part 90 may be provided at a center of the active section 72, as seen from above the semiconductor substrate 10. The temperature sensing part 90 is configured to detect a temperature of the active section 72. The temperature sensing part 90 may be a pn-junction temperature sensing diode formed of monocrystalline or polycrystalline silicon.

A temperature sensing wire 92 is provided above the active section 72, as seen from above the semiconductor substrate 10. The temperature sensing wire 92 is connected to the temperature sensing part 90. The temperature sensing wire 92 extends to the outer periphery region 74 in a predetermined direction (the X-axis direction, in the present example), and is connected to a temperature measuring pad 94 provided in the outer periphery region 74. The current flowing from the temperature measuring pad 94 flows through the temperature sensing wire 92 and the temperature sensing part 90. In a case in which the temperature sensing part 90 is a pn-junction temperature sensing diode, at least two temperature sensing wires 92 and temperature measuring pads 94 are provided, one of which is electrically connected to an anode terminal of the pn-junction temperature sensing diode and the other is electrically connected to a cathode terminal of the pn-junction temperature sensing diode. A detection part 96 is provided as a spare for the temperature sensing part 90.

In the outer periphery region 74, a current sensing part 59, a current sensing pad 58, and a Kelvin pad 53 are provided. The current sensing part 59 is configured to detect current flowing through the gate pad 55. The current sensing pad 58 is a pad for measuring current flowing through the current sensing part 59. The Kelvin pad 53 is connected to the emitter electrode provided above the active section 72, as seen from above the semiconductor substrate 10.

Figure 1B:
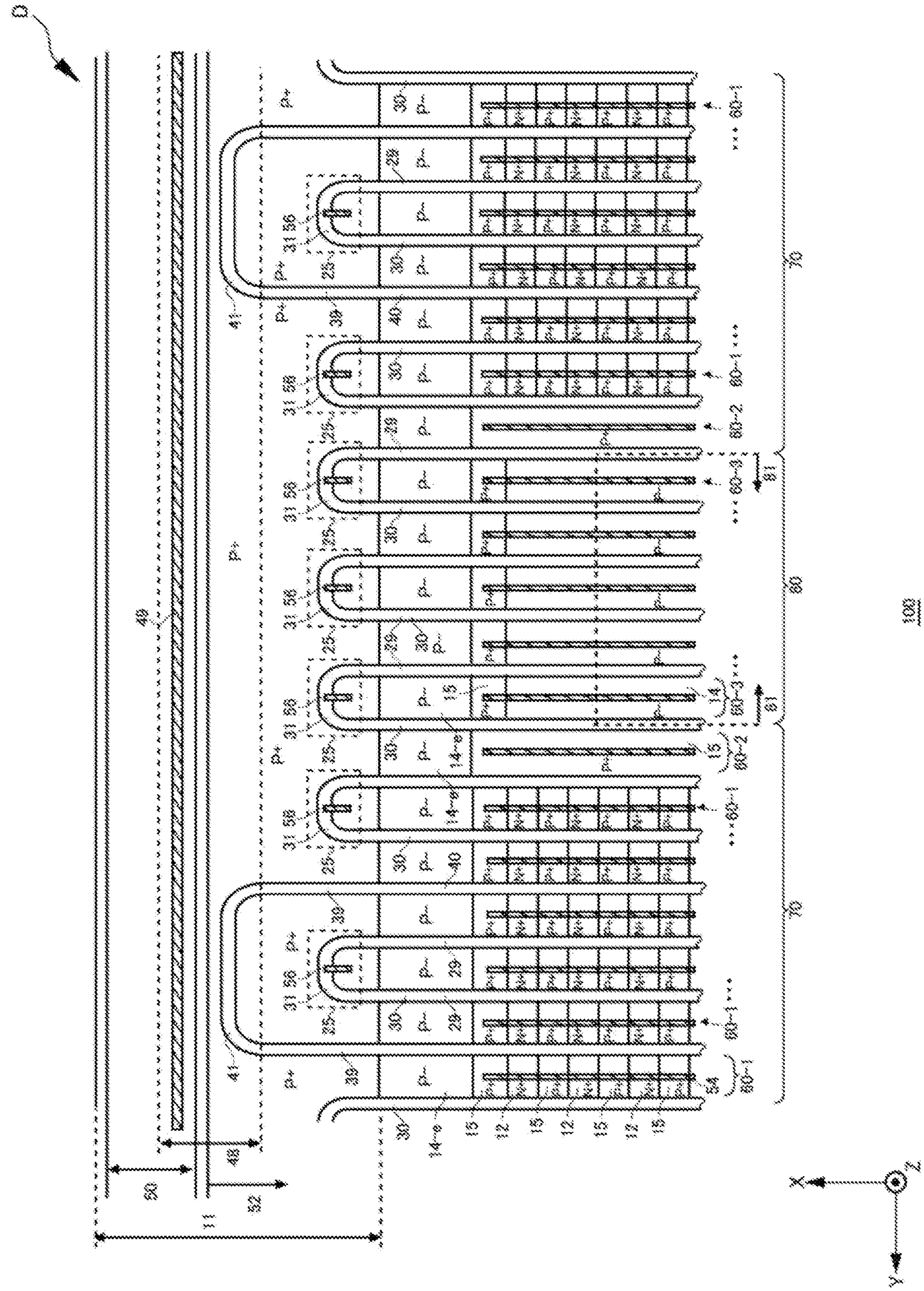
FIG. 1B is an enlarged view of a region D in FIG. 1A.

FIG. 1B is an enlarged view of a region D in FIG. 1A. The semiconductor device 100 of the present example includes gate trench parts 40, dummy trench parts 30, a P+ type well region 11, N+ type emitter regions 12, P− type base regions 14 and P+ type contact regions 15, which are provided in the semiconductor substrate 10 and exposed on the upper surface of the semiconductor substrate 10. As used herein, the gate trench part 40 or the dummy trench part 30 may be simply referred to as a trench part. Also, the semiconductor device 100 of the present example includes an emitter electrode 52 and a gate metal layer 50 provided above the upper surface of the semiconductor substrate 10. The emitter electrode 52 and the gate metal layer 50 are provided separated from each other.

Although not shown in FIG. 1B, an interlayer dielectric film is provided between the emitter electrode 52 and gate metal layer 50 and the upper surface of the semiconductor substrate 10. In the interlayer dielectric film of the present example, contact holes 56, a contact hole 49 and contact holes 54 are provided to penetrate the interlayer dielectric film. The gate metal layer 50 is in contact with a gate runner 48 via the contact hole 49.

The emitter electrode 52 is in contact with the emitter regions 12, the contact regions 15 and the base regions 14 on the upper surface of the semiconductor substrate 10 via the contact holes 54. Also, the emitter electrode 52 is connected to a dummy conductive portion in the dummy trench part 30 via the contact hole 56. A connection portion 25 formed of a conductive material such as polysilicon doped with impurities may be provided between the emitter electrode 52 and the dummy conductive portion. A dielectric film such as an oxide film is provided between the connection portion 25 and the upper surface of the semiconductor substrate 10.

The gate runner 48 is formed of polysilicon doped with impurities, for example. The gate runner 48 is connected to a gate conductive portion in the gate trench part 40 on the upper surface of the semiconductor substrate. The gate runner 48 is not connected to the dummy conductive portion in the dummy trench part 30. The gate runner 48 of the present example is formed from below the contact hole 49 to an edge portion 41 of the gate trench part 40.

A dielectric film such as an oxide film is provided between the gate runner 48 and the upper surface of the semiconductor substrate 10. At the edge portion 41 of the gate trench part 40, the gate conductive portion is exposed on the upper surface of the semiconductor substrate The dielectric film above the gate conductive portion is provided with a contact hole formed to interconnect the gate conductive portion and the gate runner 48. In the meantime, in FIG. 1B, the emitter electrode 52 and the gate runner 48 are partially overlapped, as seen from above. However, the emitter electrode 52 and the gate runner 48 sandwich a dielectric film (not shown) therebetween and are thus electrically insulated from each other.

The emitter electrode 52 and the gate metal layer 50 are formed of a material including metal. For example, at least a part of a region of each electrode is formed of aluminum or an aluminum-silicon alloy. Each electrode may have a barrier metal formed of, for example, titanium or a titanium compound below the region formed of, for example, aluminum, and may have a plug formed of, for example, tungsten in the contact hole.

One or more gate trench parts 40 and one or more dummy trench parts 30 are arranged at predetermined intervals in a predetermined arrangement direction (the Y-axis direction, in the present example) on the upper surface of the semiconductor substrate 10. In the transistor section 70 of the present example, one or more gate trench parts 40 alternate with one or more dummy trench parts 30 in the arrangement direction.

The gate trench part 40 of the present example may have two linear portions 39 extending in a longitudinal direction (the X-axis direction, in the present example) perpendicular to the arrangement direction and an edge portion 41 connecting the two linear portions 39. At least a part of the edge portion 41 is preferably formed in a curved shape on the upper surface of the semiconductor substrate 10. The end portions, which are ends of linear shapes along the longitudinal direction, of the two linear portions 39 of the gate trench part 40 are connected by the edge portion 41, so that electric field concentration at the end portions of the linear portions 39 can be reduced. As used herein, the respective linear portions 39 of the gate trench part 40 are handled as one gate trench part 40.

At least one dummy trench part 30 is provided between the respective linear portions 39 of the gate trench part 40. As with the gate trench part 40, the dummy trench part 30 may have linear portions 29 and an edge portion 31. In another example, the dummy trench part 30 may have the linear portions 29 without the edge portion 31. In the example of FIG. 1B, in the transistor section 70, the two linear portions 29 of the dummy trench part 30 are arranged between the two linear portions 39 of the gate trench part 40.

In the diode section 80, a plurality of the dummy trench parts 30 is arranged in the Y-axis direction on the upper surface of the semiconductor substrate 10. In the diode section 80, a shape of the dummy trench part 30 on the XY plane may be similar to that of the dummy trench part 30 provided in the transistor section 70.

The edge portion 31 and the linear portions 29 of the dummy trench part 30 may have similar shapes to those of the edge portion 41 and the linear portions 39 of the gate trench part 40. The dummy trench part 30 provided in the diode section 80 and the dummy trench part 30 having a linear shape and provided in the transistor section 70 may have the same length in the Y-axis direction.

The emitter electrode 52 is provided above the gate trench parts 40, the dummy trench parts 30, the well region 11, the emitter regions 12, the base regions 14 and the contact regions 15. The well region 11 is provided to be, in the XY plane, apart from one of the ends of the contact hole 54 in the longitudinal direction that is closer to where the gate metal layer 50 is provided.

A diffusion depth of the well region 11 may be greater than depths of the gate trench part 40 and the dummy trench part 30. Partial regions of the gate trench part 40 and the dummy trench part 30 that are close to the gate metal layer 50 are provided in the well region 11. A bottom of the edge portion 41 of the gate trench part 40 in the Z-axis direction and a bottom of the edge portion 31 of the dummy trench part 30 in the Z-axis direction may be covered by the well region 11.

One or more mesa parts 60 sandwiched between the respective trench parts are provided in each of the transistor section 70 and the diode section 80. The mesa part 60 is a region farther on the upper surface side than where the deepest bottom of the trench part is located, in a region of the semiconductor substrate 10 sandwiched between the trench parts.

The mesa part 60 sandwiched between the respective trench parts is provided with the base region 14. The base region 14 is of a second conductivity-type (P− type) and has a doping concentration lower than that of the well region 11.

An upper surface of the base region 14 of the mesa part 60 is provided with the second conductivity-type contact region 15 having a doping concentration higher than that of the base region 14. The contact region 15 of the present example is of a P+ type. On the upper surface of the semiconductor substrate 10, the well region 11 may be provided to be, in the direction toward the gate metal layer 50, apart from the contact region 15 which is arranged at the farthest position in the X-axis direction of the contact regions 15. On the upper surface of the semiconductor substrate 10, the base region 14 is exposed between the well region 11 and the contact region 15.

In the transistor section 70, the first conductivity-type emitter region 12 having a doping concentration higher than that of a drift region provided in the semiconductor substrate 10 is selectively provided on an upper surface of a mesa part 60-1. In the present example, the emitter region 12 is of an N+ type. A part that is of the base region 14 adjacent to the emitter region 12 in the depth direction (−Z-axis direction) of the semiconductor substrate 10 and that is in contact with the gate trench part 40 functions as a channel part. When an ON-voltage is applied to the gate trench part 40, a channel, which is an inversion layer of electrons, is formed in a part that is of the base region 14 provided between the emitter region 12 and the drift region in the Z-axis direction and that is adjacent to the gate trench part 40. The channel is formed in the base region 14, so that carriers flow between the emitter region 12 and the drift region.

In the present example, base regions 14-*e* are arranged at both end portions of each mesa part 60 in the X-axis direction. In the present example, one of the regions adjacent to the base region 14-*e* on the upper surface of each mesa part 60 that is closer to the center of the mesa part 60 is the contact region 15. Also, the other region adjacent to the base region 14-*e* on an opposite side to the contact region 15 is the well region 11.

In the present example, the contact regions 15 alternate with the emitter regions 12 in the X-axis direction in a region sandwiched between the base regions 14-*e* located at both ends in the X-axis direction of the mesa part 60-1 of the transistor section 70. Each of the contact region 15 and the emitter region 12 is provided from one of the adjacent trench parts to the other.

One or more mesa parts 60-2, which are provided at a boundary with the diode section 80, of the mesa parts 60 in the transistor section 70 are provided with a contact region 15 having an area greater than that of the contact region 15 of the mesa part 60-1. In the mesa part 60-2, the emitter region 12 may not be provided. In the mesa part 60-2 of the present example, the contact region 15 is provided over the entire region sandwiched between the base regions 14-*e*.

In each mesa part 60-1 of the transistor section 70 of the present example, the contact hole 54 is provided above each of the contact regions 15 and the emitter regions 12. In the mesa part 60-2, the contact hole 54 is provided above the contact region 15. In each mesa part 60, the contact hole 54 is not provided in areas corresponding to the base region 14-*e* and the well region 11. In the respective mesa parts 60 of the transistor section 70, the contact holes 54 may have the same length in the X-axis direction.

In the diode section 80, the cathode region 81 is provided in a region in contact with the lower surface of the semiconductor substrate 10. As described later, the cathode region 81 may include an N+ type first cathode region, a P+ type second cathode region and a P+ type third cathode region. In FIG. 1B, the region in which the cathode region 81 is provided is shown with the broken line. In a region, in which the cathode region 81 is not provided, of the region in contact with the lower surface of the semiconductor substrate 10, a P+ type collector region may be provided.

The transistor section 70 may be a region, in which the mesa part 60 having the contact regions 15 and emitter regions 12 and the trench part adjacent to the mesa part 60 are provided, of a region overlapping the collector region in the Z-axis direction. In the meantime, the mesa part 60-2 at the boundary with the diode section 80 may be provided with the contact region 15, instead of the emitter region 12.

The base region 14 is arranged on an upper surface of a mesa part 60-3 of the diode section 80. In the meantime, a region adjacent to the base region 14-*e* may be provided with the contact region 15. The contact hole 54 terminates above the contact region 15. In the example of FIG. 1B, the diode section 80 includes the five mesa parts 60-3 and the six dummy trench parts 30 sandwiching the mesa parts 60-3. However, the numbers of the mesa parts 60-3 and the dummy trench parts 30 in the diode section 80 are not limited thereto. In the diode section 80, the more mesa parts 60-3 and the more dummy trench parts 30 may be provided.

Figure 2A:
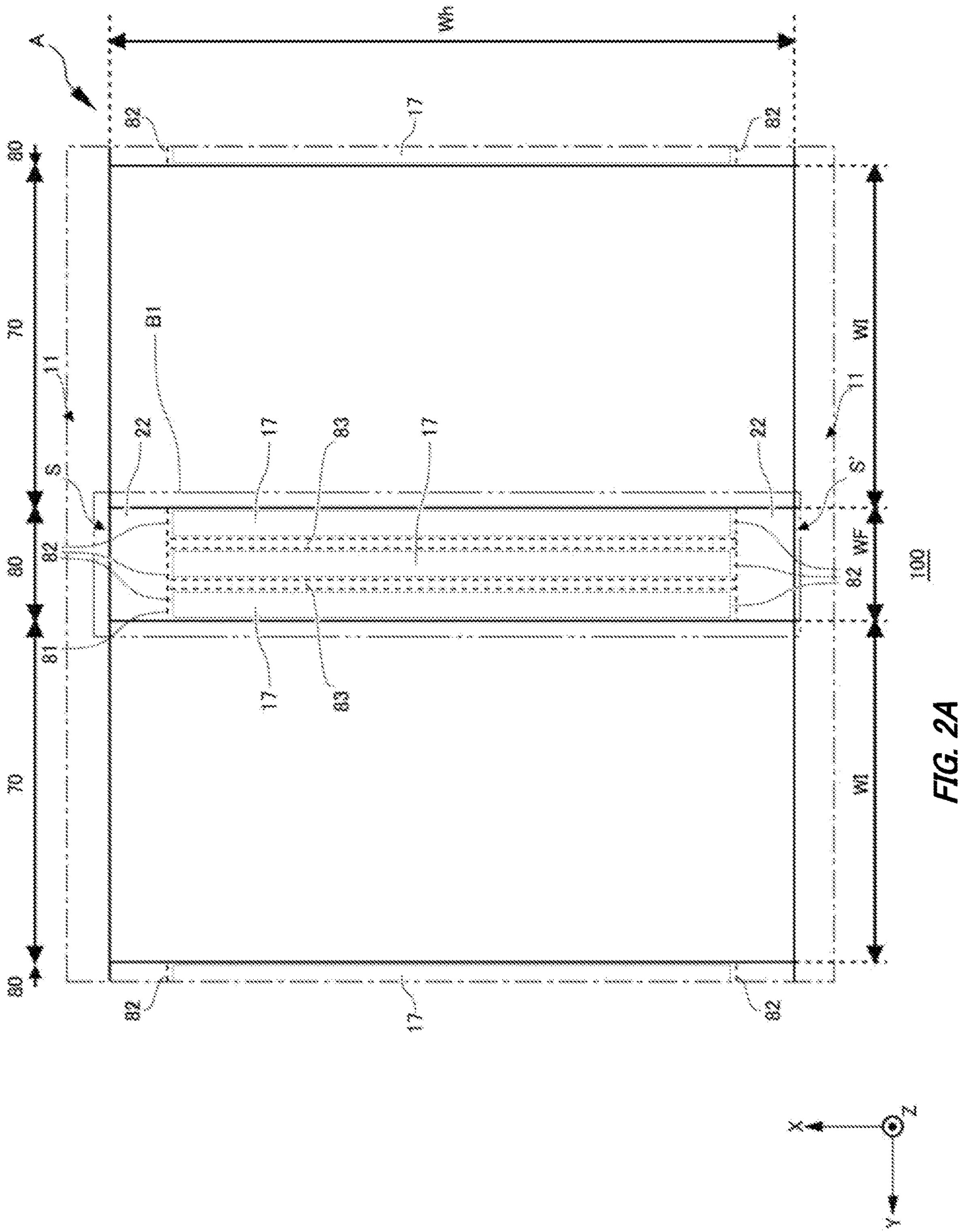
FIG. 2A is an enlarged view of a region A in FIG. 1A.

FIG. 2A is an enlarged view of a region A in FIG. 1A. As shown in FIG. 2A, the semiconductor device 100 of the present example includes the transistor sections 70 provided adjacent to the diode section 80 on both positive and negative sides of the Y-axis direction in the diode section 80.

A width WI is a width of the transistor section 70 in the Y-axis direction. A width WF is a width of the diode section 80 in the Y-axis direction. A width Wh is a width of a part ranging from an end of the well region 11 arranged on the positive side of the X-axis direction with respect to the transistor section 70 and the diode section 80 to an end of the well region 11 arranged on the negative side of the X-axis direction with respect to the transistor section 70 and the diode section 80. The part is provided with the base region 14 on the upper surface side of the semiconductor substrate 10 and is not provided with the well region 11.

The width WI may be greater than the width WF. The width WI may be two times or greater and five times or less as large as the width WF. The width WI may be 1200 μm or greater and 2000 μm or less. The width WI is, for example, 1500 μm. The width WF may be 400 μm or greater and 600 μm or less. The width WF is, for example, 500 μm.

An end S of the P+ type well region 11 is provided on the positive side of the X-axis direction in the diode section 80 and the transistor section 70. Also, an end S' of the P+ type well region 11 is provided on the negative side of the X-axis direction in the diode section 80 and the transistor section 70. The well region 11 is provided outside a region in which the transistor sections 70 and the diode sections 80 are provided with the transistor sections alternating with the diode sections. In other words, the well region 11 is not provided in an area inside the transistor section 70 and the diode section 80 which is limited by ends S.

The width Wh ranging from the end S of the well region 11 on the positive side of the X-axis direction to the end S' of the well region 11 on the negative side of the X-axis direction may be greater than the width WI. The width Wh may be 1.5 times or greater and 3 times or less as large as the width WI. The width Wh may be 3000 μm or greater and 3600 μm or less. The width Wh may be, for example, 3100 μm.

In the diode section 80 of the semiconductor device 100 of the present example, the cathode region 81 includes first cathode regions 82 and second cathode regions 83, as shown in FIG. 2A. In the semiconductor device 100 of the present example, the plurality of the first cathode regions 82 separated from each other and the plurality of the second cathode regions 83 separated from each other are provided, the first cathode regions 82 and the second cathode regions 83 extending in the X-axis direction. In the present example, the first cathode regions 82 alternate with the second cathode regions 83 in the Y-axis direction, as seen from above the semiconductor substrate 10.

The first cathode region 82 is of a first conductivity-type. The first cathode region 82 of the present example is of, for example, N+ type. The second cathode region 83 has a conductivity type different from the first cathode region 82. The second cathode region 83 of the present example is of, for example, P+ type. In FIG. 2A, configurations except the first cathode region 82, the second cathode region 83, and the floating region 17 provided in the diode section 80 and the transistor section 70, i.e., configurations of the gate trench part 40, the dummy trench part 30 and the like are not shown.

The first cathode region 82 provided the farthest on the positive side of the Y-axis direction in the diode section 80 may be in contact with the transistor section 70 which is adjacent to that diode section 80 on the positive side of the Y-axis direction, as seen from above the semiconductor substrate 10. The first cathode region 82 provided the farthest on the negative side of the Y-axis direction in the diode section 80 may be in contact with the transistor section 70 which is adjacent to that diode section 80 on the negative side of the Y-axis direction, as seen from above the semiconductor substrate 10.

A second conductivity-type collector region 22 may be provided in a region in contact with the lower surface of the semiconductor substrate 10 between an end of the first cathode region 82 on the positive side of the X-axis direction and the end S in the X-axis direction. The collector region 22 may also be provided in a region in contact with the lower surface of the semiconductor substrate 10 between an end of the first cathode region 82 on the negative side of the X-axis direction and the end S' in the X-axis direction. The collector region 22 of the present example is of, for example, P+ type.

A positional relation between the cathode region 81 including the first cathode regions 82 and the second cathode regions 83 and a configuration except the first cathode regions 82 and the second cathode regions 83 may be a positional relation shown in the plan view of FIG. 1B. The configuration except the first cathode regions 82 and the second cathode regions 83 is, for example, the contact hole 54, the dummy trench part 30, and the contact region 15 provided at an end portion of the contact hole 54 in the X-axis direction.

In the diode section 80, an area ratio, expressed in percentage, of the first cathode region 82 to a total area of the first cathode region 82 and the second cathode region 83 may be 60% or greater and 90% or less, as seen from above the semiconductor substrate 10. An area ratio, expressed in percentage, of the second cathode region 83 to the total area may be 10% or greater and 40% or less. As an example, the area ratios of the first cathode region 82 and the second cathode region 83 to the total area are respectively 80% and 20%.

The semiconductor device 100 of the present example includes a plurality of floating regions 17 provided to be separated from each other and distributed to all the first cathode regions 82. The floating region 17 is of a second conductivity-type. The floating region 17 of the present example is of, for example, P+ type.

The floating region 17 is arranged to at least partially overlap the first cathode region 82, as seen from above the semiconductor substrate 10. FIG. 2A shows an example in which the entire floating region 17 is arranged to overlap the first cathode region 82, as seen from above the semiconductor substrate 10. That is, in FIG. 2A, the first cathode region 82 extends beyond the floating region 17 in the arrangement direction (Y-axis direction), as seen from above the semiconductor substrate 10. Also, the first cathode region 82 extends beyond the floating region 17 in an extension direction (X-axis direction) orthogonal to the arrangement direction, as seen from above the semiconductor substrate 10.

The floating region 17 is arranged not to overlap the transistor section 70, as seen from above the semiconductor substrate 10. The floating region 17 is arranged not to overlap the boundary between the diode section 80 and the transistor section 70.

Figure 2B:
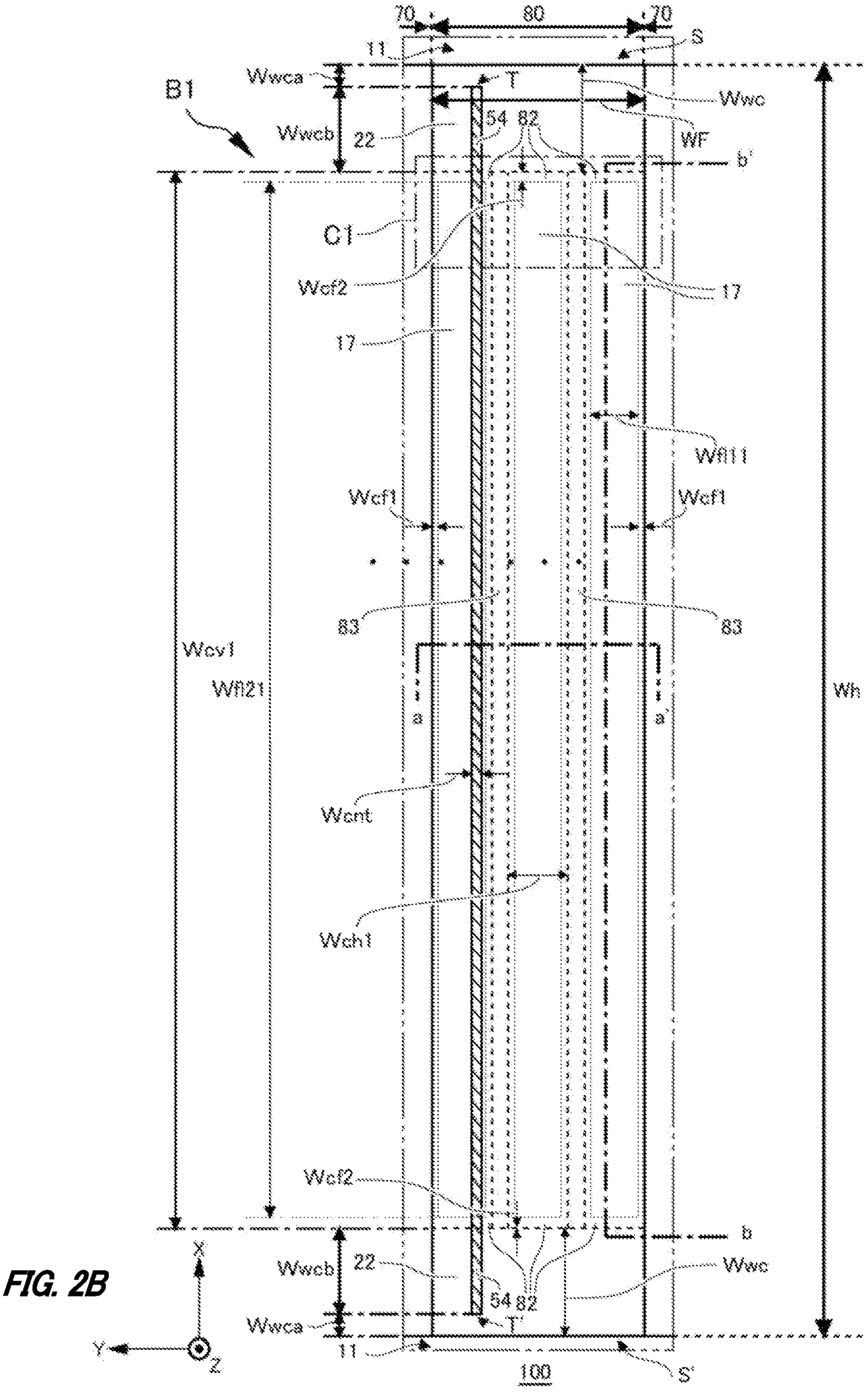
FIG. 2B is an enlarged view of a region B1 in FIG. 2A.

FIG. 2B is an enlarged view of a region B1 in FIG. 2A. FIG. 2B is an enlarged view of the part ranging from the end S of the well region 11 on the positive side of the X-axis direction to the end S' of the well region 11 on the negative side of the X-axis direction, in the diode section 80 of FIG. 2A. As shown in FIG. 2B, in the diode section 80 of the semiconductor device 100 of the present example, for example, the three floating regions 17 extending in the X-axis direction are provided in the Y-axis direction on inner sides of the first cathode regions 82 in the XY plane.

A width Wwc in the X-axis direction from the end S of the well region 11 on the positive side of the X-axis direction to an end of the first cathode region 82 on the positive side of the X-axis direction may be smaller than the width WF of the diode section 80, as seen from above. The width Wwc may be 0.25 times or greater and 0.75 times or less as large as the width WF. The width Wwc may be 150 μm or greater and 300 μm or less. The width Wwc is, for example, 250 μm.

As shown in FIG. 2B, an end T of the contact hole 54 on the positive side of the X-axis direction is located apart from the end S of the well region 11 on the positive side of the X-axis direction toward the negative side of the X-axis direction by a width Wwca. Also, an end T' of the contact hole 54 on the negative side of the X-axis direction is located apart from the end S' of the well region 11 on the negative side of the X-axis direction toward the positive side of the X-axis direction by the width Wwca. The contact hole 54 may be provided to continuously extend from the end T to the end T' in the X-axis direction.

FIG. 2B shows one contact hole 54. However, actually, as can be clearly seen from the plan view of FIG. 1B, the plurality of contact holes 54 each having the ends T and T' located at the same respective X-axis positions is provided in the Y-axis direction.

The width Wwca from the end S of the well region 11 on the positive side of the X-axis direction to the end T of each of the contact holes 54, which are provided in the diode section 80, on the positive side of the X-axis direction may be smaller than a width Wwcb from the end T to the end of the first cathode region 82 on the positive side of the X-axis direction, as seen from above. The width Wwca may be 0.1 times or greater and 0.9 times or less as large as the width Wwcb. The width Wwca may be 20 μm or greater and 110 μm or less. The width Wwcb may be 120 μm or greater and 180 μm or less. The width Wwca is, for example, 100 μm. The width Wwcb is, for example, 150 μm. A sum of the width Wwca and the width Wwcb is the width Wwc.

Also, a width from the end S' of the well region 11 on the negative side of the X-axis direction to the end T' of each of the contact holes 54, which are provided in the diode section 80, on the negative side of the X-axis direction may also be the same as the width Wwca. A width in the X-axis direction from the end T' to an end of the first cathode region 82 on the negative side of the X-axis direction may also be the same as the width Wwcb, as seen from above the semiconductor substrate 10. In the meantime, a width from the end S' of the well region 11 on the negative side of the X-axis direction to the end of the first cathode region 82 on the negative side of the X-axis direction may also be the same as the width Wwc, as seen from above.

A width Wcv1 of the first cathode region 82 in the X-axis direction may be smaller than the width Wh. The width Wcv1 is the same as a value obtained by subtracting two times the width Wwc from the width Wh. The width Wcv1 may be 90% or greater and 96% or less of the width Wh. The width Wcv1 may be 2700 μm or greater and 3450 μm or less. The width Wcv1 is, for example, 2850 μm.

A width Wch1 of the first cathode region 82 in the Y-axis direction may be 5% or greater and 40% or less of the width WF. The width Wch1 may be 20 μm or greater and 240 μm or less.

As shown in FIG. 2B, the floating region 17 is provided on the inner side of the first cathode region 82 in the XY plane. The floating region 17 is not connected to the emitter electrode 52.

In each of the first cathode regions 82, a width Wfl11 of the floating region 17 in the Y-axis direction may be 89% or greater and 95% or less of the width Wch1. Also, in each of the first cathode regions 82, a width Wfl21 of the floating region 17 in the X-axis direction may be 89% or greater and 95% or less of the width Wcv1.

In each of the first cathode regions 82, as seen from above the semiconductor substrate 10, a ratio of an area of the floating region 17 to the area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio, expressed in percentage, of the floating region 17 to that area may be 64% or greater and 72% or less.

A width Wcf1 in the Y-axis direction from the boundary between the diode section 80 and the transistor section 70 adjacent to the diode section 80 on the positive side of the Y-axis direction to the end, on the positive side of the Y-axis direction, of the floating region 17 which is provided the farthest on the positive side of the Y-axis direction may be 3% or greater and 6% or less of the width Wch1. The width Wcf1 may be any value except zero. The width Wcf1 may be 2 μm or greater and 6 μm or less. The width Wcf1 is, for example, 5 μm. In the meantime, a width in the Y-axis direction from the boundary between the diode section 80 and the transistor section 70 adjacent to the diode section 80 on the negative side of the Y-axis direction to the end, on the negative side of the Y-axis direction, of the floating region 17, which is provided the farthest on the negative side of the Y-axis direction may also be the same as the width Wcf1.

In each of the first cathode regions 82, a width Wcf2 from the end of the first cathode region 82 on the positive side of the X-axis direction to the end of the floating region 17 on the positive side of the X-axis direction may be 3% or greater and 6% or less of the width Wcv1. The width Wcf2 may be zero. Also, the width Wcf2 may be the same as or different from the width Wcf1. The width Wcf2 may be 2 μm or greater and 6 μm or less. The width Wcf2 is, for example, 5 μm. In the meantime, a width from an end of the first cathode region 82 on the negative side of the Y-axis direction to an end, on the negative side of the Y-axis of the floating region 17 on the negative side of the Y-axis direction is also the same as the width Wcf2.

In the meantime, in the present example, a width Wcnt of the contact hole 54 in the Y-axis direction may be smaller than the width Wcf1 and the width Wcf2. The width Wcnt may be 0.3 μm or greater and 0.7 μm or less. The width Wcnt is, for example, 0.5 μm.

Figure 2C:
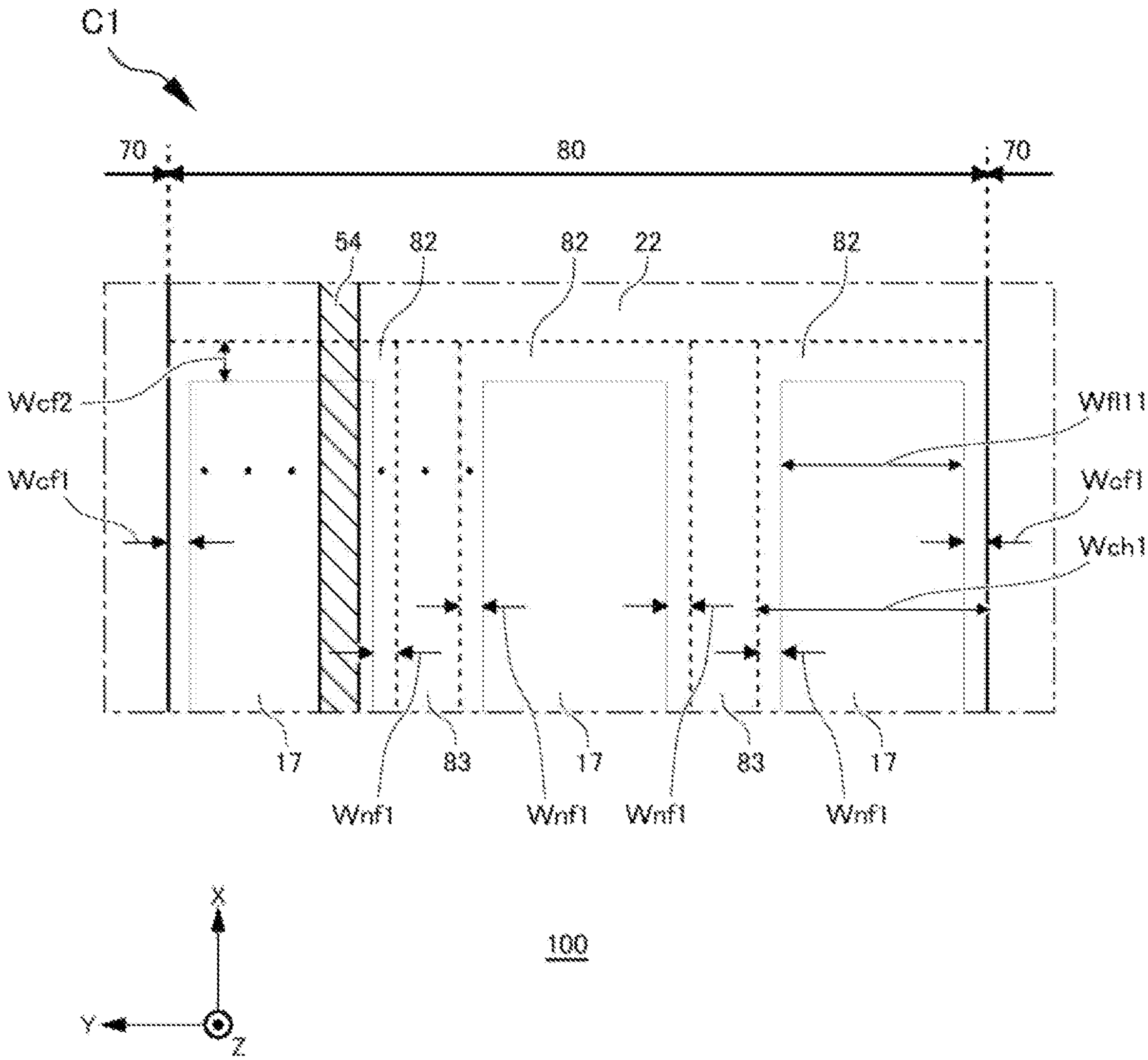
FIG. 2C is an enlarged view of a region C1 in FIG. 2B.

FIG. 2C is an enlarged view of a region C1 in FIG. 2B. As shown in FIG. 2C, the semiconductor device 100 of the present example includes the three first cathode regions 82 in the Y-axis direction, for example. The second cathode region 83 is provided between the first cathode regions 82 adjacent to each other in the Y-axis direction.

A width Wnf1 is a width in the Y-axis direction from an end, on the negative side of the Y-axis direction, of the first cathode region 82 which is located the farthest on the positive side of the Y-axis direction to an end, on the negative side of the Y-axis direction, of the floating region 17 arranged to overlap that first cathode region 82. Also, the width Wnf1 is a width in the Y-axis direction from an end, on the positive side of the Y-axis direction, of the first cathode region 82 which is located the farthest on the negative side of the Y-axis direction to an end, on the positive side of the Y-axis direction, of the floating region 17 arranged to overlap that first cathode region 82.

Also a width in the Y-axis direction from an end, on the positive side of the Y-axis direction, of the first cathode region 82 except both the first cathode regions 82 which are located the farthest on the positive and negative sides of the Y-axis directions to an end, on the positive side of the Y-axis direction, of the floating region 17 arranged to overlap that first cathode region 82 may be the same as the width Wnf1. A width in the Y-axis direction from an end of that first cathode region 82 on the negative side of the Y-axis direction to an end, on the negative side of the Y-axis direction, of the floating region 17 arranged to overlap that first cathode region 82 may also be the same as the width Wnf1.

The width Wnf1 may be the same as or different from the width Wcf1. The width Wnf1 may be zero.

In the diode section 80 of the semiconductor device 100 of the present example, the first cathode regions 82 of the first conductivity-type alternate with the second cathode regions 83 of the second conductivity-type in the Y-axis direction. Also, the plurality of second conductivity-type floating regions 17 is provided to be separated from each other and distributed to all the first cathode regions 82, and is arranged to overlap the first cathode regions 82, as seen from above the semiconductor substrate 10. For this reason, it is possible to suppress voltage overshoot upon reverse recovery of the diode section 80.

Figure 2D:
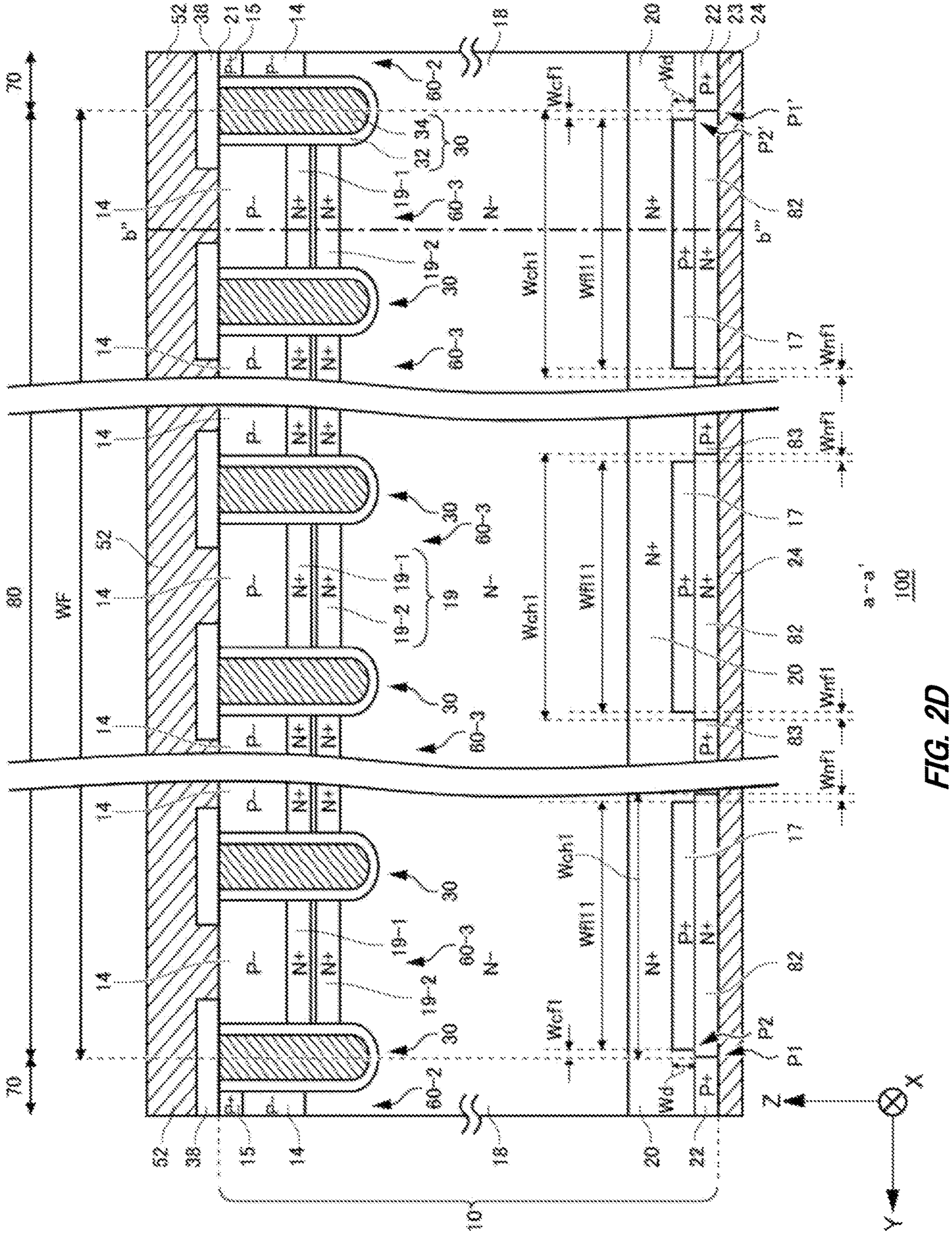
FIG. 2D shows an example of a cross-sectional view taken along a line a-a' in FIG. 2B.

FIG. 2D shows an example of a cross-sectional view taken along a line a-a' in FIG. 2B. The semiconductor device 100 of the present example includes a semiconductor substrate 10, an interlayer dielectric film 38, an emitter electrode 52 and a collector electrode 24, in the a-a' cross-section. The emitter electrode 52 is provided on an upper surface 21 of the semiconductor substrate 10 and an upper surface of the interlayer dielectric film 38. The collector electrode 24 is provided on a lower surface 23 of the semiconductor substrate 10. The emitter electrode 52 and the collector electrode 24 are formed of a conductive material such as metal. The interlayer dielectric film 38 may be silicate glass such as PSG, BPSG. Also, the interlayer dielectric film 38 may be an oxide film, a nitride film or the like.

The semiconductor substrate 10 may be a silicon substrate, may be a silicon carbide substrate, or may be a nitride semiconductor substrate of gallium nitride or the like, a gallium oxide substrate, etc. The semiconductor substrate 10 of the present example is a silicon substrate.

The semiconductor substrate 10 includes first conductivity-type drift regions 18. The drift region 18 of the present example is of an N− type. The drift region 18 may be a remaining region, in which other doping regions are not provided, in the semiconductor substrate 10.

The upper surface 21 of the semiconductor substrate 10 is provided with one or more gate trench parts 40 and one or more dummy trench parts 30. Each of the trench parts is provided to extend from the upper surface 21 through the base region 14 to reach the drift region 18.

The dummy trench part 30 has a dummy trench provided on the upper surface 21, and a dummy dielectric film 32 and a dummy conductive portion 34 provided in the dummy trench. An upper end of the dummy trench may be flush with the upper surface 21 in the Z-axis direction. The dummy dielectric film 32 is provided covering an inner wall of the dummy trench. The dummy dielectric film 32 may be formed by oxidizing or nitriding the semiconductor of the inner wall of the dummy trench. The dummy conductive portion 34 is provided farther on the inner side than the dummy dielectric film 32 in the dummy trench. That is, the dummy dielectric film 32 insulates the dummy conductive portion 34 and the semiconductor substrate 10 each other. The dummy conductive portion 34 is formed of an electrically conductive material such as polysilicon.

The dummy conductive portion 34 includes a region facing the base region 14 with the dummy dielectric film 32 being interposed therebetween. In the cross-section, the dummy trench part 30 is covered by the interlayer dielectric film 38 on the upper surface 21.

The gate trench parts 40 are provided in the transistor sections 70 arranged in areas that are farther on the positive and negative sides of the Y-axis directions than the a-a' cross-section. The gate trench part 40 may have the same structure as the dummy trench part 30 in a YZ cross-section. The gate trench part 40 includes a gate trench provided on the upper surface 21, and a gate dielectric film and a gate conductive portion provided in the gate trench. When a predetermined voltage is applied to the gate conductive portion, a channel by an inversion layer of electrons is formed on the surface layer of an interface of the base region 14 and the gate trench.

The gate conductive portion may be formed of the same material as that of the dummy conductive portion 34. For example, the dummy conductive portion 34 and the gate conductive portion are formed of a conductive material such as polysilicon. In the meantime, bottoms of the dummy trench part 30 and the gate trench part 40 may each have a downwardly convex curved shape (a curve shape in a cross-section).

In the mesa part 60-3 of the diode section 80, one or more first conductivity-type high-concentration regions 19 in contact with the dummy trench part 30 may be provided above the drift region 18. The high-concentration region 19 is of, for example, N+ type. The high-concentration region 19 may be provided or may not be provided in the mesa part 60-3. The high-concentration region 19 may be or may not be in contact with the dummy trench part 30. In a case in which the plurality of high-concentration regions 19 is provided, the high-concentration regions 19-1 and the high-concentration regions 19-2 are arranged side by side in the Z-axis direction. The drift region 18 may be provided between the high-concentration region 19-1 and the high-concentration region 19-2 in the Z-axis direction.

In the mesa part 60-3, a second conductivity-type base region 14 in contact with the upper surface 21 and the dummy trench part 30 is provided above the high-concentration region 19. The base region 14 of the present example is of, for example, P− type.

In the high-concentration region 19, a concentration of holes is reduced due to a charge neutrality condition, as compared to the drift region 18. That is, the high-concentration region 19 restrains the holes from being injected from the base region 14 into the drift region 18. Thereby, minority carrier injection efficiency from the base region 14 into the drift region 18 is significantly reduced. As the number of the high-concentration regions 19 increases, the minority carrier injection efficiency can be further reduced. Thereby, the reverse recovery characteristic of the diode section 80, particularly, the recovery current can be significantly reduced.

In the mesa part 60-2 of the transistor section 70, the second conductivity-type base region 14 in contact with the dummy trench part 30 is provided above the drift region 18. A second conductivity-type contact region 15 in contact with the upper surface 21 and the dummy trench part 30 is provided above the base region 14. The base region of the present example is of, for example, P+ type. The contact region 15 may be or may not be in contact with the dummy trench part 30.

A first conductivity-type buffer region 20 may be provided below the drift region 18. The buffer region 20 is of, for example, N+ type. A doping concentration in the buffer region 20 is higher than a doping concentration in the drift region 18. The buffer region 20 may serve as a field stop layer configured to prevent a depletion layer, which expands from the lower surface of the base region 14, from reaching the P+ type collector region 22, and the N+ type first cathode region 82 and the P+ type second cathode region 83.

In the transistor section 70, the P+ type collector region 22 exposed on the lower surface 23 is provided below the buffer region 20. In the diode section 80, the N+ type first cathode region 82 and the P+ type second cathode region 83 exposed on the lower surface 23 are provided below the buffer region 20. In the diode section 80, the first cathode region 82 is provided in a region adjacent to the transistor section 70.

In the meantime, the diode section 80 is a region overlapping the first cathode region 82 and the second cathode region 83 in a direction perpendicular to the lower surface 23. Also, the transistor section 70 is a region, in which a predetermined unit structure including the emitter region 12 and the contact region 15 is regularly arranged, of a region overlapping the collector region 22 in the direction perpendicular to the lower surface 23.

In the diode section 80 of the semiconductor device 100 of the present example, the floating regions 17 are provided above the first cathode regions 82. The three floating regions 17 are provided in the Y-axis direction, in the a-a' cross-section, for example. The floating region 17 may be provided to be in contact with the first cathode region 82.

In the present example, as shown in FIG. 2D, there are two positions of the boundary between the collector region 22 and the first cathode region 82, in a plane parallel to the lower surface 23 of the semiconductor substrate 10. A boundary position P1 is one of the two boundary positions on the positive side of the Y-axis direction. Also, a boundary position P1' is the other one of the two boundary positions on the negative side of the Y-axis direction. The boundary positions P1 and P1' are boundary positions on a cross-section parallel to the a-a' cross-section. As an example, the a-a' cross-section is a plane perpendicular to the lower surface 23 and parallel to the arrangement direction of the dummy trench parts 30.

In the present example, as shown in FIG. 2D, there are two end positions of the floating region 17 in the plane parallel to the lower surface 23. An end position P2 is an end position the closest to the boundary position P1, of the floating region 17 provided the farthest on the positive side of the Y-axis direction, in the plane parallel to the lower surface 23. Also, an end position P2' is an end position the closest to the boundary position P1', of the floating region 17 provided the farthest on the negative side of the Y-axis direction, in the plane parallel to the lower surface 23.

The plurality of floating regions 17 may be provided in the Y-axis direction from the end position P2 to the end position P2'. In the semiconductor device 100 of the present example, three floating regions 17 are provided in the Y-axis direction from the end position P2 to the end position P2'.

A width Wcf1 is a distance in the Y-axis direction from the boundary position P1 to the end position P2. Also, the width Wcf1 is a distance in the Y-axis direction from the boundary position P1' to the end position P2'. When the width Wcf1 is decreased, the electron injection from the first cathode region 82 can be suppressed at the end portion of the diode section 80.

A width Wd is a width of the floating region 17 in the Z-axis direction. The width Wd may be smaller than the width Wcf1. The width Wd may be 0.05 times or greater and 0.5 times or less as large as the width Wcf1. The width Wd may be 0.3 μm or greater and 1 μm or less. The width Wd is, for example, 0.5 μm.

Also, a width in the Y-axis direction from an end, on the positive side of the Y-axis direction, of the first cathode region 82 which is provided at the center in the Y-axis direction in the a-a' cross section to an end, on the positive side of the Y-axis direction, of the floating region 17 arranged to overlap that first cathode region 82 may be the same as the width Wnf1. A width in the Y-axis direction from the end of the first cathode region 82 on the negative side of the Y-axis direction to the end, on the negative side of the Y-axis direction, of the floating region 17 arranged to overlap that first cathode region 82 may also be the same as the width Wnf1.

In each of the first cathode regions 82, the width Wfl11 of the floating region 17 in the Y-axis direction may be 89% or greater and 95% or less of the width Wch1. The width Wnf1 may be the same as or different from the width Wcf1. The width Wnf1 may be zero.

Figure 2E:
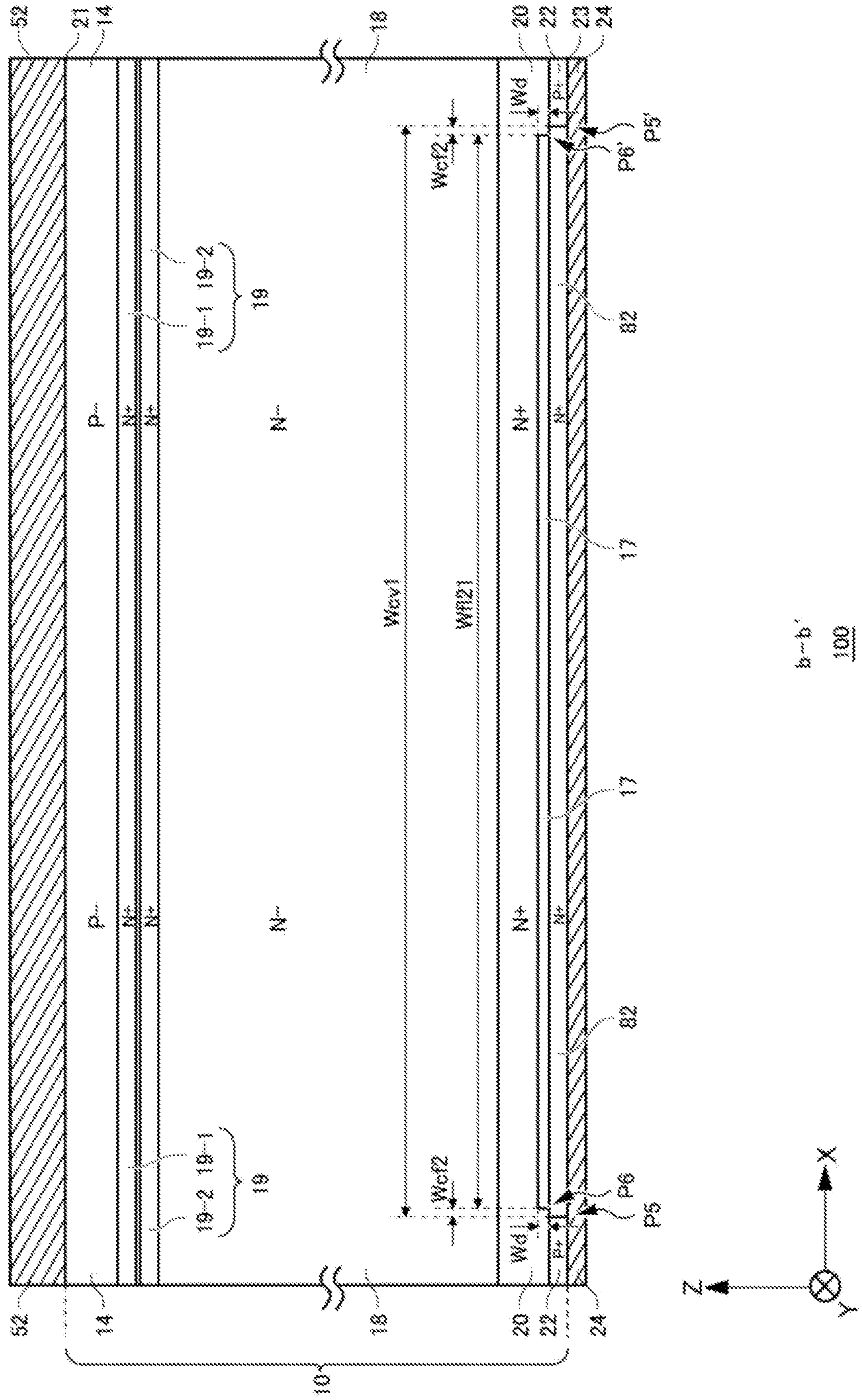
FIG. 2E shows an example of a cross-sectional view taken along a line b-b' in FIG. 2B.

FIG. 2E shows an example of a cross-sectional view taken along a line b-b' in FIG. 2B. The b-b' cross-section is the XZ plane passing a line b"-b'" in FIG. 2D. In the diode section 80 of the semiconductor device 100 of the present example, the floating regions 17 are provided above the first cathode regions 82.

In the present example, as shown in FIG. 2E, there are two positions of the boundary between the collector region 22 and the first cathode region 82, in a plane parallel to the lower surface 23 of the semiconductor substrate 10. A boundary position P5 is one of the two boundary positions on the negative side of the X-axis direction. Also, a boundary position P5' is the other one of the two boundary positions on the positive side of the X-axis direction. The boundary positions P5 and P5' are boundary positions in a cross-section parallel to the b-b' cross-section. As an example, the b-b' cross-section is a plane perpendicular to the lower surface 23 and parallel to the extension direction of the dummy trench parts 30.

In the present example, as shown in FIG. 2E, there are two end positions of the floating region 17 in the plane parallel to the lower surface 23. An end position P6 is an end position closest to the boundary position P5, of the floating region 17 provided farthest in the negative X-axis direction, of the plurality of floating regions 17 arranged in the X-axis direction, in the plane parallel to the lower surface 23. Also, an end position P6' is an end position closest to the boundary position P5', of the floating region 17 provided the farthest on the positive side of the X-axis direction, of the plurality of the floating regions 17 arranged in the Y-axis direction, in the plane parallel to the lower surface 23. In the present example, the floating region 17 is continuously provided in the X-axis direction from the end position P6 to the end position P6'.

A width Wfl21 is a width of the floating region 17 in the X-axis direction. A width Wcf2 is a distance in the X-axis direction from the boundary position P5 to the end position P6. Also, the width Wcf2 is a distance in the X-axis direction from the boundary position P5' to the end position P6'. Also, a width Wcv1 is a distance in the X-axis direction from the boundary position P5 to the boundary position P5'. The width Wfl21 may be 89% or greater and 95% or less of the width Wcv1. In the diode section 80 of the semiconductor device 100 of the present example, since the floating regions 17 are provided above the first cathode regions 82, the surge voltage can be suppressed upon reverse recovery of the diode section 80. A lifetime killer region may be locally provided by irradiating He or the like on the upper surface 21-side and the lower surface 23-side of the diode portion 80 so as to suppress carrier implantation. However, the formation of the lifetime killer region is costly. Also, the surge voltage upon reverse recovery of the diode section 80 increases, so that the diode section 80 cannot be speeded up.

In the meantime, the collector region 22 on the positive side of the X-axis direction in FIG. 2E may extend to the outer periphery region 74 on the positive side of the X-axis direction in FIG. 1A. The collector region 22 may be coupled to the collector region 22 provided on the lower surface 23 in the transistor section 70. Likewise, the collector region 22 provided on the negative side of the X-axis direction in the diode section 80 located the farthest on the negative side of the X-axis direction in FIG. 1A may extend to the outer periphery region 74 on the negative side of the X-axis direction in FIG. 1A. Below the outer periphery region 74, the lower surface 23 may be provided with a first conductivity-type termination region of which a doping concentration is smaller than that of the first cathode region 82, instead of the collector region 22. The doping concentration in the termination region may be 1/10 of the doping concentration in the first cathode region 82 or less.

Figure 3A:
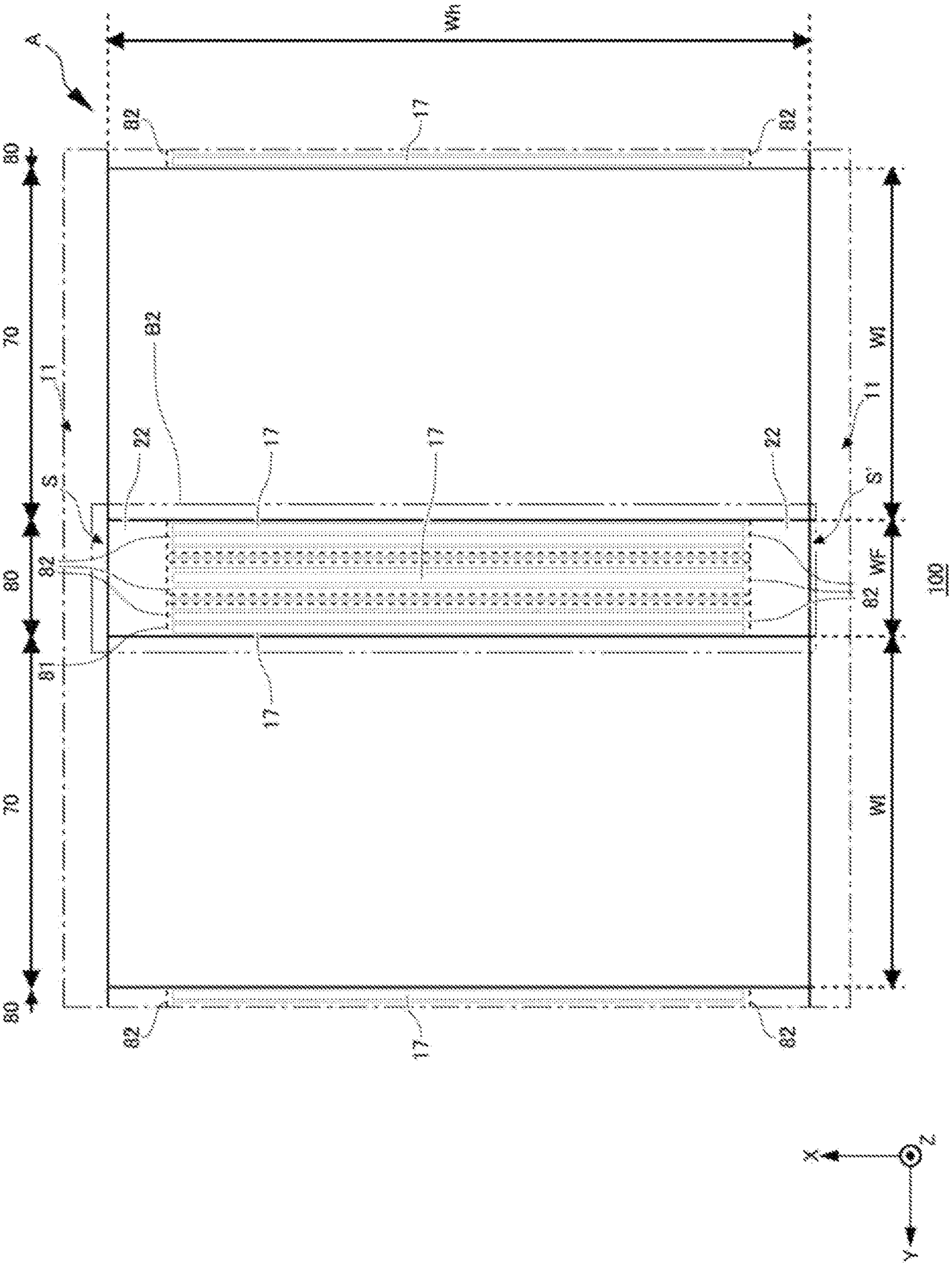
FIG. 3A is another enlarged view of the region A in FIG. 1A.

FIG. 3A is another enlarged view of the region A in FIG. 1A. The semiconductor device 100 of the present example is different from the semiconductor device 100 shown in FIG. 2A, in that some floating regions 17 of the plurality of floating regions 17 are provided in the arrangement direction with overlapping both the first cathode regions 82 and the second cathode regions 83 in the semiconductor device 100 shown in FIG. 2A, as seen from above the semiconductor substrate 10. That is, in the semiconductor device 100 of the present example, some floating regions 17 of the plurality of floating regions 17 are provided in the Y-axis direction from the first cathode regions 82 to the second cathode regions 83 with overlapping the boundaries in the X-axis direction between the first cathode regions 82 and the second cathode regions 83, as seen from above the semiconductor substrate 10.

Figure 3B:
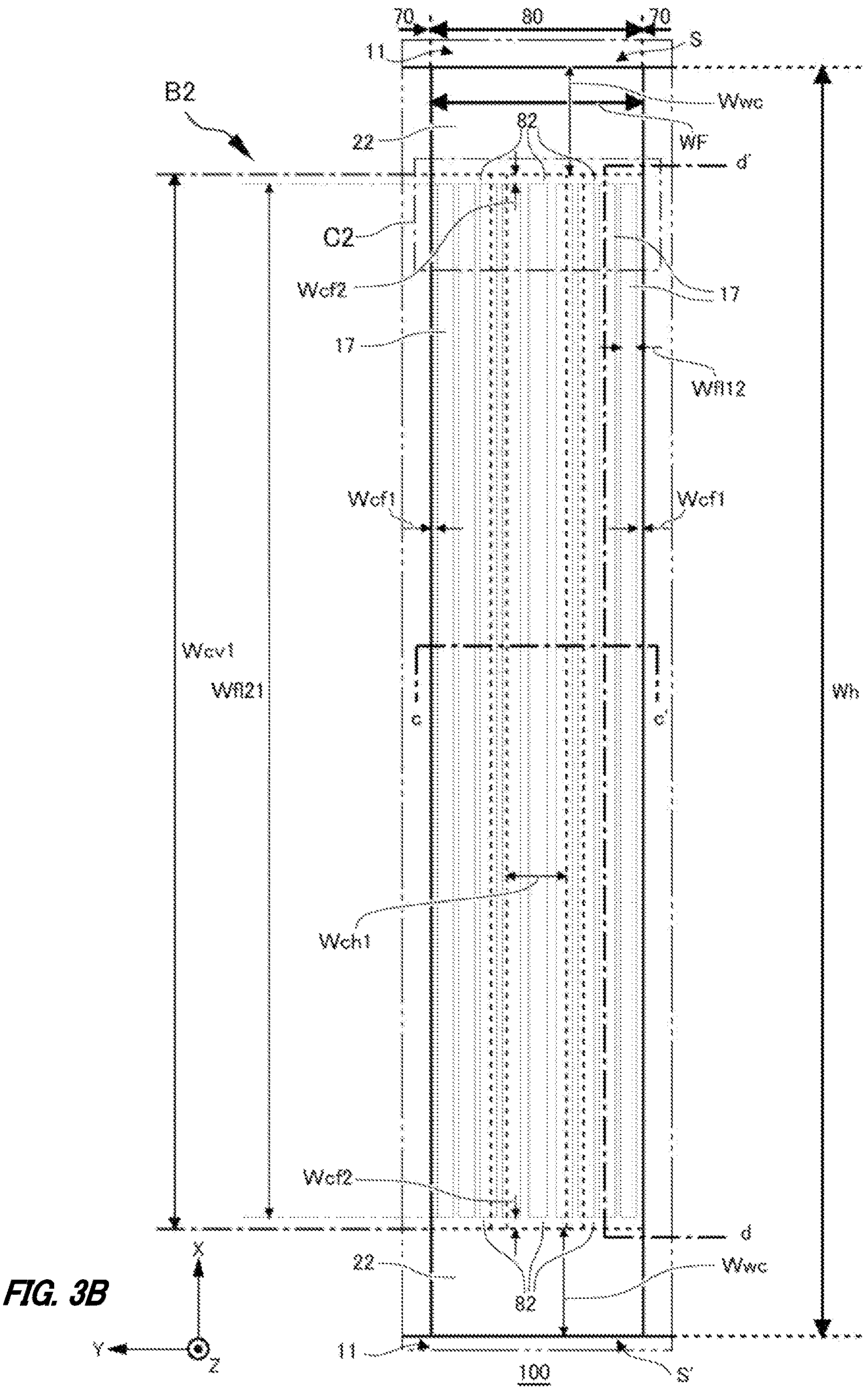
FIG. 3B is an enlarged view of a region B2 in FIG. 3A.

FIG. 3B is an enlarged view of a region B2 in FIG. 3A. FIG. 3B is an enlarged view from the end S of the well region 11 on the positive side of the X-axis direction to the end S' of the well region 11 on the negative side of the X-axis direction, in the diode section 80 of FIG. 3A. In FIG. 3B and the drawings thereafter, the contact hole 54 shown in FIGS. 2B and 2C is omitted.

In the diode section 80 of the semiconductor device 100 of the present example, as shown in FIG. 3B, the nine floating regions 17 extending in the X-axis direction and arranged in the Y-axis direction are provided, for example. In the semiconductor device 100 of the present example, for example, the three first cathode regions 82 are provided and the two second cathode regions 83 are provided. Therefore, there are four boundaries parallel to the X-axis direction between the first cathode regions 82 and the second cathode regions 83. For this reason, the four floating regions 17 of the nine floating regions 17 are respectively provided with overlapping the boundaries. The five floating regions 17 of the nine floating regions 17 are provided on the inner sides of the first cathode regions 82, as seen from above the semiconductor substrate 10.

In each of the first cathode regions 82, as seen from above the semiconductor substrate 10, a ratio of an area of the floating region 17 to an area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio of the floating region 17 to that area may be 64% or greater and 72% or less.

In the semiconductor device 100 of the present example, a width Wcf1 and a width Wcf2 may be the same as the width Wcf1 and the width Wcf2 in the example shown in FIG. 2B. The width Wcf1 may be any value except zero. The width Wcf2 may be zero.

In the semiconductor device 100 of the present example, a width Wfl21 of the floating region 17 in the X-axis direction may be the same as the width Wfl21 in the example shown in FIG. 2B. A width Wfl12 of the floating region 17 in the Y-axis direction may smaller than the width Wfl11 in the example shown in FIG. 2B.

Figure 3C:
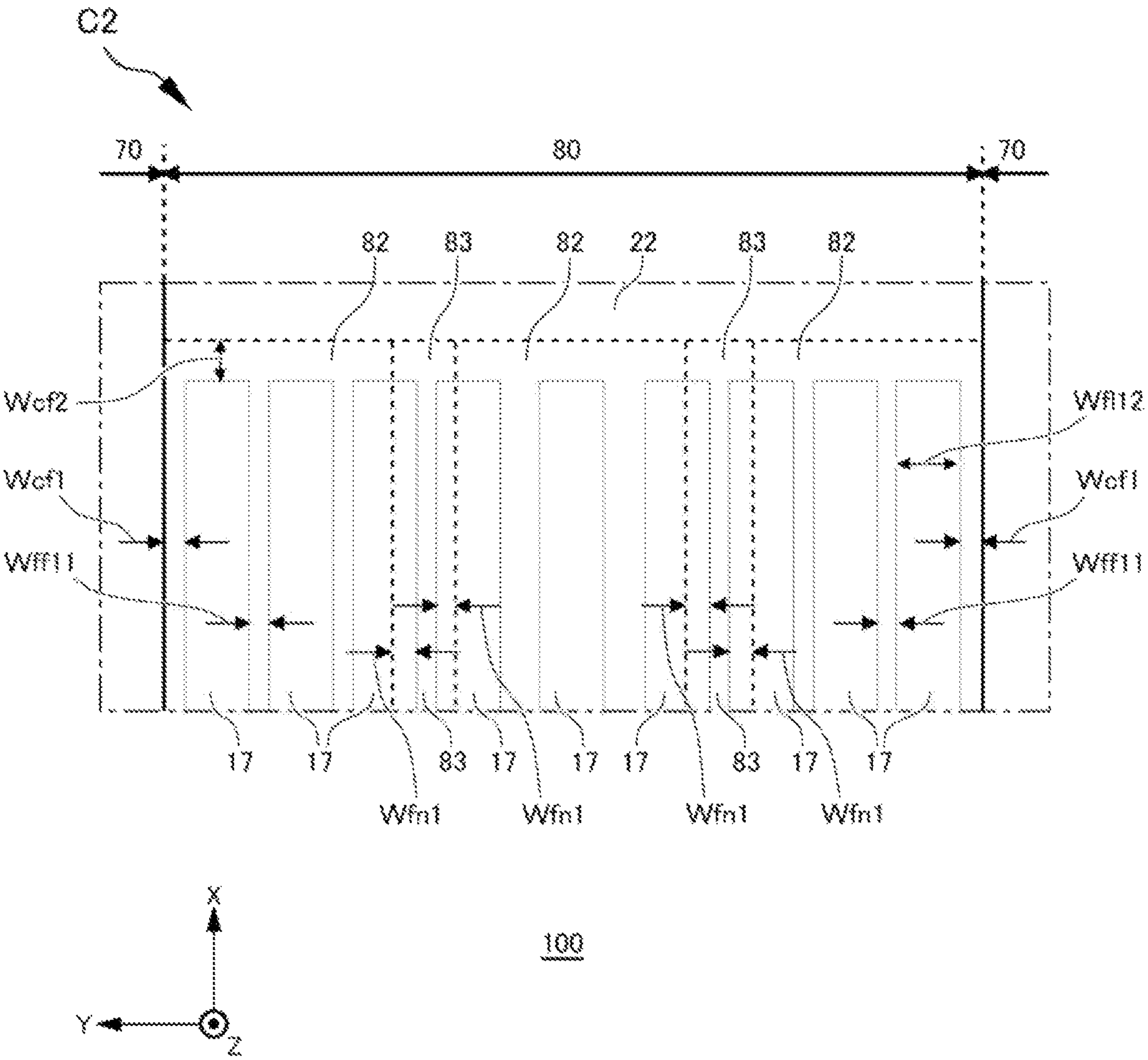
FIG. 3C is an enlarged view of a region C2 in FIG. 3B.

FIG. 3C is an enlarged view of a region C2 in FIG. 3B. As shown in FIG. 3C, in the semiconductor device 100 of the present example, for example, the nine floating regions 17 are provided in the Y-axis direction. The second cathode region 83 is provided between the first cathode regions 82 adjacent to each other in the Y-axis direction. In the semiconductor device 100 of the present example, the four floating regions 17 of the nine floating regions 17 are provided with overlapping the boundaries in the X-axis direction between the first cathode regions 82 and the second cathode regions 83. The five floating regions 17 of the nine floating regions 17 are provided on the inner sides of the first cathode regions 82, as seen from above the semiconductor substrate 10.

A width Wfn1 is a width in the Y-axis direction of the floating region 17 provided to overlap a boundary between the first cathode region 82 and the second cathode region 83 adjacent to the first cathode region 82 on the negative side of the Y-axis direction, from an end on the negative side of the Y-axis direction to the boundary. Also, the width Wfn1 is a width in the Y-axis direction of the floating region 17 which is provided to overlap a boundary between the first cathode region 82 and the second cathode region 83 adjacent to the first cathode region 82 on the positive side of the Y-axis direction, from an end on the positive side of the Y-axis direction to the boundary.

A width Wff11 is an interval in the Y-axis direction between a floating region 17 and a floating region 17 adjacent to the corresponding floating region 17. All of the plurality of floating regions 17 may be arranged at the interval of the width Wff11 in the Y-axis direction. However, when there is a floating region 17 overlapping the boundary between the first cathode region 82 and the second cathode region 83, there may be a floating region 17 arranged at an interval different from the width Wff11.

The width Wfn1 is smaller than the width Wfl12. The width Wfn1 may be the same as or different from the width Wcf1.

Figure 3D:
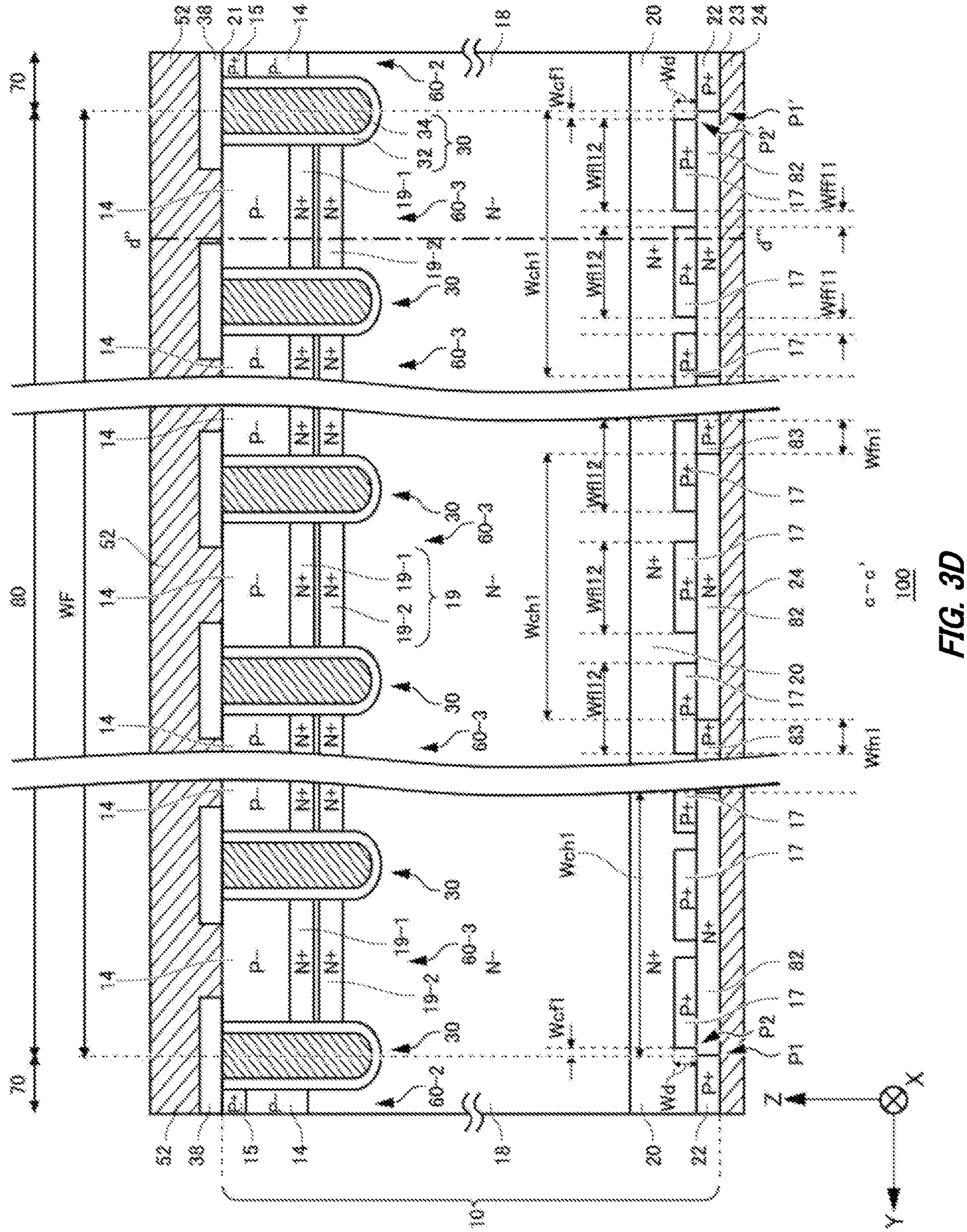
FIG. 3D shows an example of a cross-sectional view taken along a line c-c' in FIG. 3B.

FIG. 3D shows an example of a cross-sectional view taken along a line c-c' in FIG. 3B. The semiconductor device 100 of the present example includes a semiconductor substrate 10, an interlayer dielectric film 38, an emitter electrode 52 and a collector electrode 24, in the c-c' cross-section. The emitter electrode 52 is provided on an upper surface 21 of the semiconductor substrate 10 and an upper surface of the interlayer dielectric film 38. The collector electrode 24 is provided on a lower surface 23 of the semiconductor substrate 10.

In the diode section 80 of the semiconductor device 100 of the present example, floating regions 17 are provided above the first cathode regions 82. The nine floating regions 17 are provided in the Y-axis direction, on the c-c' cross-section, for example. The floating region 17 may be provided to be in contact with the first cathode region 82.

Some floating regions 17 of the plurality of floating regions 17 are provided above the boundaries between the first cathode regions 82 and the second cathode regions 83. The floating regions 17 provided above the boundaries are provided to be in contact with both the first cathode regions 82 and the second cathode regions 83. In the semiconductor device 100 of the present example, the four floating regions 17 of the nine floating region 17 are provided to be in contact with both the first cathode regions 82 and the second cathode regions 83 above the boundaries. In the semiconductor device 100 of the present example, since the second cathode regions 83 of the second conductivity-type and the second conductivity-type floating regions 17 are provided to be in contact with each other, the surge voltage upon reverse recovery of the diode section 80 can be further suppressed than the semiconductor device 100 shown in FIG. 2D.

Figure 3E:
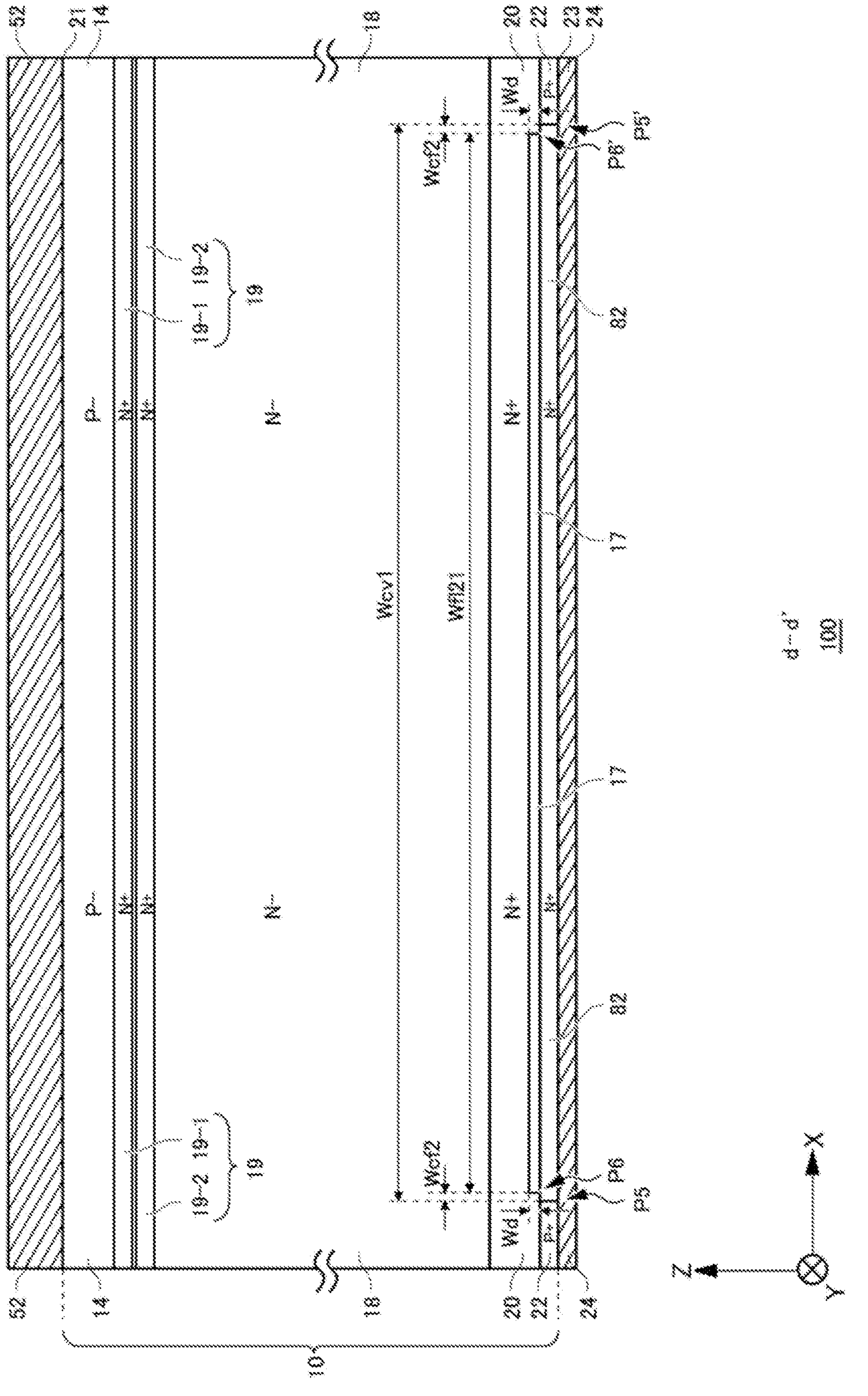
FIG. 3E shows an example of a cross-sectional view taken along a line d-d' in FIG. 3B.

FIG. 3E shows an example of a cross-sectional view taken along a line d-d' in FIG. 3B. The d-d' cross-section is the XZ plane passing a line d''-d''' in FIG. 3D. The configuration on the d-d' cross-section of the semiconductor device 100 of the present example is the same as the configuration on the b-b' cross-section of the semiconductor device 100 shown in FIG. 2E.

Figure 4A:
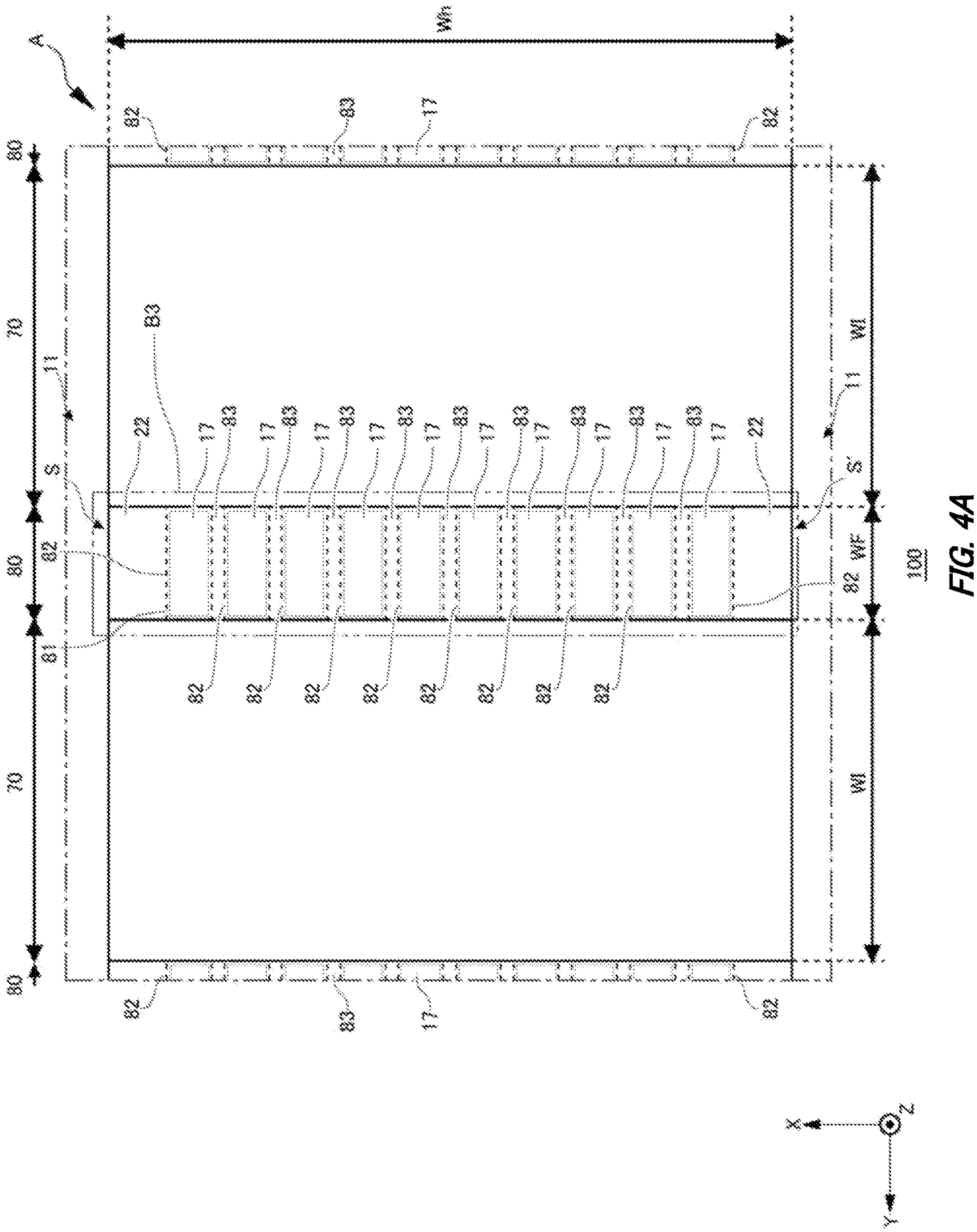
FIG. 4A is another enlarged view of the region A in FIG. 1A.

FIG. 4A is another enlarged view of the region A in FIG. 1A. The semiconductor device 100 of the present example is different from the semiconductor device 100 shown in FIG. 2A, in that the first cathode regions 82 alternate with the second cathode regions 83 in the X-axis direction in the semiconductor device 100 shown in FIG. 2A, as seen from above the semiconductor substrate 10. The first cathode regions 82 and the second cathode regions 83 are in contact with the transistor sections 70 on both the positive side and the negative side of the Y-axis direction.

In the diode section 80, an area ratio, expressed in percentage, of the first cathode region 82 to a total area of the first cathode region 82 and the second cathode region 83 may be 60% or greater and 90% or less, as seen from above the semiconductor substrate 10. An area ratio, expressed in percentage, of the second cathode region 83 to the total area may be 10% or greater and 40% or less. As an example, the area ratios of the first cathode region 82 and the second cathode region 83 to the total area are respectively 80% and 20%.

The semiconductor device 100 of the present example includes a plurality of floating regions 17 provided to be separated from each other and distributed to all the first cathode regions 82. In the semiconductor device 100 of the present example, the first cathode region 82 extends beyond the floating region 17 in the arrangement direction, as seen from above the semiconductor substrate 10. In the semiconductor device 100 of the present example, both sides of the first cathode region 82 extend beyond the floating region 17 in the arrangement direction, as seen from above the semiconductor substrate 10. That is, the first cathode region 82 has parts, which are not covered by the floating region 17, on both sides of the floating region 17 in the Y-axis direction. Meanwhile, in the arrangement direction, one side of the first cathode region 82 may extend beyond the floating region 17 in the arrangement direction, as seen from above the semiconductor substrate 10.

Also, in the semiconductor device 100 of the present example, the first cathode region 82 extends beyond the floating region 17 in the extension direction. In the semiconductor device 100 of the present example, both sides of the first cathode region 82 in the extension direction extend beyond the floating region 17 in the extension direction, as seen from above the semiconductor substrate 10. That is, the first cathode region 82 has parts, which are not covered by the floating region 17, on both sides of the floating region 17 in the X-axis direction. Meanwhile, in the extension direction, one side of the first cathode region 82 may extend beyond the floating region 17 in the extension direction, as seen from above the semiconductor substrate 10.

In the semiconductor device 100 of the present example, the entire floating region 17 is arranged to overlap the first cathode region 82, as seen from above the semiconductor substrate 10. That is, as seen from above the semiconductor substrate 10, the floating region 17 is provided on the inner side of the first cathode region 82.

The floating region 17 is arranged not to overlap the transistor section 70, as seen from above the semiconductor substrate 10. The floating region 17 is also arranged not to overlap the boundary between the diode section 80 and the transistor section 70.

Figure 4B:
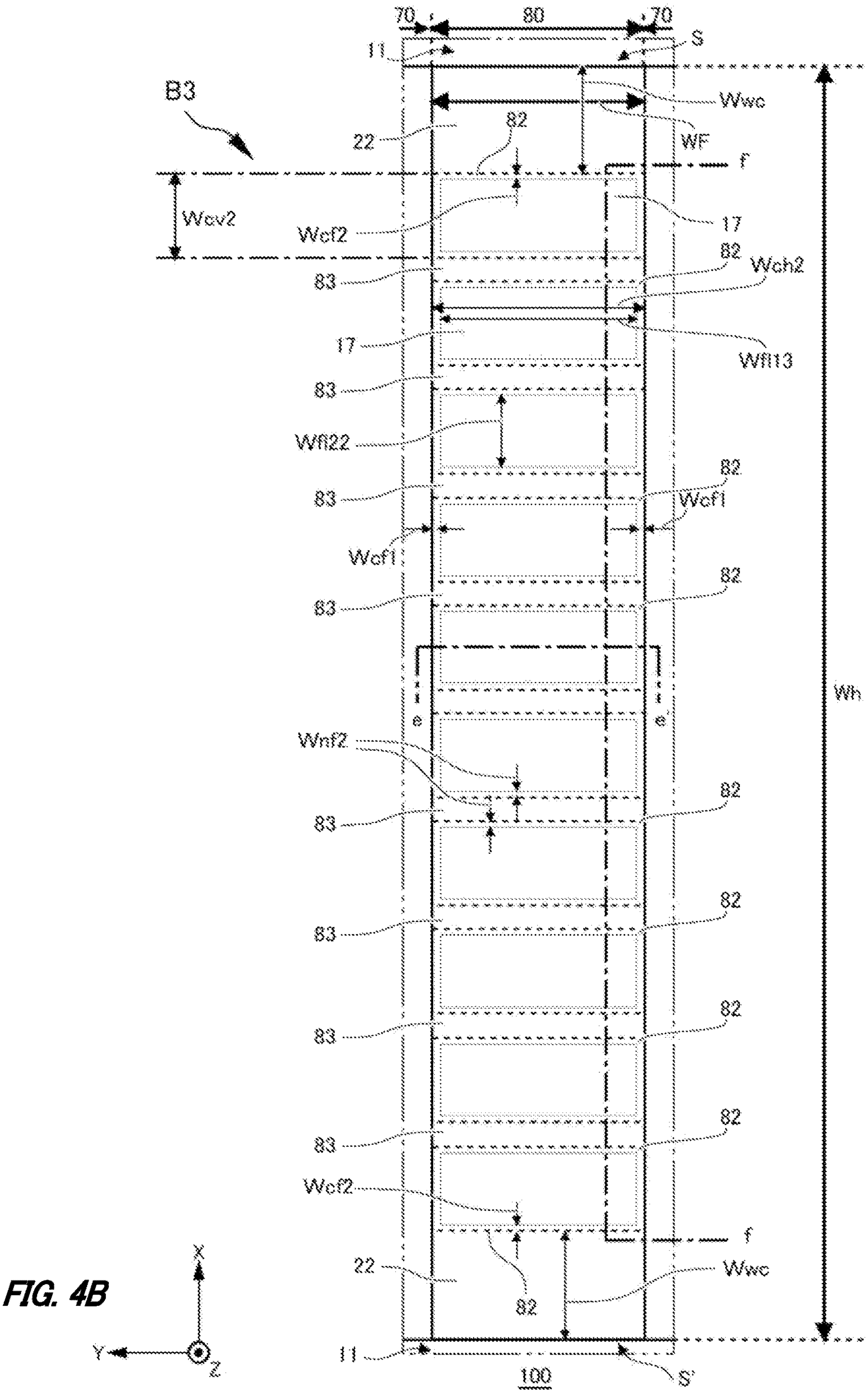
FIG. 4B is an enlarged view of a region B3 in FIG. 4A.

FIG. 4B is an enlarged view of a region B3 in FIG. 4A. FIG. 4B is an enlarged view from the end S of the well region 11 on the positive side of the X-axis direction to the end S' of the well region 11 on the negative side of the X-axis direction, in the diode section 80 of FIG. 3A. As shown in FIG. 2B, the semiconductor device 100 of the present example includes the ten floating regions 17 on the inner sides of the first cathode regions 82 in the XY plane, in the diode section 80, for example.

In the semiconductor device 100 of the present example, a width Wcf1 and a width Wcf2 may be the same as the width Wcf1 and the width Wcf2 in the example shown in FIG. 2B. The width Wcf1 may be any value except zero. The width Wcf2 may be zero.

In the semiconductor device 100 of the present example, a width Wnf2 is a width in the X-axis direction from a boundary between the first cathode region 82 and the second cathode region 83 adjacent to the first cathode region 82 on the negative side of the X-axis direction to an end, on the negative side in the X-axis direction, of the floating region 17 provided to overlap the first cathode region 82. Also, the width Wnf2 is a width in the X-axis direction from a boundary between the first cathode region 82 and the second cathode region 83 adjacent to the first cathode region 82 on the positive side of the X-axis direction to an end of the floating region 17, which is provided to overlap the first cathode region 82, on the positive side of the X-axis direction. The width Wnf2 may be the same or different from the width Wcf2.

In the semiconductor device 100 of the present example, a width Wch2 is a width of each of the first cathode region 82 and the second cathode region 83 in the Y-axis direction. A width Wch is the same as the width WF. A width Wcv2 is a width of the first cathode region 82 in the X-axis direction. Also, a width Wfl13 is a width of the floating region 17 in the Y-axis direction. A width Wfl22 is a width of the floating region 17 in the X-axis direction.

In each of the first cathode regions 82, the width Wfl13 of the floating region 17 in the Y-axis direction may be 89% or greater and 95% or less of the width Wch2. In each of the first cathode regions 82, the width Wfl22 of the floating region 17 in the X-axis direction may be 89% or greater and 95% or less of the width Wch2.

In each of the first cathode regions 82, as seen from above the semiconductor substrate 10, a ratio of an area of the floating region 17 to an area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio, expressed in percentage, of the floating region 17 to that area may be 64% or greater and 72% or less.

Figure 4C:
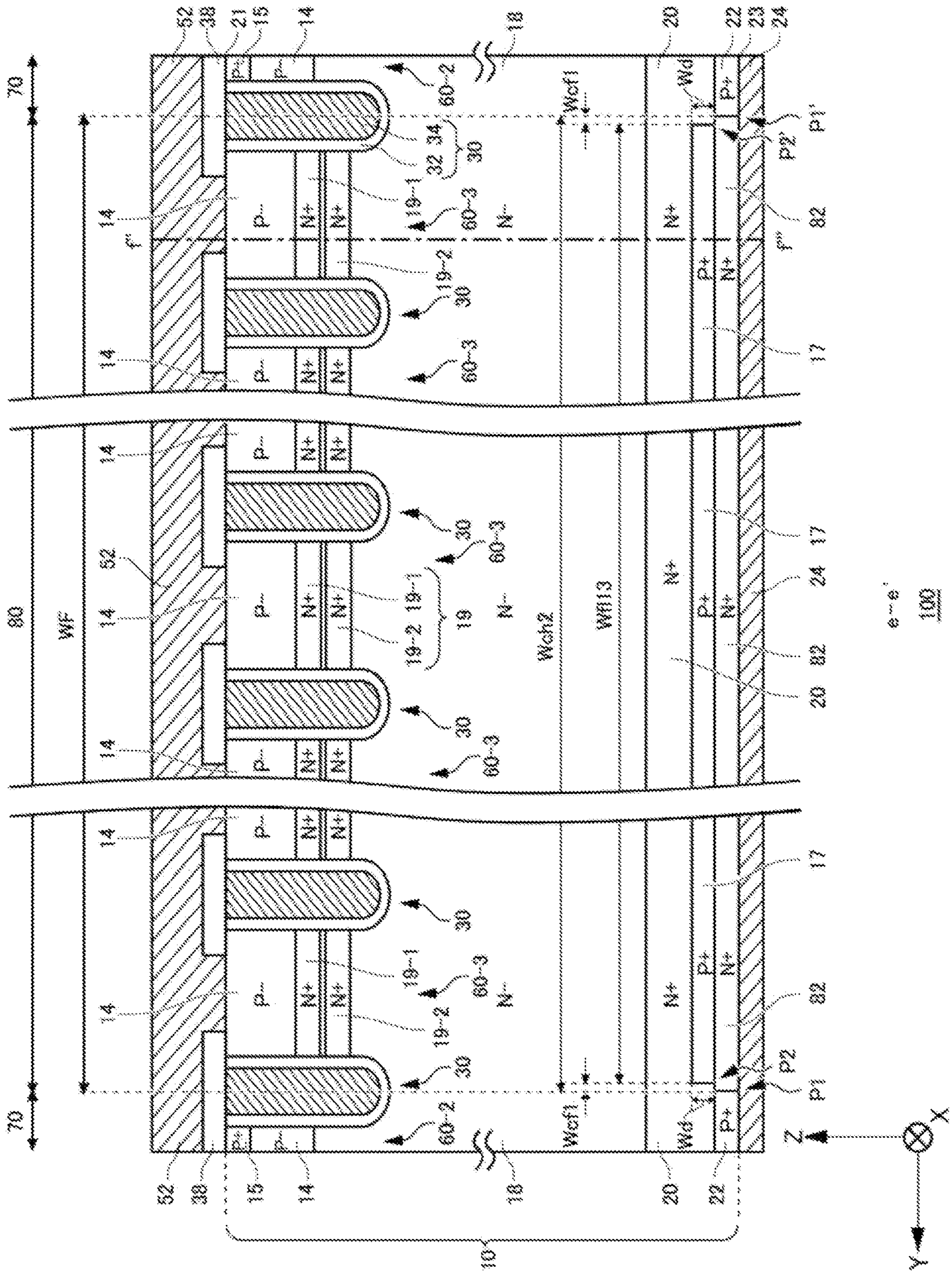
FIG. 4C shows an example of a cross-sectional view taken along a line e-e' in FIG. 4B.

FIG. 4C shows an example of a cross-sectional view taken along a line e-e' in FIG. 4B. The semiconductor device 100 of the present example includes a semiconductor substrate 10, an interlayer dielectric film 38, an emitter electrode 52 and a collector electrode 24, in the e-e' cross-section. The emitter electrode 52 is provided on an upper surface 21 of the semiconductor substrate 10 and an upper surface of the interlayer dielectric film 38. The collector electrode 24 is provided on a lower surface 23 of the semiconductor substrate 10.

In the diode section 80 of the semiconductor device 100 of the present example, the floating regions 17 are provided above the first cathode regions 82. The floating region 17 is continuously provided from the end position P2 to the end position P2' on the e-e' cross-section. The floating region 17 may be provided to be in contact with the first cathode region 82.

Figure 4D:
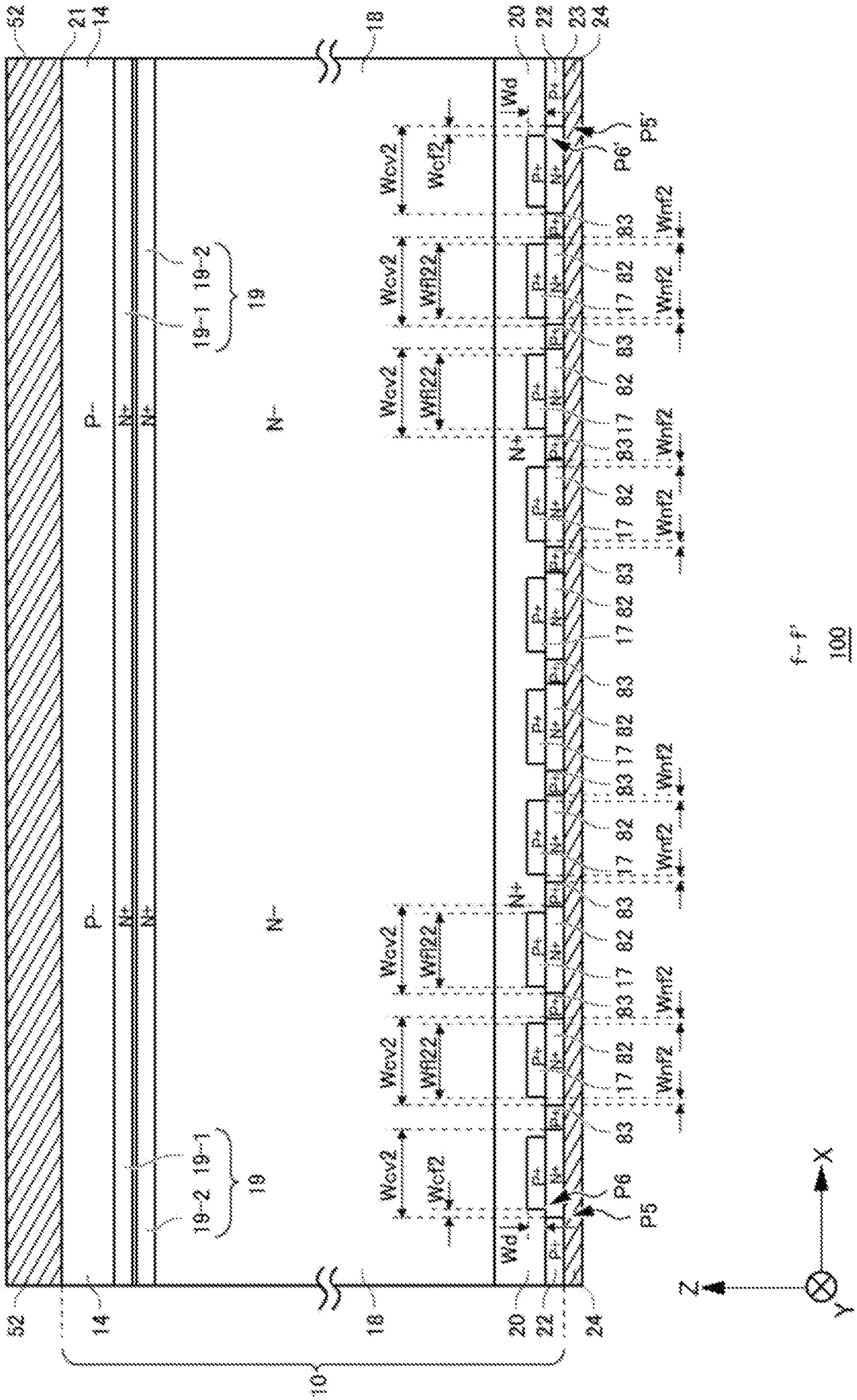
FIG. 4D shows an example of a cross-sectional view taken along a line f-f' in FIG. 4C.

FIG. 4D shows an example of a cross-sectional view taken along a line f-f' cross-section in FIG. 4B. The f-f' cross-section is the XZ plane passing a line f''-f''' in FIG. 4C. The ten floating regions 17 are provided in the X-axis direction on the c-c' cross-section, for example. The floating region 17 may be in contact with the first cathode region 82. In the semiconductor device 100 of the present example, a width Wnf2 may be the same as or different from the width Wcf2. A width Wfl22 of the floating region 17 in the X-axis direction may be 89% or greater and 95% or less of the width Wcv2. In the diode section 80 of the semiconductor device 100 of the present example, since the floating regions 17 are provided above the first cathode regions 82, the surge voltage (overshoot voltage) upon reverse recovery of the diode section 80 can be suppressed.

Figure 5A:
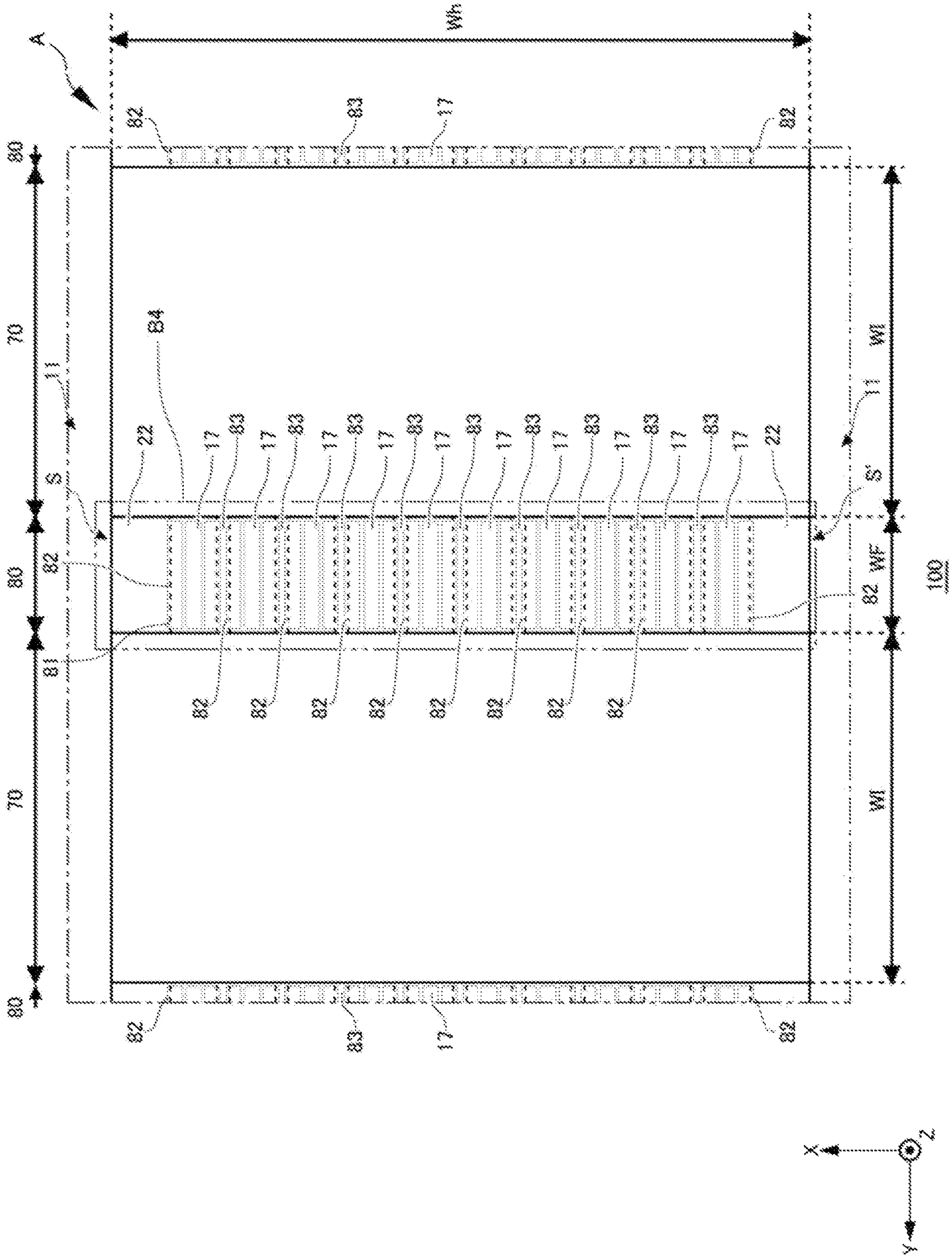
FIG. 5A is another enlarged view of the region A in FIG. 1A.

FIG. 5A is another enlarged view of the region A in FIG. 1A. The semiconductor device 100 of the present example is different from the semiconductor device 100 shown in FIG. 2A, in that some floating regions 17 of the plurality of floating regions 17 are provided in the X-axis direction with overlapping both the first cathode regions 82 and the second cathode regions 83 in the semiconductor device shown in FIG. 4A, as seen from above the semiconductor substrate 10. That is, in the semiconductor device 100 of the present example, some floating regions 17 of the plurality of floating regions 17 are provided in the X-axis direction from the first cathode regions 82 to the second cathode regions 83 with overlapping the boundaries in the Y-axis direction between the first cathode regions 82 and the second cathode regions 83, as seen from above the semiconductor substrate 10.

Figure 5B:
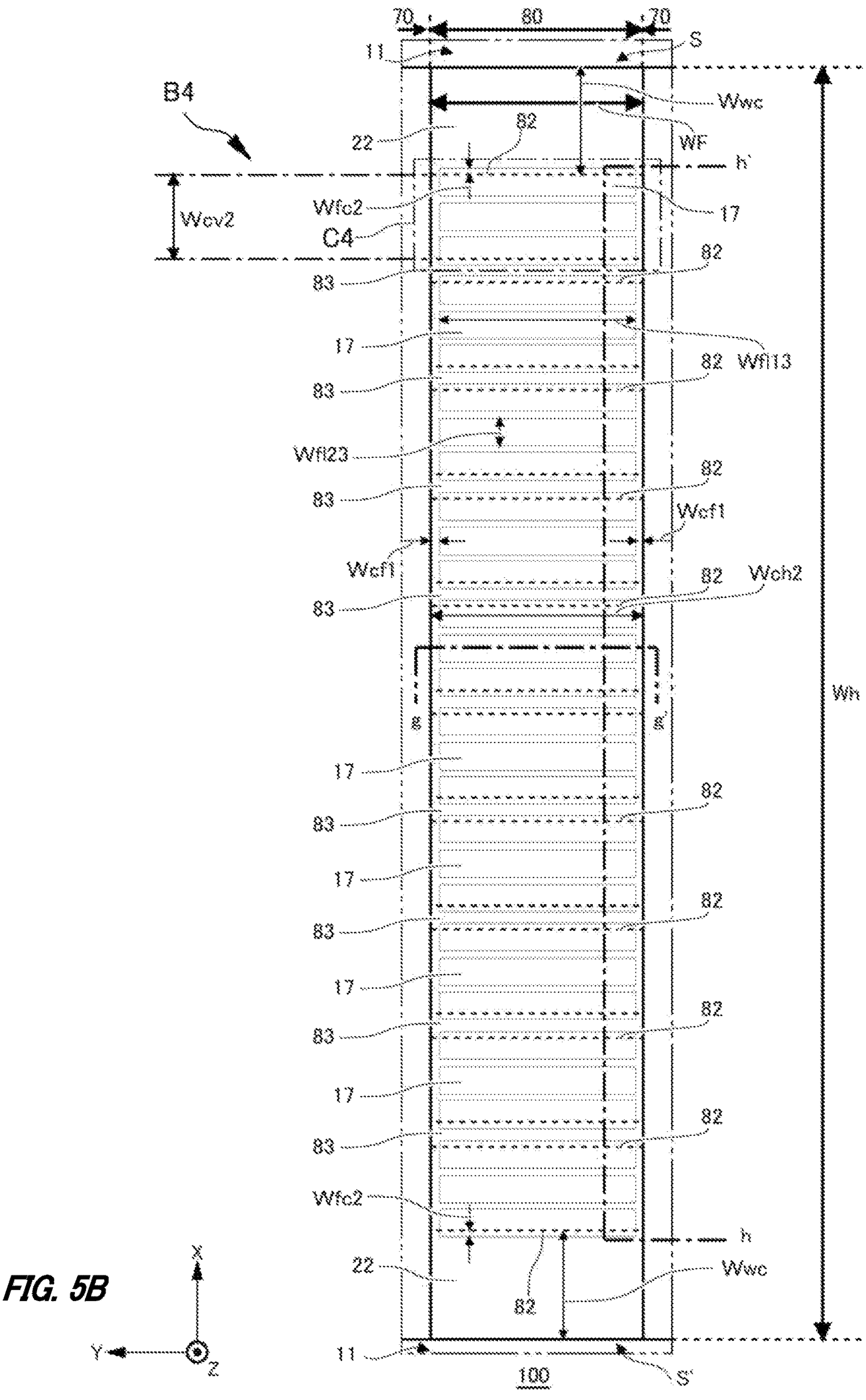
FIG. 5B is an enlarged view of a region B4 in FIG. 5A.

FIG. 5B is an enlarged view of a region B4 in FIG. 5A. FIG. 5B is an enlarged view from the end S of the well region 11 on the positive side of the X-axis direction to the end S' of the well region 11 on the negative side of the X-axis direction, in the diode section 80 of FIG. 5A.

As shown in FIG. 5B, in the semiconductor device 100 of the present example, the thirty floating regions 17 are provided in the diode section 80, for example. In the semiconductor device 100 of the present example, for example, the ten first cathode regions 82 are provided and the nine second cathode regions 83 are provided. Therefore, there are eighteen boundaries parallel to the Y-axis direction between the first cathode regions 82 and the second cathode regions 83. For this reason, the eighteen floating regions 17 of the thirty floating regions 17 are respectively provided with overlapping the boundaries.

The first cathode region 82 provided the farthest on the positive side of the X-axis direction is adjacent to the collector region 22 provided on the positive side of the first cathode region 82 in the X-axis direction. One floating region 17 is provided with overlapping a boundary parallel to the Y-axis direction between the first cathode region 82 and the collector region 22. Also, the first cathode region 82 provided the farthest on the negative side of the X-axis direction is adjacent to the collector region 22 provided on the negative side of the first cathode region 82 in the X-axis direction. Another one floating region 17 is provided with overlapping a boundary parallel to the Y-axis direction between the first cathode region 82 and the collector region 22. The ten floating regions 17 of the thirty floating regions 17 are provided on the inner sides of the first cathode regions 82, as seen from above the semiconductor substrate 10.

In each of the first cathode regions 82, as seen from above the semiconductor substrate 10, a ratio of an area of the floating region 17 to an area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio, expressed in percentage, of the floating region 17 to that area may be 64% or greater and 72% or less.

In the semiconductor device 100 of the present example, a width Wcf1 may be the same as the width Wcf1 in the example shown in FIG. 4B. The width Wcf1 may be any value except zero.

In the semiconductor device 100 of the present example, a width Wfl13 of the floating region 17 in the Y-axis direction may be the same as the width Wfl13 in the example shown in FIG. 4B. A width Wfl23 of the floating region 17 in the X-axis direction may be smaller than the width Wfl22 in the example shown in FIG. 4B.

In the semiconductor device 100 of the present example, a width Wfc2 is a width in the X-axis direction from an end, on the positive side of the X-axis direction, of the floating region 17 provided the farthest on the positive side of the X-axis direction, to a boundary, parallel to the Y-axis direction, between the first cathode region 82 provided the farthest on the positive side of the X-axis direction and the collector region 22 provided on the positive side of the X-axis direction. Also, the width Wfc2 is a width in the X-axis direction from an end, on the negative side in the X-axis direction, of the floating region 17 provided the farthest on the negative side of the X-axis direction to a boundary, parallel to the Y-axis direction, between the first cathode region 82 provided the farthest on the negative side of the X-axis direction and the collector region 22 provided on the negative side of the X-axis direction.

Figure 5C:
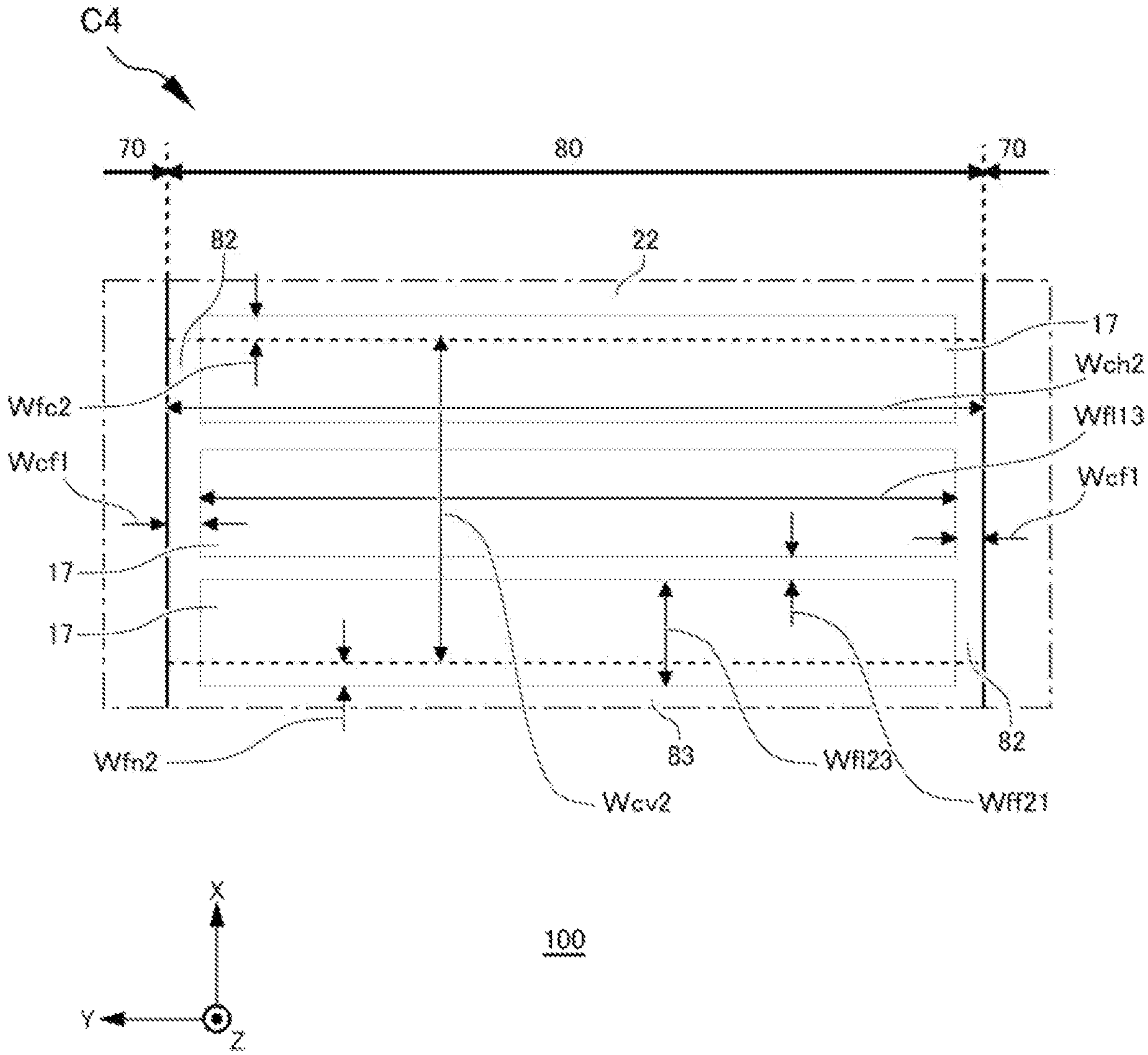
FIG. 5C is an enlarged view of a region C4 in FIG. 5B.

FIG. 5C is an enlarged view of a region C4 in FIG. 5B. As shown in FIG. 5C, in the semiconductor device 100 of the present example, the first cathode regions 82 and the second cathode regions 83 are provided from the boundary of the transistor section 70 on the positive side of the Y-axis direction to the boundary on the negative side of the Y-axis direction. In FIG. 5C, the floating region 17 provided the farthest on the negative side of the X-axis direction is provided to overlap the first cathode region 82 and the second cathode region 83, as seen from above the semiconductor substrate 10. In FIG. 5C, the floating region 17 provided the farthest on the positive side of the X-axis direction is provided to overlap the first cathode region 82 and the collector region 22, as seen from above the semiconductor substrate 10. In FIG. 5C, the floating region 17 provided at the center in the X-axis direction is provided to overlap the first cathode region 82, as seen from above the semiconductor substrate 10.

In the semiconductor device 100 of the present example, a width Wfn2 is a width in the X-axis direction from a boundary between the first cathode region 82 and the second cathode region 83 adjacent to the first cathode region 82 on the negative side of the X-axis direction to an end, on the negative side in the X-axis direction, of the floating region 17 provided to overlap the first cathode region 82. Also, the width Wfn2 is a width in the X-axis direction from a boundary between the first cathode region 82 and the second cathode region 83 adjacent to the first cathode region 82 on the positive side of the X-axis direction to an end of the floating region 17, which is provided to overlap the first cathode region 82, on the positive side of the X-axis direction, although it is outside of the region C4.

In the semiconductor device 100 of the present example, a width Wff21 is an interval in the X-axis direction between a floating region 17 and a floating region 17 adjacent to the corresponding floating region 17. All of the plurality of floating regions 17 may be arranged at the interval of the width Wff21 in the Y-axis direction. However, when there is a floating region 17 overlapping the boundary between the first cathode region 82 and the second cathode region 83, there may be a floating region 17 arranged at an interval different from the width Wff21.

The width Wfn2 is smaller than the width Wfl23. The width Wfn2 may be the same or different from the width Wfc2.

Figure 5D:
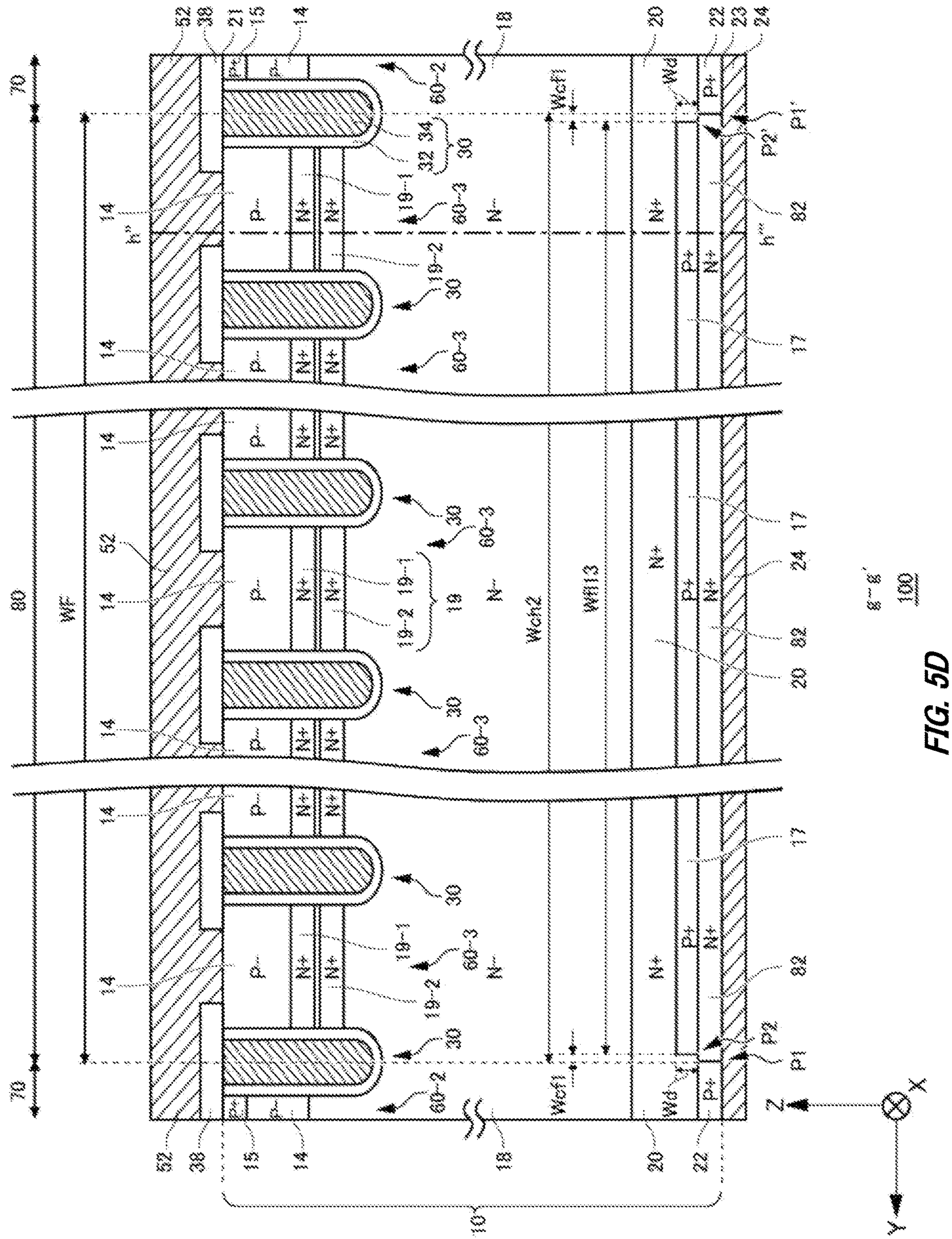
FIG. 5D shows an example of a cross-sectional view taken along a line g-g' in FIG. 5B.

FIG. 5D shows an example of a cross-sectional view taken along a line g-g' in FIG. 5B. The configuration on the g-g' cross-section of the semiconductor device 100 of the present example is the same as the configuration on the e-e' cross-section of the semiconductor device 100 shown in FIG. 4C.

Figure 5E:
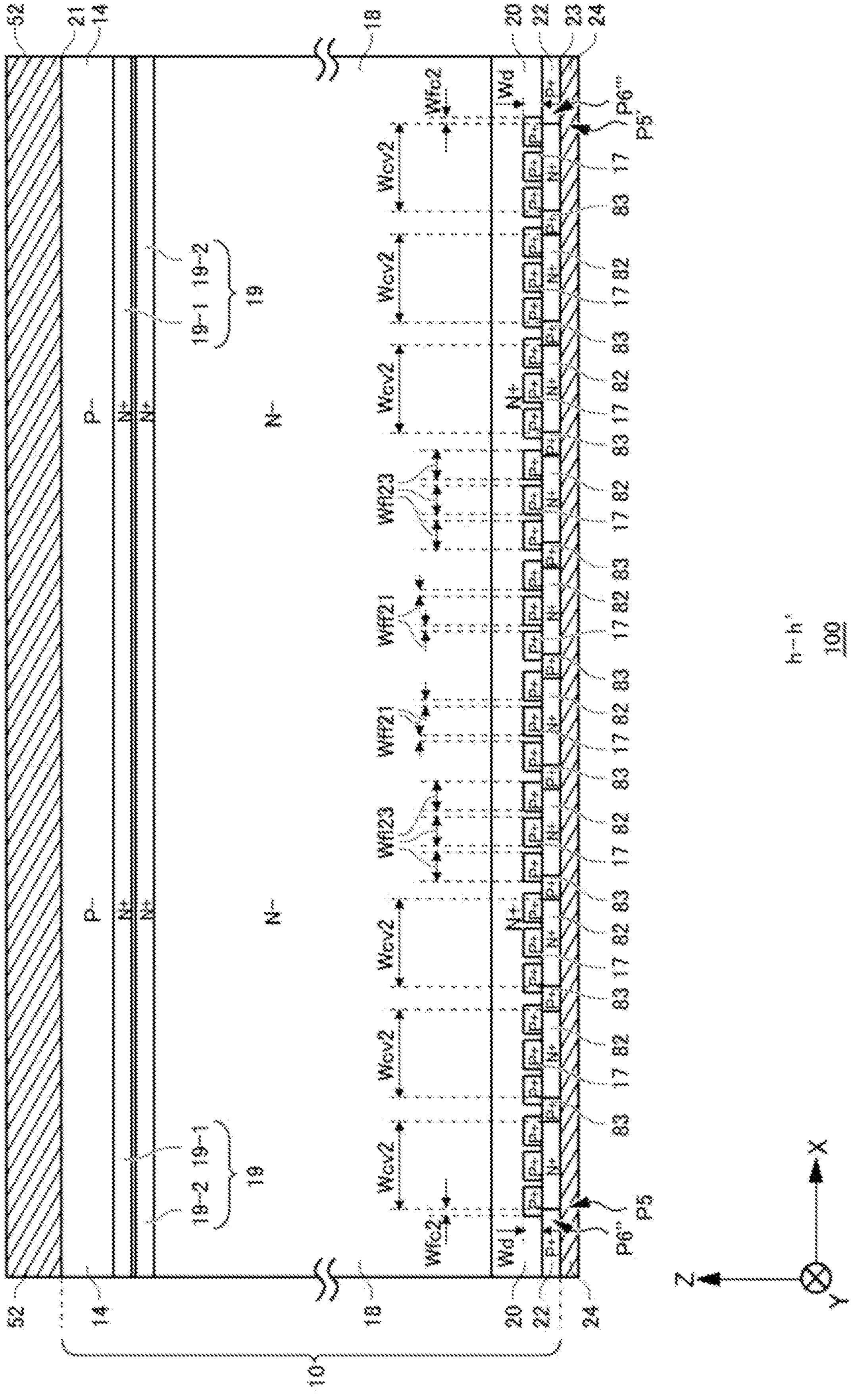
FIG. 5E shows an example of a cross-sectional view taken along a line h-h' in FIG. 5B.

FIG. 5E shows an example of a cross-sectional view taken along a line h-h' in FIG. 5B. The h-h' cross-section is the XZ plane passing a line h"-h'" in FIG. 5D. In the diode section 80 of the semiconductor device 100 of the present example, the floating regions 17 are provided above the first cathode regions 82. The floating region 17 may be in contact with the first cathode region 82.

In the semiconductor device 100 of the present example, an end position P6" on the negative side of the X-axis direction of the first cathode region 82 located the farthest on the negative side of the X-axis direction is provided farther on the negative side of the X-axis direction than the boundary position P5. Also, an end position P6'" on the positive side of the X-axis direction of the first cathode region 82 located the farthest on the positive side of the X-axis direction is provided farther on the positive side of the X-axis direction than the boundary position P5'. A width Wfc2 is a width in the X-axis direction from the boundary position P5 to the end position P6'. Also, the width Wfc2 is a width in the X-axis direction from the boundary position P5' to the end portion P6'.

Some floating regions 17 of the plurality of floating regions 17 are provided above the boundaries between the first cathode regions 82 and the second cathode regions 83. The floating regions 17 provided above the boundaries are provided to be in contact with both the first cathode regions 82 and the second cathode regions 83. Also, the floating regions 17 provided the farthest on the negative side and the positive side of the X-axis direction are respectively provided above the boundary position P5 and the boundary position P5'. The floating region 17 provided above the boundary position P5 is provided to be in contact with both the first cathode region 82 located the farthest on the negative side of the X-axis direction and the collector region 22 on the negative side of the X-axis direction. Also, the floating region 17 provided above the boundary position P5' is provided to be in contact with both the first cathode region 82 located the farthest on the positive side of the X-axis direction and the collector region 22 on the positive side of the X-axis direction.

In the semiconductor device 100 of the present example, the second cathode regions 83 of the second conductivity-type and the second conductivity-type floating regions 17 are provided to be in contact with each other. For this reason, it is possible to further suppress the surge voltage upon reverse recovery of the diode section 80 than the semiconductor device 100 shown in FIG. 4D.

Figure 6A:
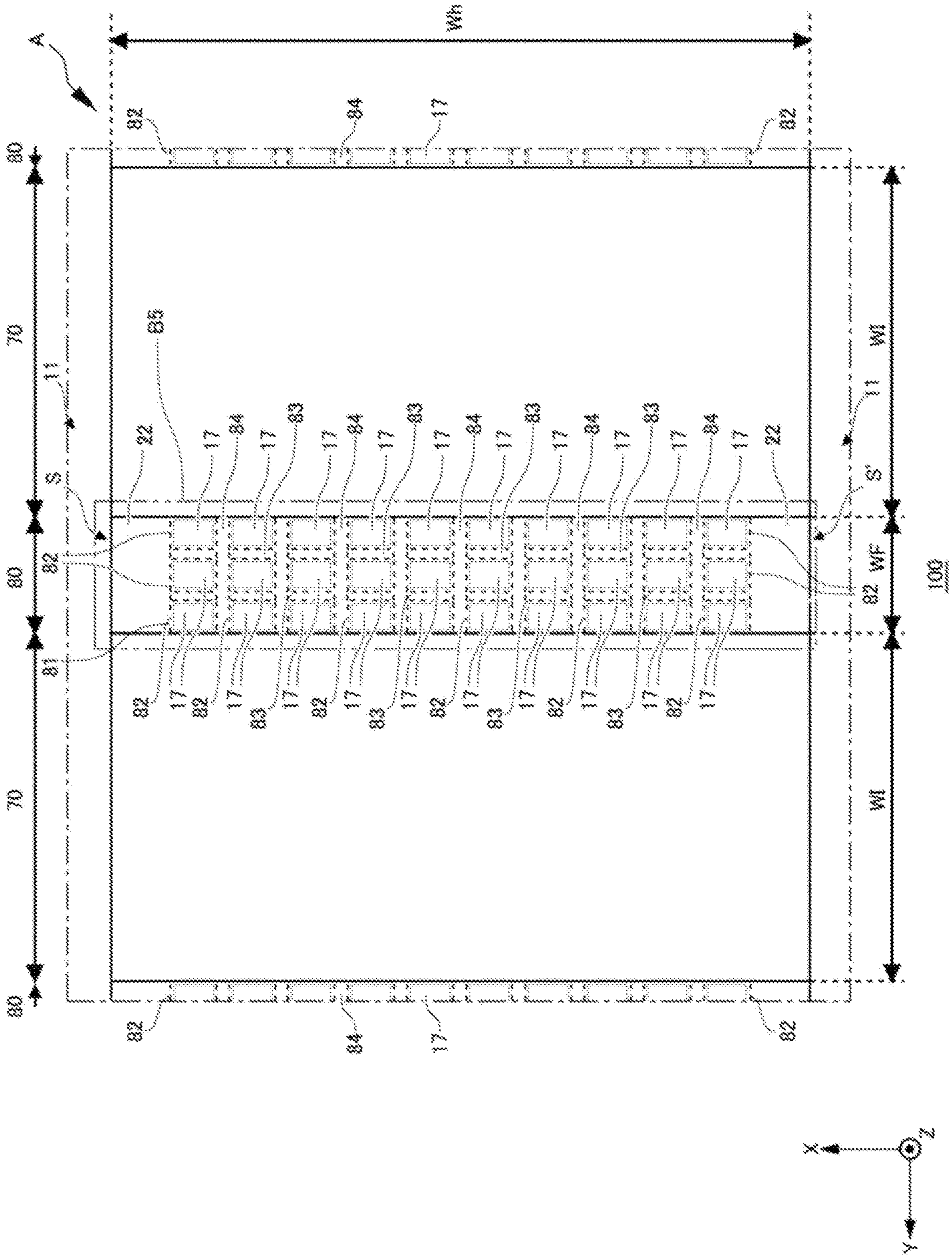
FIG. 6A is another enlarged view of the region A in FIG. 1A.

FIG. 6A is another enlarged view of the region A in FIG. 1A. In the semiconductor device 100 of the present example, as seen from above the semiconductor substrate 10, the first cathode regions 82 are provided in a lattice shape with being separated from each other. The lattice shape indicates that the first cathode regions 82 are periodically arranged both in the X-axis direction and in the Y-axis direction. FIG. 6A shows an example in which the ten first cathode regions 82 are provided in the X-axis direction and the three first cathode regions 82 are provided in the Y-axis direction.

As seen from above the semiconductor substrate 10, the second cathode region 83 is provided between the two first cathode regions 82 adjacent to each other in the Y-axis direction. A third cathode region 84 is provided between the two first cathode regions 82 adjacent to each other in the X-axis direction. As seen from above the semiconductor substrate 10, the third cathode region 84 is also provided between the two second cathode regions 83 adjacent to each other in the X-axis direction.

The semiconductor device 100 of the present example includes a plurality of floating regions 17 provided to be separated from each other and distributed to all the first cathode regions 82. In the semiconductor device 100 of the present example, the first cathode region 82 extends beyond the floating region 17 in the arrangement direction, as seen from above the semiconductor substrate 10. In the semiconductor device 100 of the present example, both sides of the first cathode region 82 in the arrangement direction extend beyond the floating region 17 in the arrangement direction, as seen from above the semiconductor substrate 10. That is, the first cathode region 82 has parts, which are not covered by the floating region 17, on both sides of the floating region 17 in the Y-axis direction.

Also, in the semiconductor device 100 of the present example, the first cathode region 82 extends beyond the floating region 17 in the extension direction. In the semiconductor device 100 of the present example, both sides of the first cathode region 82 in the extension direction extend beyond the floating region 17 in the extension direction, as seen from above the semiconductor substrate 10. That is, the first cathode region 82 has parts, which are not covered by the floating region 17, on both sides of the floating region 17 in the X-axis direction.

In the semiconductor device 100 of the present example, the entire floating region 17 is arranged to overlap the first cathode region 82, as seen from above the semiconductor substrate 10. That is, as seen from above the semiconductor substrate 10, the floating regions 17 are provided on the inner sides of the first cathode regions 82 provided in the lattice shape.

The floating region 17 is arranged not to overlap the transistor section 70, as seen from above the semiconductor substrate 10. The floating region 17 is also arranged not to overlap the boundary between the diode section 80 and the transistor section 70.

Figure 6B:
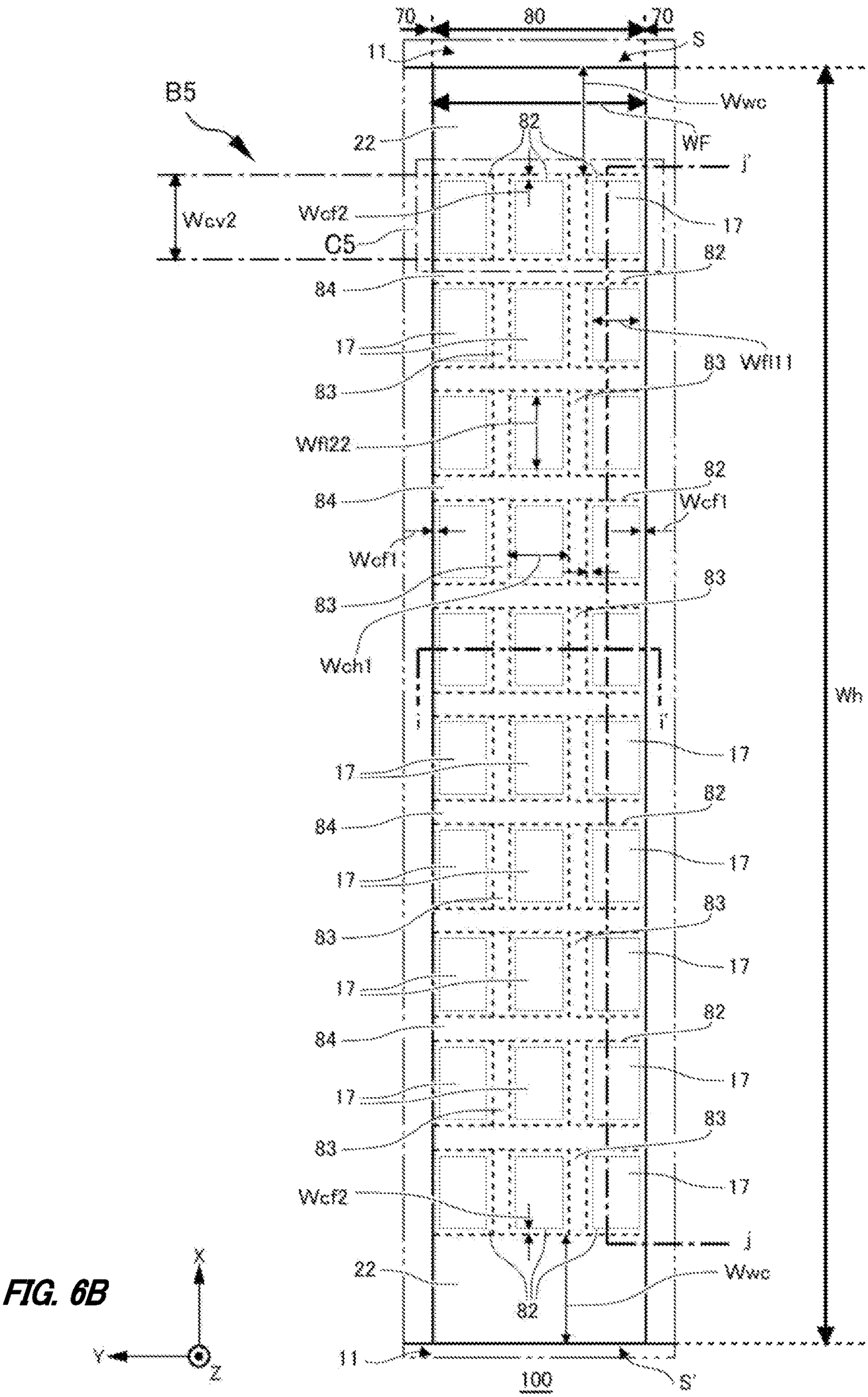
FIG. 6B is an enlarged view of a region B5 in FIG. 6A.

FIG. 6B is an enlarged view of a region B5 in FIG. 6A. FIG. 6B is an enlarged view from the end S of the well region 11 on the positive side of the X-axis direction to the end S' of the well region 11 on the negative side of the X-axis direction, in the diode section 80 of FIG. 6A. As shown in FIG. 6B, the semiconductor device 100 of the present example includes the floating regions 17 on the inner sides of the respective first cathode regions 82 in the XY plane.

In the semiconductor device 100 of the present example, a width Wcf1 and a width Wcf2 may be the same as the width Wcf1 and the width Wcf2 in the example shown in FIG. 2B. The width Wcf1 may be any value except zero. The width Wcf2 may be zero.

In the semiconductor device 100 of the present example, a width Wfl11 may be the same as the width Wfl11 in the example of FIG. 2B. A width Wfl22 may be the same as the width Wfl22 in the example of FIG. 4B. A width Wch1 may be the same as the width Wch1 in the example of FIG. 2B. A width Wcv2 may be the same as the width Wcv2 in the example of FIG. 4B.

In each of the first cathode regions 82, the width Wfl11 of the floating region 17 in the Y-axis direction may be 89% or greater and 95% or less of the width Wch1. Also, in each of the first cathode regions 82, the width Wfl22 of the floating region 17 in the X-axis direction may be 89% or greater and 95% or less of the width Wcv2.

In each of the first cathode regions 82, as seen from above the semiconductor substrate 10, a ratio of an area of the floating region 17 to an area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio, expressed in percentage, of the floating region 17 to the area may be 64% or greater and 72% or less.

Figure 6C:
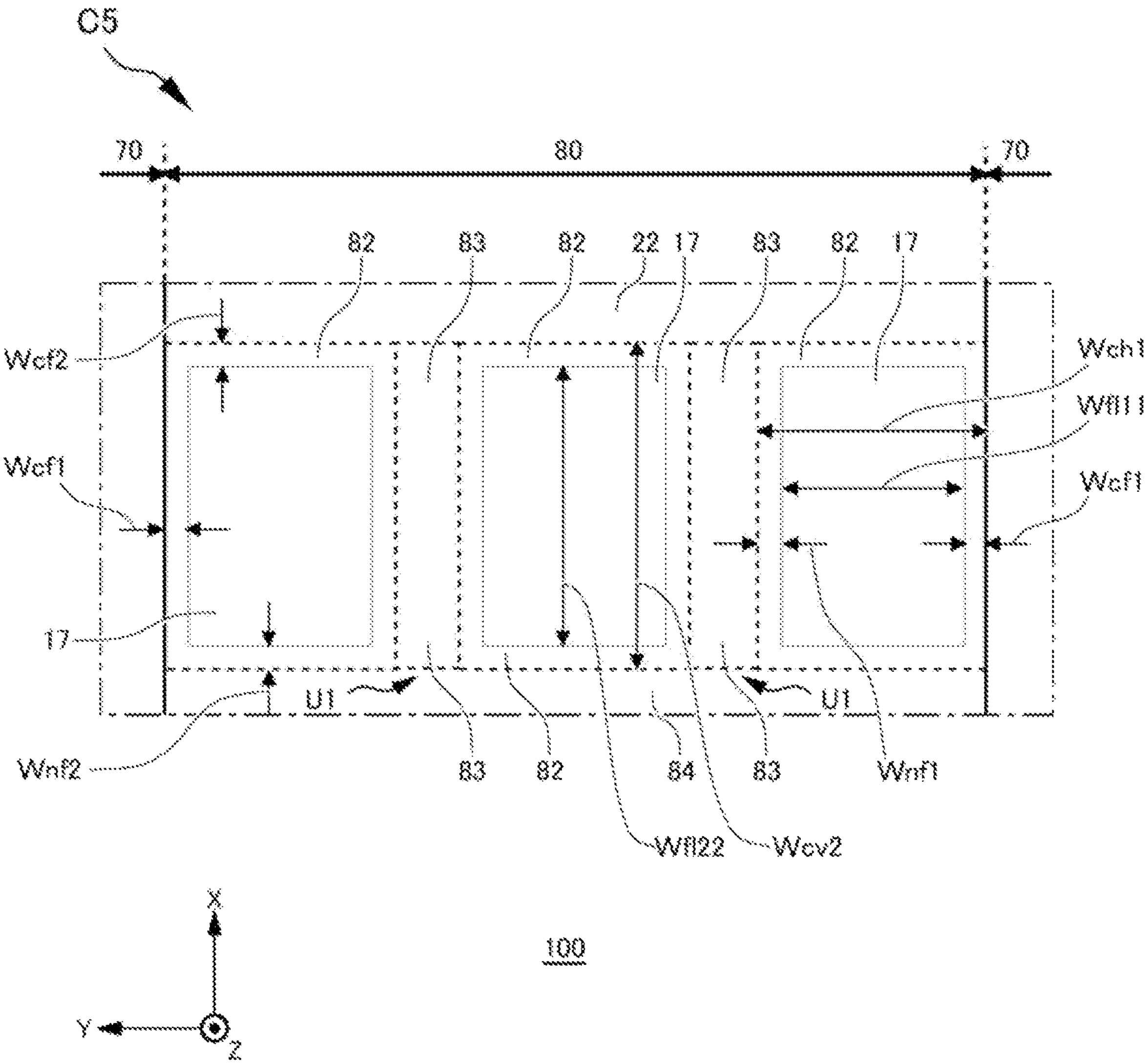
FIG. 6C is an enlarged view of a region C5 in FIG. 6B.

FIG. 6C is an enlarged view of a region C5 in FIG. 6B. As shown in FIG. 6C, the semiconductor device 100 of the present example includes a third cathode region 84 provided to be in contact with the second cathode region 83 at an end portion U1 of the second cathode region 83 on the negative side of the X-axis direction, in a direction (the X-axis direction) parallel to the boundary between the first cathode region 82 and the second cathode region 83, as seen from above the semiconductor substrate 10. The third cathode region 84 may be provided to be in contact with each of the two end portions U1 of the second cathode regions 83.

As shown in FIG. 6C, the semiconductor device 100 of the present example includes the three first cathode regions 82 in the Y-axis direction, for example. The floating regions 17 are provided on the inner sides of the respective first cathode regions 82 in the XY plane.

A width Wnf2 is a width in the X-axis direction from an end of the first cathode region 82 on the negative side of the X-axis direction to an end, on the negative side of the X-axis direction, of the floating region 17 arranged to overlap that first cathode region 82. Also, the width Wnf2 is a width in the X-axis direction from an end, on the positive side of the X-axis direction, of the first cathode region 82 except the first cathode regions which are located the farthest on the positive and negative sides of the X-axis direction to an end, on the positive side of the X-axis direction, of the floating region 17 arranged to overlap that cathode region 17, although that cathode region 17 is outside of the region C5.

The width Wnf2 may be the same or different from the width Wcf2. The width Wnf2 may be zero.

Figure 6D:
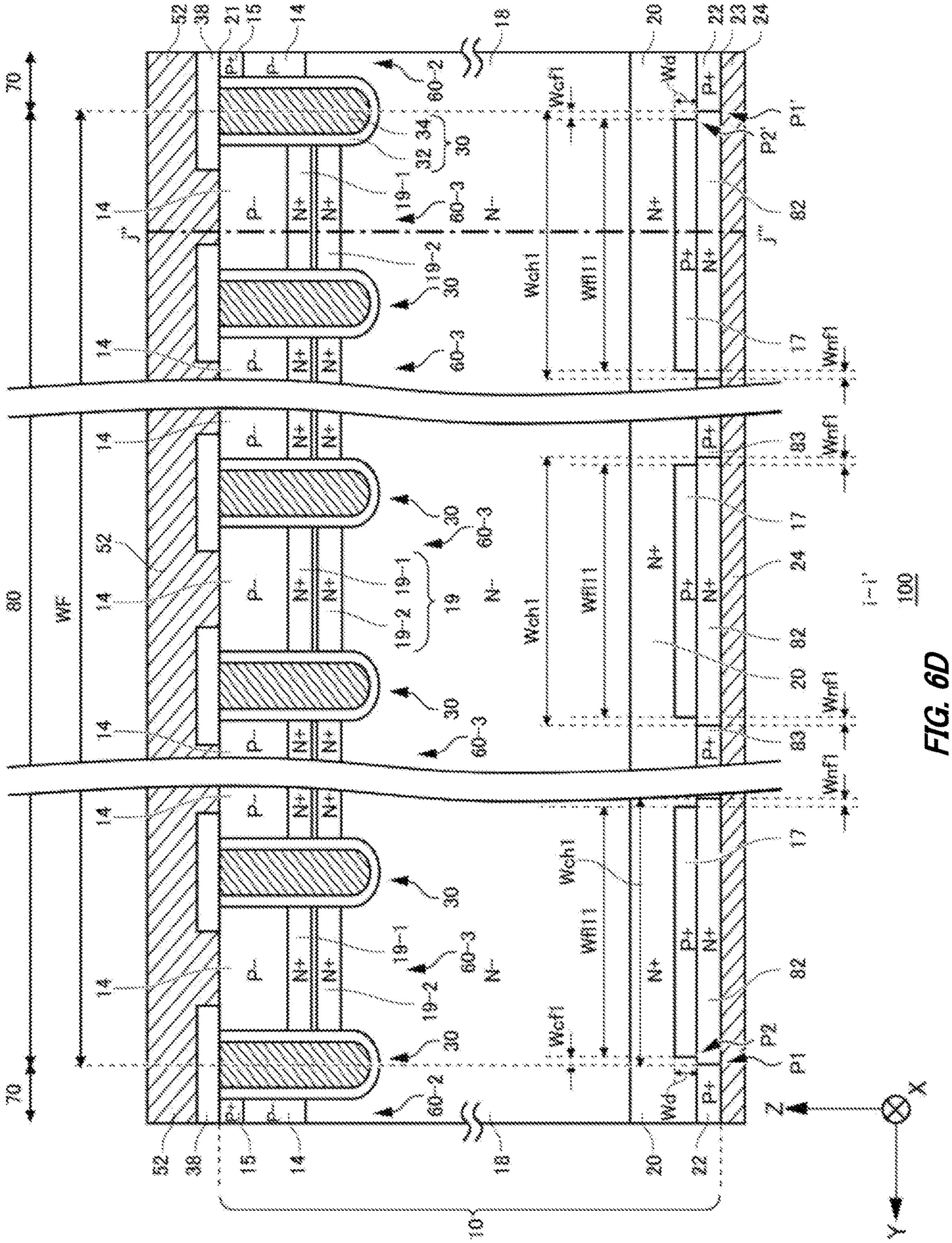
FIG. 6D shows an example of a cross-sectional view taken along a line i-i' in FIG. 6B.

FIG. 6D shows an example of a cross-sectional view taken along a line i-i' in FIG. 6B. The configuration on the i-i' cross-section of the semiconductor device 100 of the present example is the same as the configuration on the a-a' cross-section of the semiconductor device 100 shown in FIG. 2D.

Figure 6E:
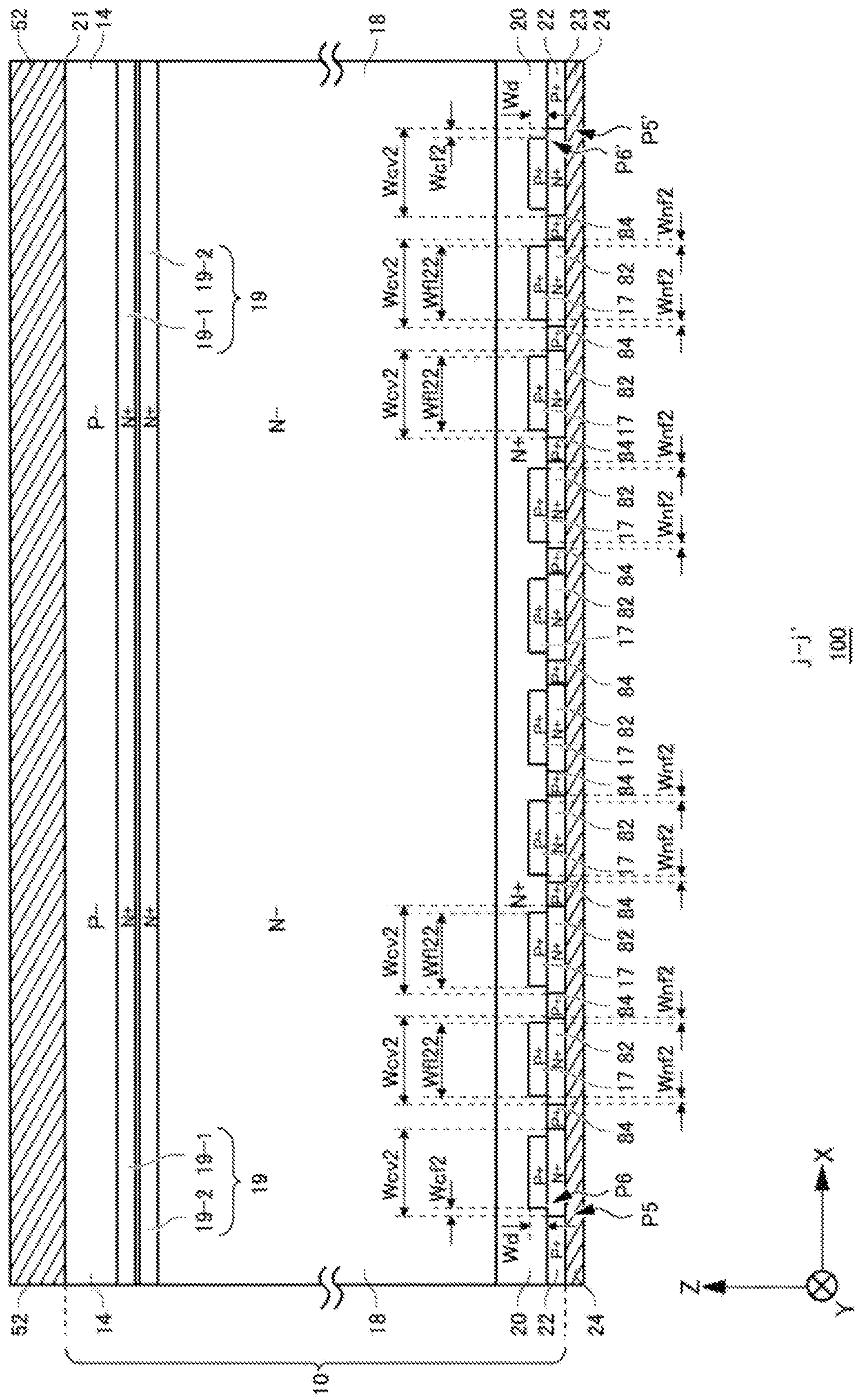
FIG. 6E shows an example of a cross-sectional view taken along a line j-j' in FIG. 6B.

FIG. 6E shows an example of a cross-sectional view taken along a line j-j' in FIG. 6B. The j-j' cross-section is the XZ plane passing a line j"-j"' in FIG. 6D. The configuration on the j-j' cross-section of the semiconductor device 100 of the present example is different from the semiconductor device 100 shown in FIG. 4D, in that the third cathode regions 84 are provided, instead of the second cathode region 83, on the f-f' cross-section of the semiconductor device 100 shown in FIG. 4D.

The semiconductor device 100 of the present example includes the floating regions 17 distributed to all the cathode regions 82 provided to be separated from each other and in a lattice shape. For this reason, it is possible to suppress the surge voltage upon reverse recovery of the diode section 80.

Figure 7A:
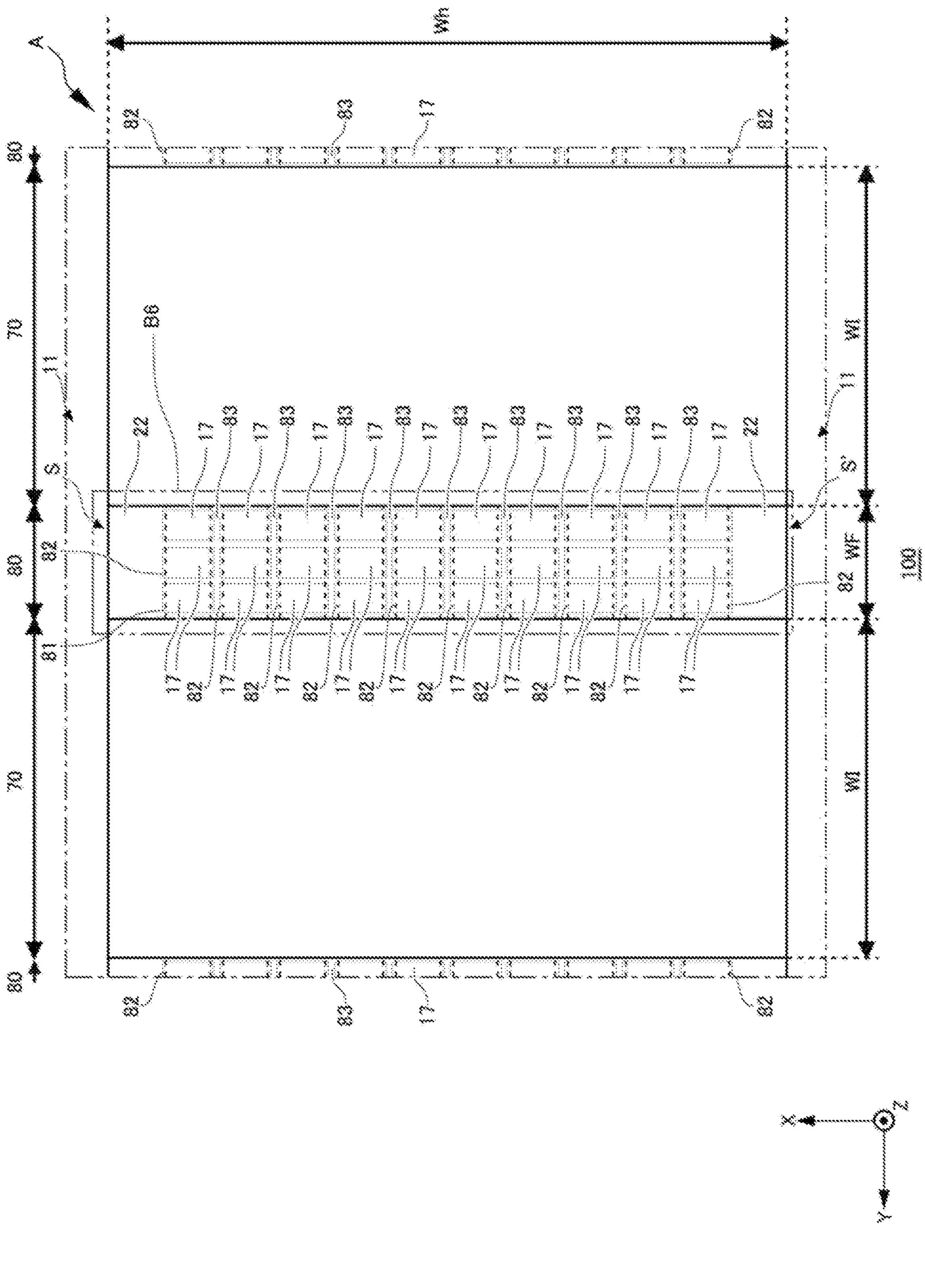
FIG. 7A is another enlarged view of the region A in FIG. 1A.

FIG. 7A is another enlarged view of the region A in FIG. 1A. In the semiconductor device 100 of the present example, the floating region 17 extends beyond the first cathode region 82 in the extension direction, as seen from above the semiconductor substrate 10. In the semiconductor device 100 of the present example, both sides of the floating region 17 in the extension direction extend beyond the first cathode region 82 in the extension direction. That is, the floating region 17 is provided to overlap the entire first cathode region 82 in the X-axis direction. In the meantime, the floating region 17 may extend beyond the first cathode region 82 in the extension direction on one of either the positive or negative side of the X-axis direction.

In other words, in the semiconductor device 100 of the present example, as seen from above the semiconductor substrate 10, the end of the floating region 17 on the positive side of the X-axis direction is provided farther on the positive side of the X-axis direction than the end of the first cathode region 82 on the positive side of the X-axis direction, and the end of the floating region 17 on the negative side of the X-axis direction is provided farther on the negative side of the X-axis direction than the end of the first cathode region 82 on the negative side of the X-axis direction.

In the semiconductor device 100 of the present example, the floating regions 17 may be provided in a lattice shape. FIG. 7A shows an example of the semiconductor device 100, in which the ten floating regions 17 are provided in the X-axis direction and the three floating regions 17 are provided in the Y-axis direction. In the semiconductor device 100 of the present example, the number of the floating regions 17 in the X-axis direction may be the same as the number of the first cathode regions 82 in the X-axis direction.

The floating region 17 provided to overlap the first cathode region 82 may be separated from in the X-axis direction or integrally formed with a floating region 17 provided to overlap another first cathode region 82 adjacent to the floating region 17 on the positive or negative side of the X-axis direction.

Figure 7B:
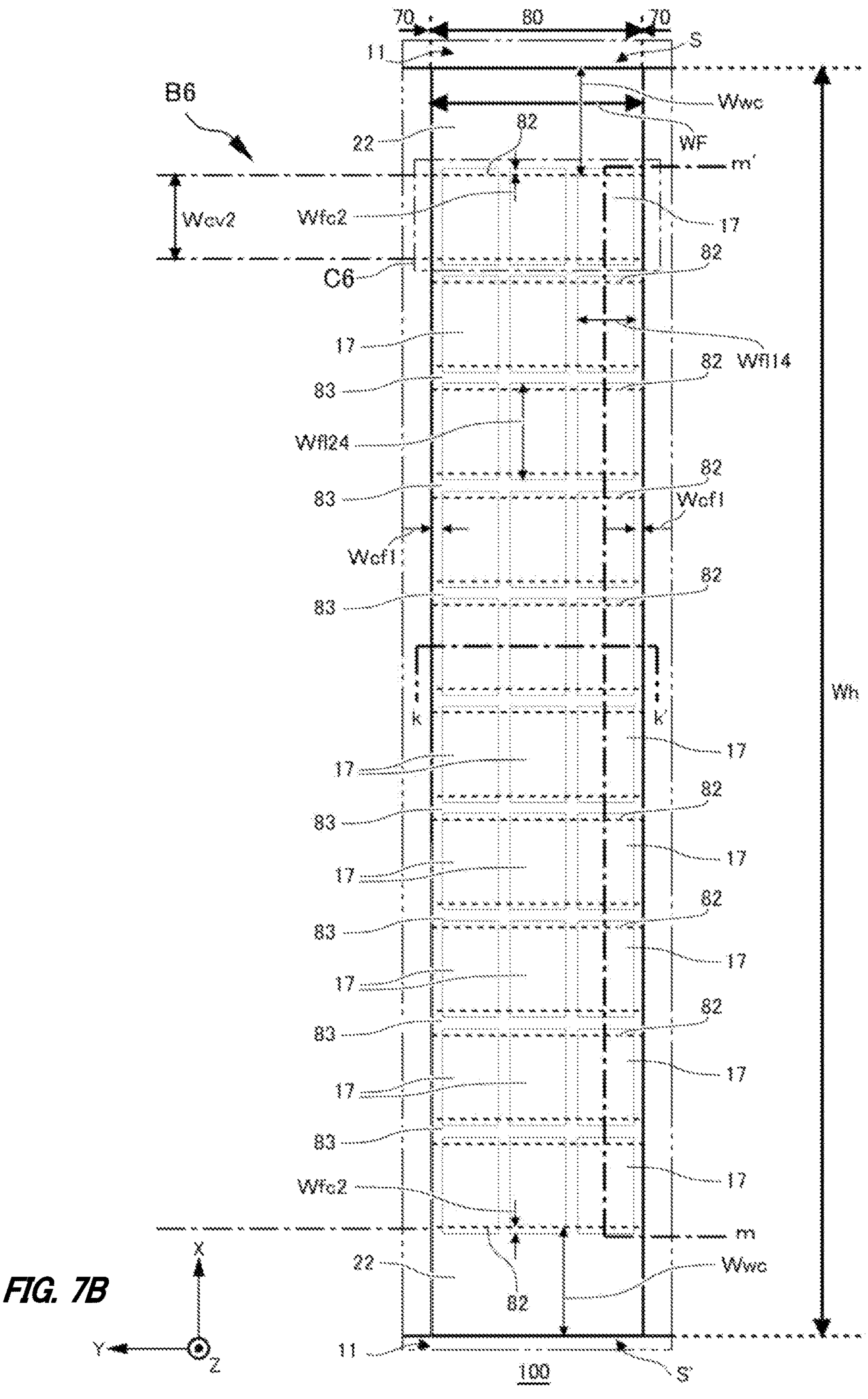
FIG. 7B is an enlarged view of a region B6 in FIG. 7A.

FIG. 7B is an enlarged view of a region B6 in FIG. 7A. FIG. 7B is an enlarged view from the end S of the well region 11 on the positive side of the X-axis direction to the end S' of the well region 11 on the negative side of the X-axis direction, in the diode section 80 of FIG. 7A. As shown in FIG. 7B, in the diode section 80 of the semiconductor device 100 of the present example, the floating region 17 is provided to overlap the entire first cathode region 82 in the X-axis direction.

In the semiconductor device 100 of the present example, a width Wcf1 may be the same as the width Wcf1 in the example of FIG. 2B. The width Wcf1 may be any value except zero.

In the semiconductor device 100 of the present example, a width Wfl14 of the floating region 17 in the Y-axis direction may be greater than, smaller than or the same as the width Wfl11 in the semiconductor device 100 of the example shown in FIG. 4B. A width Wfl24 of the floating region 17 in the X-axis direction may be greater than the width Wfl22 in the semiconductor device 100 shown in FIG. 4B.

In the semiconductor device 100 of the present example, a region of the floating region 17, which does not overlap the first cathode region 82, as seen from above the semiconductor substrate 10, may overlap the second cathode region 83. An end, on the positive side of the X-axis direction, of the floating region 17 provided to overlap the first cathode region 82 provided the farthest on the positive side of the X-axis direction, may overlap a part of the collector region 22 provided on the positive side of the X-axis direction in the first cathode region 82, as seen from above the semiconductor substrate 10. An end, on the negative side in the X-axis direction, of the floating region 17 provided to overlap the first cathode region 82 provided the farthest on the negative side of the X-axis direction, may overlap a part of the collector region 22 provided on the negative side of the X-axis direction in the first cathode region 82, as seen from above the semiconductor substrate 10.

In the semiconductor device 100 of the present example, a width Wfc2 is a width in the X-axis direction from an end, on the positive side of the X-axis direction, of the floating region 17 provided to overlap the first cathode region 82 provided the farthest on the positive side of the X-axis direction, to an end of the first cathode region 82 on the positive side of the X-axis direction. Also, the width Wfc2 is a width in the X-axis direction from an end, on the negative side in the X-axis direction, of the floating region 17 provided to overlap the first cathode region 82 provided the farthest on the negative side of the X-axis direction, to an end of the first cathode region 82 on the negative side of the X-axis direction.

The width Wfc2 may be the same or different from the width Wch2 in the semiconductor device 100 shown in FIG. 4B.

In each of the first cathode regions 82, as seen from above the semiconductor substrate 10, a ratio of an area of the floating region 17 to an area of the first cathode region 82 may be 80% or greater and 90% or less in percentage terms. In a case in which ratios of the area of the first cathode region 82 and the area of the second cathode region 83 to the total area of the first cathode region 82 and the second cathode region 83 are respectively 80% and 20% in percentage terms, as seen from above the semiconductor substrate 10, an area ratio, expressed in percentage, of the floating region 17 to that area may be 64% or greater and 72% or less.

Figure 7C:
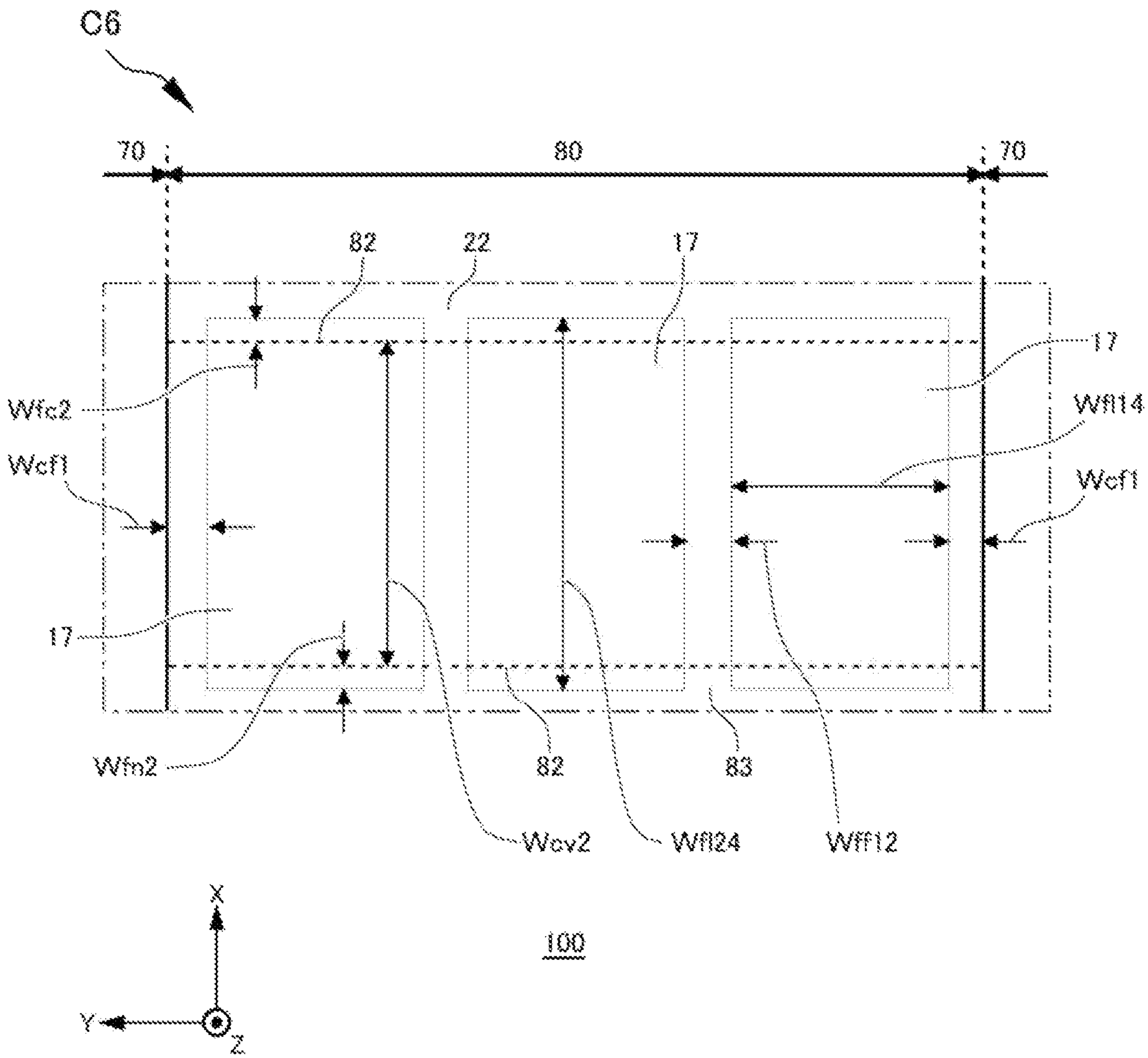
FIG. 7C is an enlarged view of a region C6 in FIG. 7B.

FIG. 7C is an enlarged view of a region C6 in FIG. 7B. As shown in FIG. 7C, in the semiconductor device 100 of the present example, the floating region 17 is provided to overlap the entire first cathode region 82 in the X-axis direction, as seen from above the semiconductor substrate 10.

In the semiconductor device 100 of the present example, for example, the three floating regions 17 are provided in the Y-axis direction. Also, a width Wfl24 is greater than the width Wcv2.

A width Wfn2 is a width in the X-axis direction from an end of the first cathode region 82 on the negative side of the X-axis direction to an end, on the negative side of the X-axis direction, of the floating region 17 arranged to overlap that first cathode region 82, in the region C6, as seen from above the semiconductor substrate 10. The width Wfn2 may be the same or different from the width Wfc2.

Figure 7D:
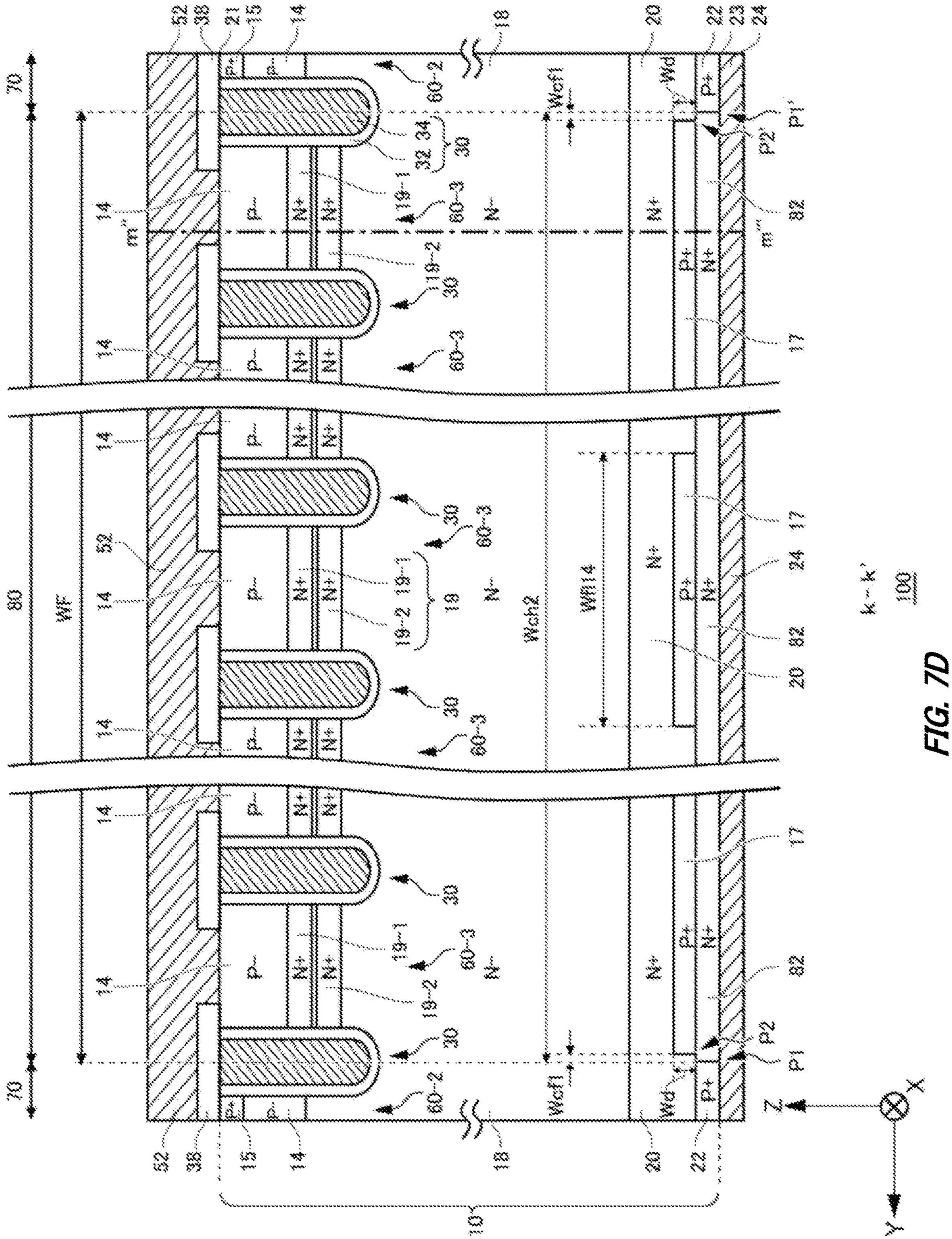
FIG. 7D shows an example of a cross-sectional view taken along a line k-k' in FIG. 7B.

FIG. 7D shows an example of a cross-sectional view taken along a line k-k' in FIG. 7B. In the semiconductor device 100 of the present example, the first cathode region 82 is continuously provided from the end P1 to the end P1' in the Y-axis direction, on the k-k' cross-section. The floating region 17 is provided above the first cathode region 82. The floating region 17 may be provided to be in contact with the first cathode region 82.

In the present example, the three floating regions 17 are provided in the Y-axis direction. A width Wfl14 may be greater than, smaller than or the same as the width Wfl11 in the example of FIG. 2D.

Figure 7E:
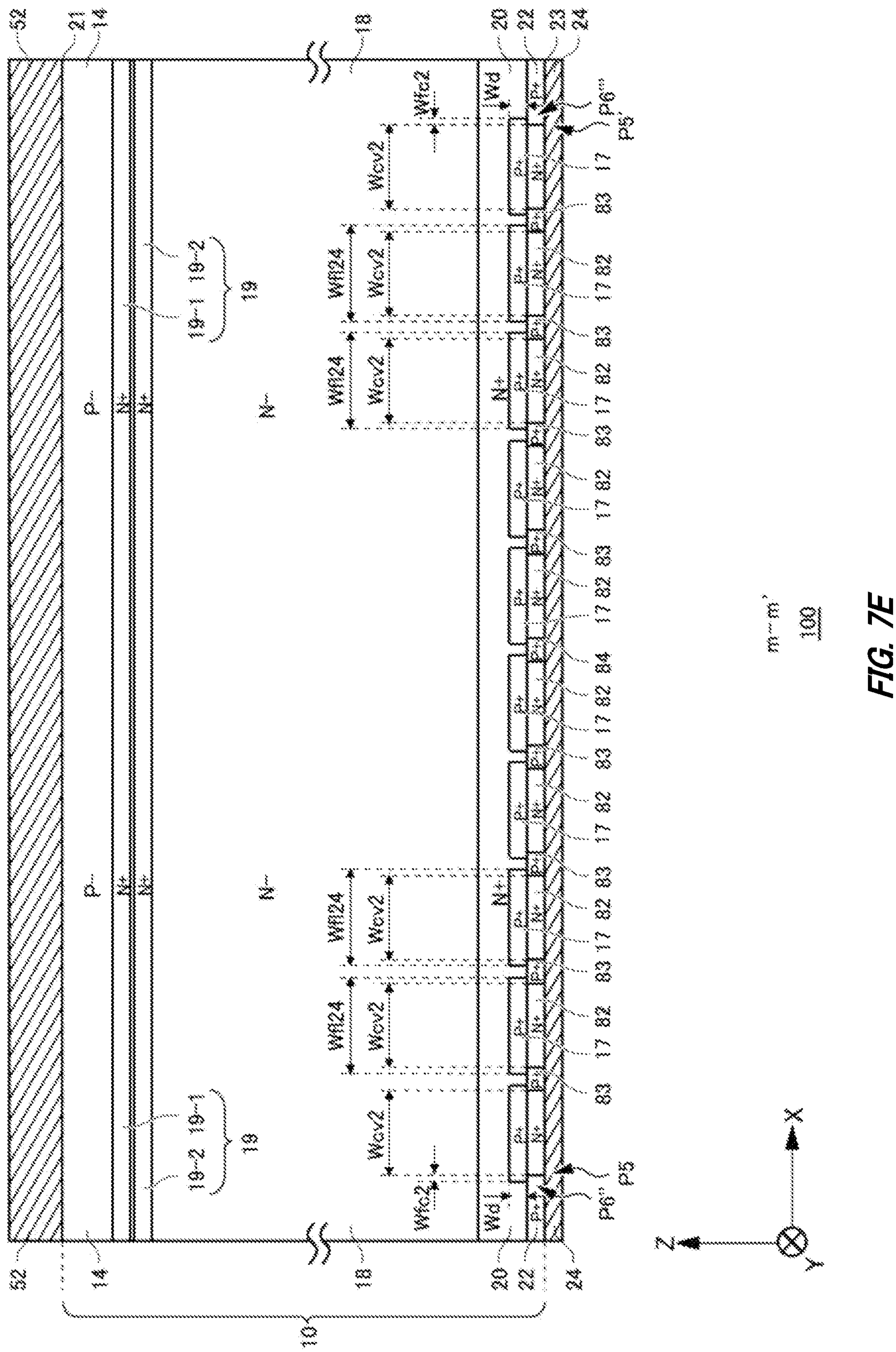
FIG. 7E shows an example of a cross-sectional view taken along a line m-m' in FIG. 7B.

FIG. 7E shows an example of a cross-sectional view taken along a line m-m' in FIG. 7B. The m-m' cross-section is the XZ plane passing the line m"-m'" in FIG. 7D. As shown in FIG. 7E, in the semiconductor device 100 of the present example, the first cathode regions 82 alternate with the second cathode regions 83 in the X-axis direction, on the m-m' cross-section.

The floating region 17 is provided above the first cathode region 82. Also, the floating region 17 provided above the first cathode region 82 is also provided above a part of the second cathode region 83 adjacent to the first cathode region 82 in the X-axis direction. For this reason, the width Wfl24 is greater than the width Wcv2.

The floating region 17 provided the farthest on the positive side of the X-axis direction may be provided above a part of the collector region 22 provided on the positive side of the X-axis direction. The floating region 17 provided the farthest on the negative side of the X-axis direction may also be provided above a part of the collector region 22 provided on the negative side of the X-axis direction.

The floating region 17 may be provided to be in contact with the first cathode region 82. Also, the floating region 17 may be provided to be in contact with the second cathode region 83. Also, the floating region 17 may be provided to be in contact with the collector region 22.

In the semiconductor device 100 of the present example, the floating region 17 is provided to overlap the entire first cathode region 82 in the X-axis direction. Also, the floating region 17 is provided to overlap the second cathode region 83 at both ends of the first cathode region 82 in the X-axis direction. For this reason, it is possible to further suppress the surge voltage upon reverse recovery of the diode section 80 than the semiconductor device 100 shown in FIG. 6A.

Figure 8A:
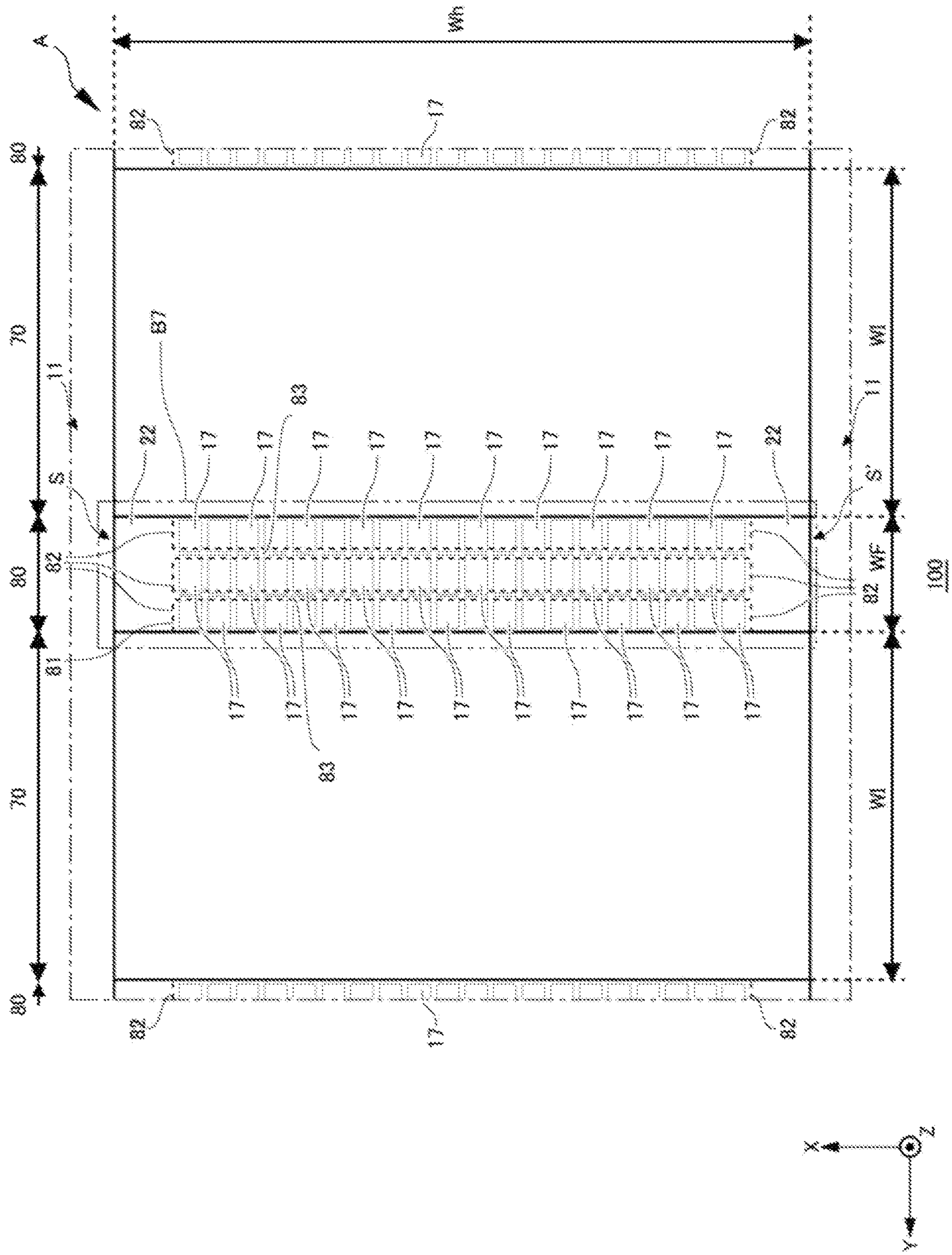
FIG. 8A is another enlarged view of the region A in FIG. 1A.

FIG. 8A is another enlarged view of the region A in FIG. 1A. In the semiconductor device 100 of the present example, as seen from above the semiconductor substrate 10, a plurality of first cathode regions 82 separated from each other extends in the X-axis direction, like the semiconductor device 100 shown in FIG. 2A. As seen from above the semiconductor substrate 10, the second cathode region 83 is provided between the first cathode regions 82 adjacent to each other in the Y-axis direction.

In the diode section 80, the first cathode region 82 provided the farthest on the positive side of the Y-axis direction in the diode section 80 may be in contact with the transistor section which is adjacent to that diode section 80 on the positive side of the Y-axis direction. The first cathode region 82 provided the farthest on the negative side of the Y-axis direction may be in contact with the transistor section which is adjacent to that diode section 80 on the negative side of the Y-axis direction.

In the semiconductor device 100 of the present example, the floating regions 17 may be provided in a lattice shape. FIG. 8A shows an example of the semiconductor device 100, in which the twenty floating regions 17 are provided in the X-axis direction and the three floating regions 17 are provided in the Y-axis direction. In the semiconductor device 100 of the present example, the number of the floating regions 17 in the Y-axis direction may be the same as the number of the first cathode regions 82 in the Y-axis direction.

In the semiconductor device 100 of the present example, the floating region 17 extends beyond the first cathode region 82 in the arrangement direction, as seen from above the semiconductor substrate 10. In the semiconductor device 100 of the present example, a central floating region 17 of the three floating regions 17 provided in the arrangement direction extends beyond the first cathode region 82, on both sides in the arrangement direction of the central floating region 17. That is, the floating region 17 is provided to overlap the entire first cathode region 82 in the arrangement direction.

A floating region 17, which is located on the negative side of the Y-axis direction, of the three floating regions 17 provided in the arrangement direction extends beyond the first cathode region 82 in the arrangement direction, on the negative side of the Y-axis direction of the floating region 17. That is, an end of the floating region 17 on the negative side of the Y-axis direction is provided farther on the negative side of the Y-axis direction than an end of the first cathode region 82 on the negative side of the Y-axis direction.

Also, a floating region 17 which is located on the positive side of the Y-axis direction, of the three floating regions 17 provided in the arrangement direction extends beyond the first cathode region 82 in the arrangement direction, on the positive side of the Y-axis direction of the floating region 17. That is, an end of the floating region 17 on the positive side of the Y-axis direction is provided farther on the positive side of the Y-axis direction than an end of the first cathode region 82 on the positive side of the Y-axis direction. In the meantime, the floating region 17 is not provided to overlap the transistor section 70.

Figure 8B:
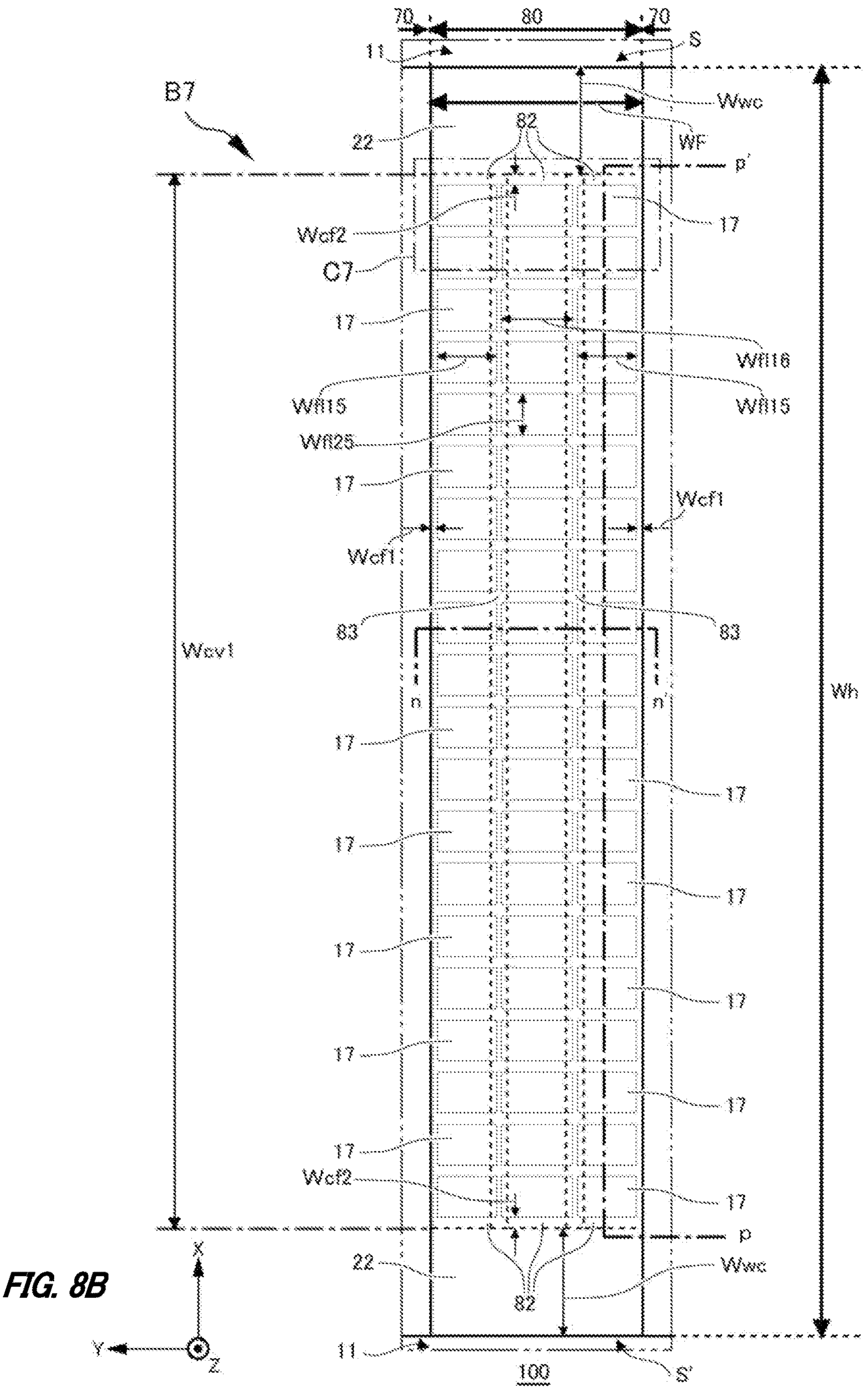
FIG. 8B is an enlarged view of a region B7 in FIG. 8A.

FIG. 8B is an enlarged view of a region B7 in FIG. 8A. FIG. 8B is an enlarged view from the end S of the well region 11 on the positive side of the X-axis direction to the end S' of the well region 11 on the negative side of the X-axis direction, in the diode section 80 of FIG. 8A. As shown in FIG. 8B, in the diode section 80 of the semiconductor device 100 of the present example, the floating region 17 provided to overlap the first cathode region 82, which is not in contact with the transistor section 70, of the plurality of first cathode regions 82 is provided to overlap the entire first cathode region 82 in the Y-axis direction.

In the semiconductor device 100 of the present example, a width Wcf1 and a width Wcf2 may be the same as the width Wcf1 and the width Wcf2 in the example of FIG. 2B, the width Wcf1 may be any value except zero. The width Wcf2 may be zero.

In the semiconductor device 100 of the present example, a width Wfl15 of each of the floating regions 17 provided the farthest on the positive and negative sides in the Y-axis direction may be greater than, smaller than or the same as the width Wfl11 in the semiconductor device 100 of the example shown in FIG. 2B. A width Wfl16 in the Y-axis direction of the floating region 17 provided at the center in the Y-axis direction may be greater than, smaller than or the same as the width Wfl11 in the semiconductor device 100 shown in FIG. 2B. Also, the width Wfl16 may be greater than the width Wfl5.

In the semiconductor device 100 of the present example, a width Wfl25 of the floating region 17 in the X-axis direction may be greater than, smaller than or the same as the width Wfl22 in the example shown in FIG. 4B. The width Wfl22 may be greater than, smaller than or the same as the width Wfl15. The width Wfl22 may be greater than, smaller than or the same as the width Wfl16.

Figure 8C:
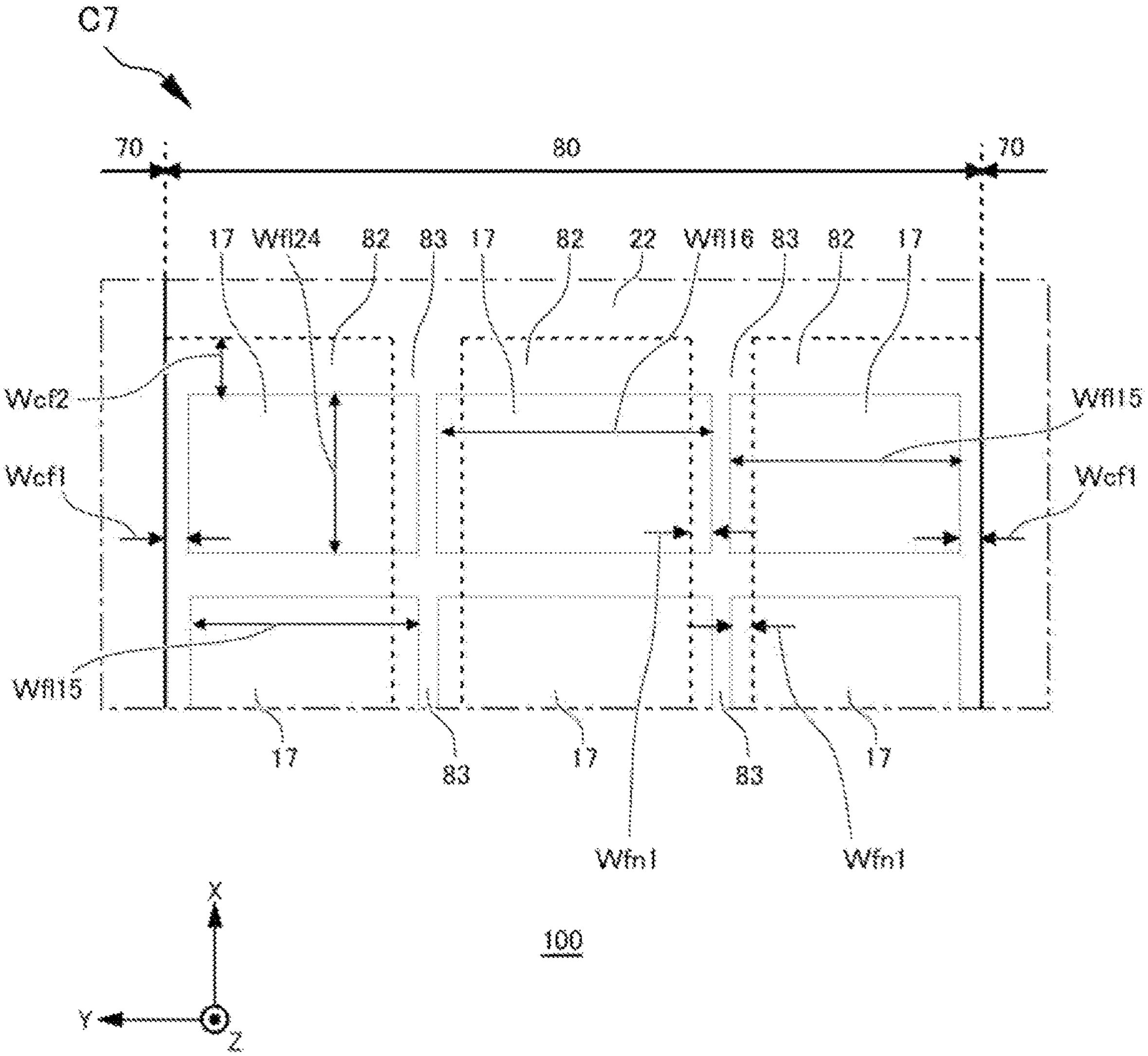
FIG. 8C is an enlarged view of a region C7 in FIG. 8B.

FIG. 8C is an enlarged view of a region C7 in FIG. 8B. As shown in FIG. 8C, in the semiconductor device 100 of the present example, as seen from above the semiconductor substrate 10, the floating region 17, which is provided to overlap the first cathode region 82 provided at the center in the Y-axis direction, of the plurality of floating regions 17 is provided to overlap the entire first cathode region 82 in the Y-axis direction.

In the semiconductor device 100 of the present example, a width Wfn1 is a width in the Y-axis direction from an end of the first cathode region 82 on the positive side of the Y-axis direction to an end of the floating region 17 provided to overlap the end and located on the positive side of the Y-axis direction. Also, the width Wfn1 is a width in the Y-axis direction from an end of the first cathode region 82 on the negative side of the Y-axis direction to an end, on the negative side of the Y-axis direction, of the floating region 17 provided to overlap the end.

The width Wfn1 may be the same as the width Wfn1 in the example of FIG. 3C. The width Wfn1 may be the same as the width Wcf1.

Figure 8D:
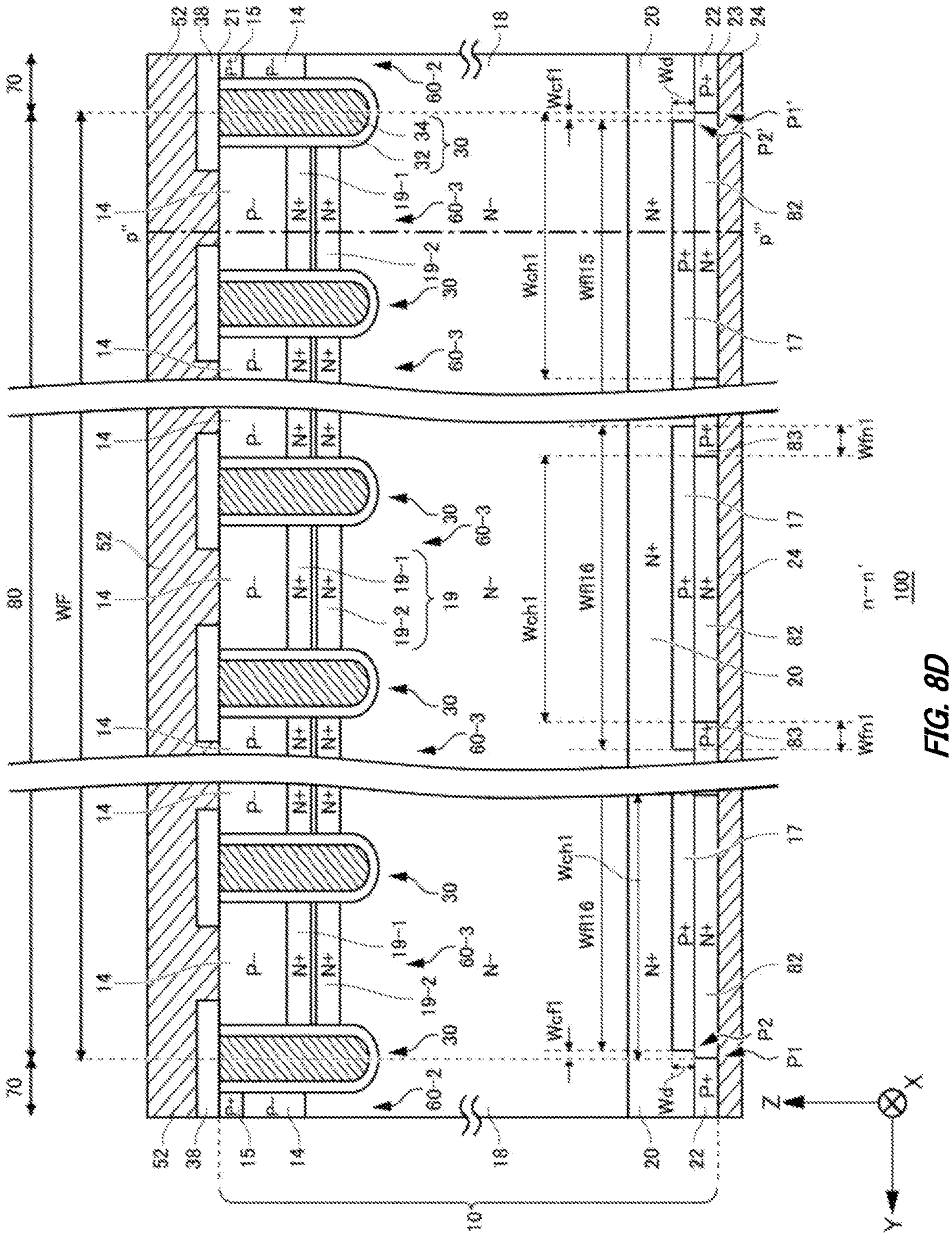
FIG. 8D shows an example of a cross-sectional view taken along a line n-n' in FIG. 8B.

FIG. 8D shows an example of a cross-sectional view taken along a line n-n' in FIG. 8B. In the semiconductor device 100 of the present example, the first cathode regions 82 alternate with the second cathode regions 83 in the Y-axis direction, on the n-n' cross-section. The floating region 17 is provided above the first cathode region 82. The floating region 17 provided above the first cathode region 82 is also provided above a part of the second cathode region 83 adjacent to the first cathode region 82 in the Y-axis direction. For this reason, the width Wfl16 is greater than the width Wch1.

The floating region 17 may be provided to be in contact with the first cathode region 82. Also, the floating region 17 may be provided to be in contact with the second cathode region 83.

In the semiconductor device 100 of the present example, the floating region 17 provided at the center in the Y-axis direction is provided to overlap the entire first cathode region 82 in the Y-axis direction. Also, the floating region 17 is provided to overlap the second cathode region 83 at both ends of the first cathode region 82 in the Y-axis direction. For this reason, it is possible to further suppress the surge voltage upon reverse recovery of the diode section 80 than the semiconductor device 100 shown in FIG. 6A.

Figure 8E:
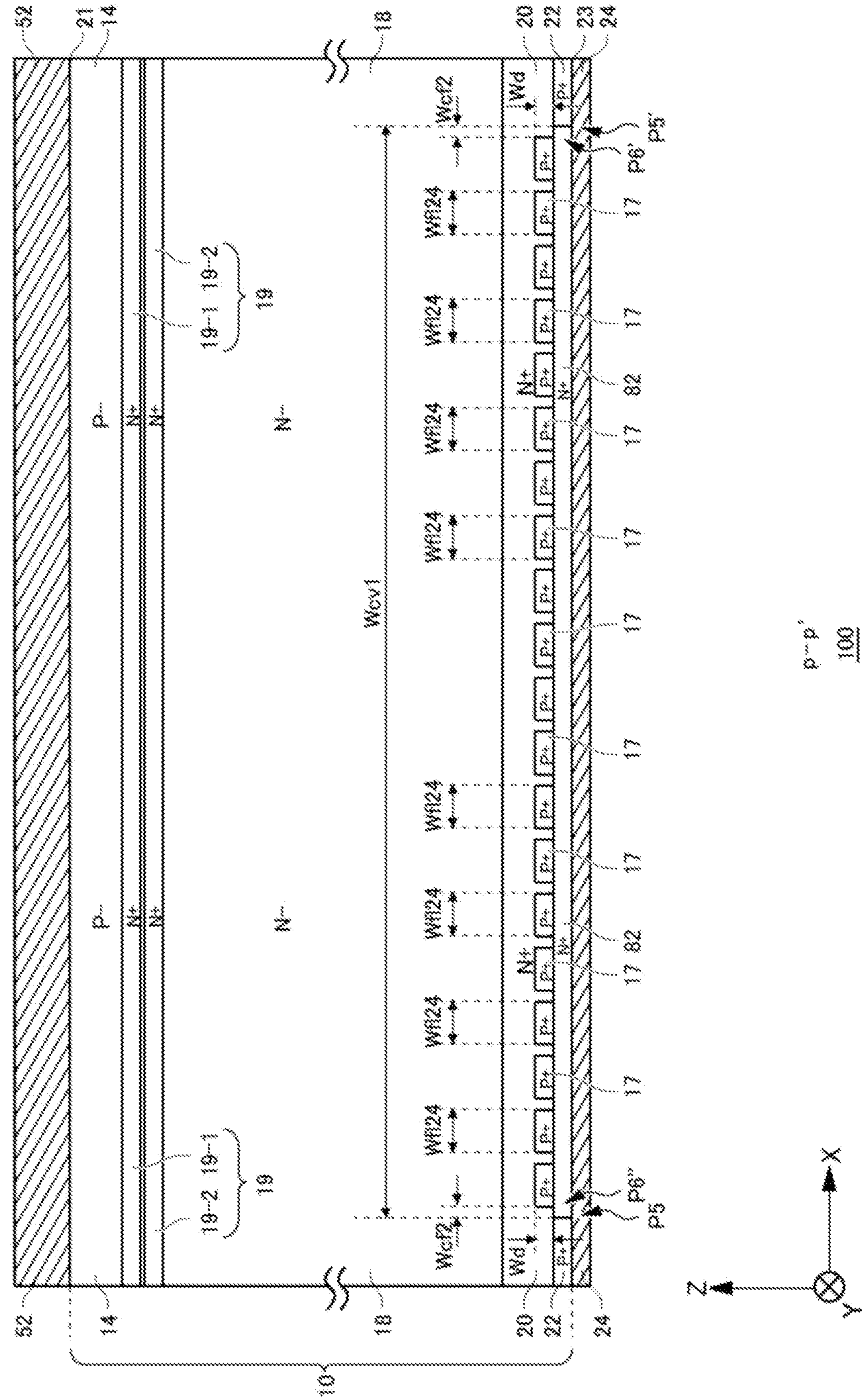
FIG. 8E shows an example of a cross-sectional view taken along a line p-p' in FIG. 8B.

FIG. 8E shows an example of a cross-sectional view taken along a line p-p' in FIG. 8B. The p-p' cross-section is the XZ plane passing a line p"-p'" in FIG. 8D. As shown in FIG. 8E, in the semiconductor device 100 of the present example, the first cathode region 82 is continuously provided from the boundary position P5 to the boundary position P5' in the Y-axis direction, on the p-p' cross-section. The floating region 17 is provided above the first cathode region 82. The floating region 17 may be provided to be in contact with the first cathode region 82.

Figure 9A:
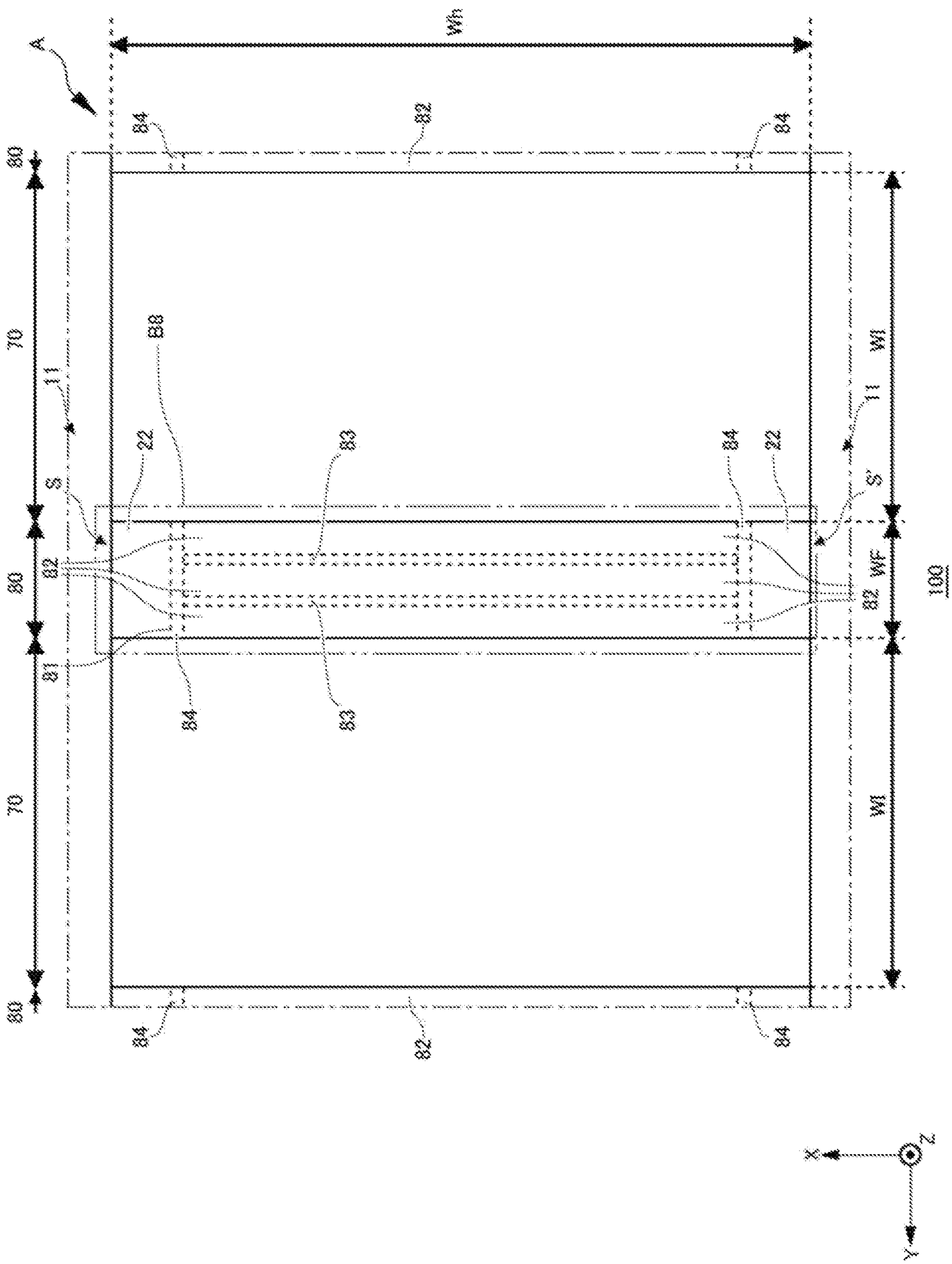
FIG. 9A is another enlarged view of the region A in FIG. 1A.

FIG. 9A is another enlarged view of the region A in FIG. 1A. In the semiconductor device 100 of the present example, third cathode regions 84 of a second conductivity-type are further provided so as to sandwich the first cathode regions 82 and the second cathode regions 83, as seen from above the semiconductor substrate 10. In the semiconductor device 100 of the present example, the third cathode regions 84 are respectively provided to be in contact with the lower surface 23 on the positive and negative sides of the X-axis direction in the cathode region 81 in. The third cathode region 84 of the present example is of, for example, P+ type.

Figure 9B:
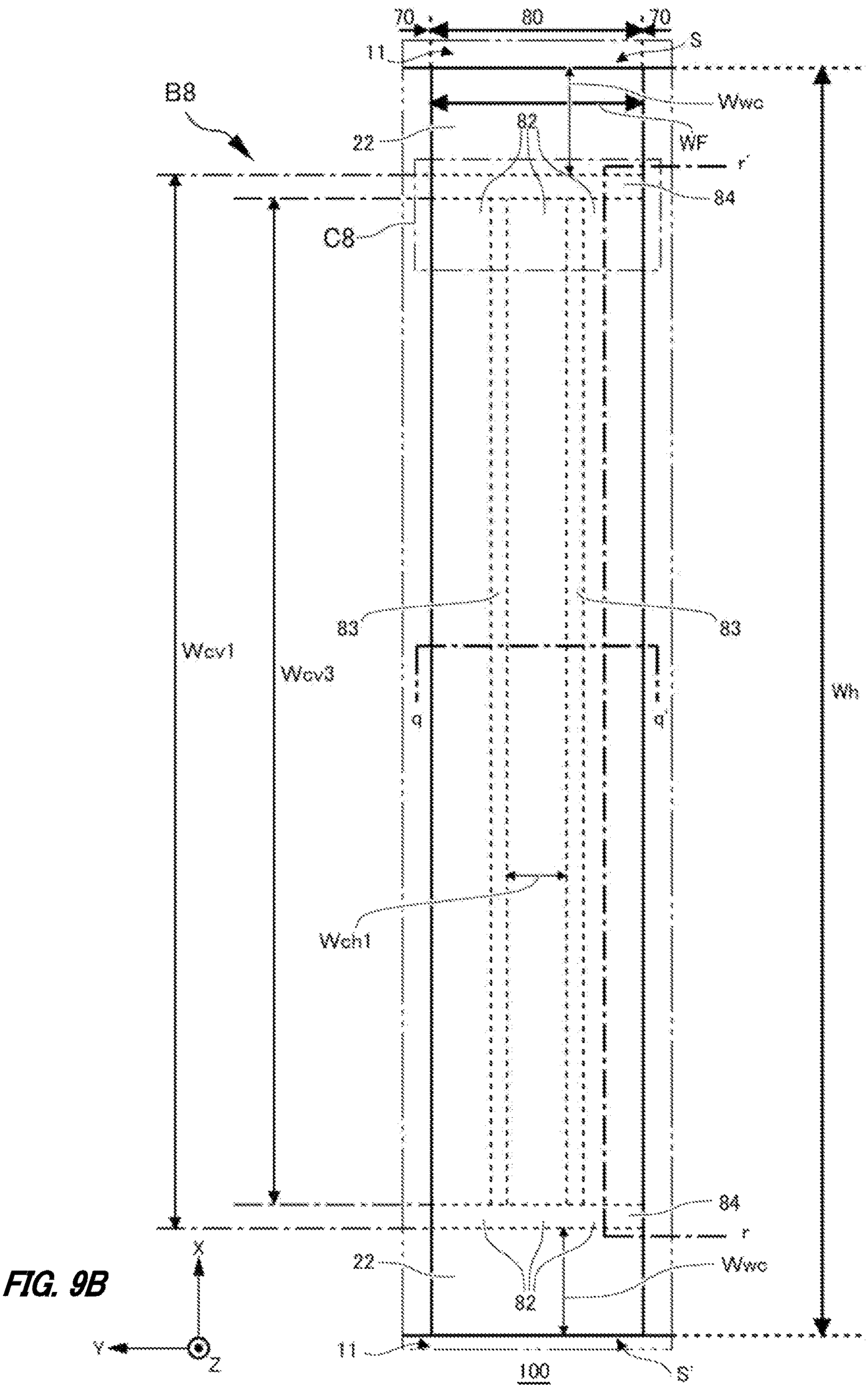
FIG. 9B is an enlarged view of a region B8 in FIG. 9A.

FIG. 9B is an enlarged view of a region B8 in FIG. 9A. FIG. 9B is an enlarged view from the end S of the well region 11 on the positive side of the X-axis direction to the end S' of the well region 11 on the negative side of the X-axis direction, in the diode section 80 of FIG. 9A. As shown in FIG. 9B, in the diode section 80 of the semiconductor device 100 of the present example, as seen from above the semiconductor substrate 10, the third cathode regions 84 are respectively provided on the positive and negative sides of the X-axis direction in the cathode region 81. As seen from above the semiconductor substrate 10, the first cathode regions 82 alternate with the second cathode regions 83 in the Y-axis direction between the third cathode regions 84 in the X-axis direction provided at both ends in the X-axis direction.

A width Wch1 may be the same as the width Wch1 in the example of FIG. 2B. A width Wcv1 may be the same as the width Wcv1 in the example of FIG. 2B.

A width Wcv3 is a width in the X-axis direction of each of the first cathode region 82 and the second cathode region 83, as seen from above the semiconductor substrate 10. The width Wcv3 may be smaller than the width Wcv1. The width Wcv3 may be 70% or greater and 90% or less of the width Wcv1.

An area ratio, expressed in percentage, of the first cathode region 82 to a total area of the first cathode region 82, the second cathode region 83 and the third cathode region 84 may be 60% or greater and 90% or less, as seen from above the semiconductor substrate 10. A ratio, expressed in percentage, of a total area of the second cathode region 83 and the third cathode region 84 to the total area may be 10% or greater and 40% or less. As an example, an area ratio, expressed in percentage, of the first cathode region 82 to the total area of the first cathode region 82, the second cathode region 83 and the third cathode region 84 is 80%. As an example, a ratio, expressed in percentage, of the total area of the second cathode region 83 and the third cathode region 84 occupying the total area of the first cathode region 82, the second cathode region 83 and the third cathode region 84 is 20%.

Figure 9C:
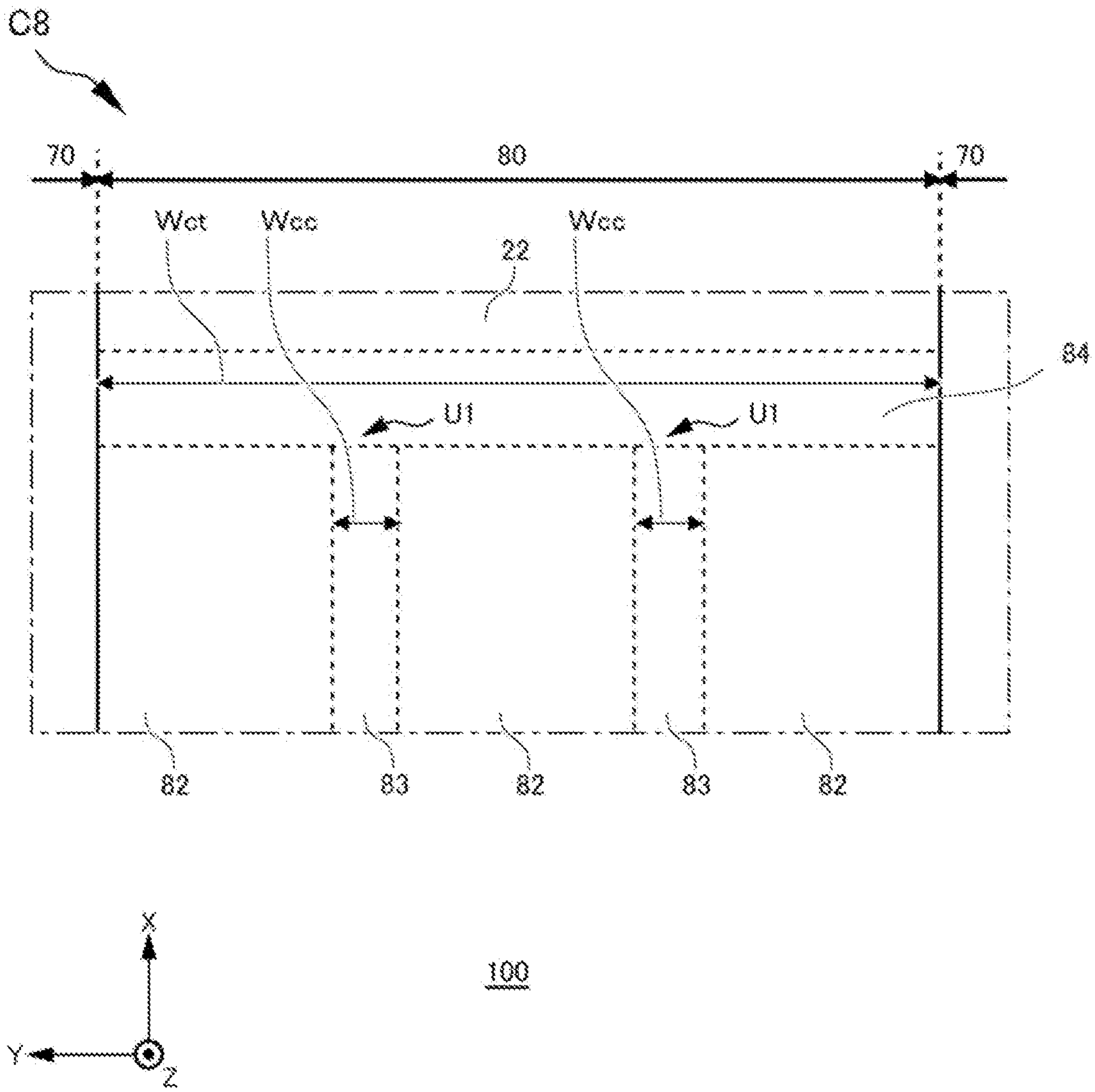
FIG. 9C is an enlarged view of a region C8 in FIG. 9B.

FIG. 9C is an enlarged view of a region C8 in FIG. 9B. As shown in FIG. 9C, the semiconductor device 100 of the present example includes the three first cathode regions 82 in the Y-axis direction, for example. The second cathode region 83 is provided between the first cathode regions 82 adjacent to each other in the Y-axis direction. Also, the third cathode region 84 is provided to be in contact with the second cathode region 83 at an end portion U1 of the second cathode region 83 on the positive side of the X-axis direction, in a direction (the X-axis direction) parallel to the boundary between the first cathode region 82 and the second cathode region 83, as seen from above the semiconductor substrate 10.

In the semiconductor device 100 of the present example, a width Wcc is a width of the second cathode region 83 in the arrangement direction of the first cathode regions 82 and the second cathode regions 83, as seen from above the semiconductor substrate 10. A width Wct is a width of the third cathode region 84 in the arrangement direction, as seen from above the semiconductor substrate 10. In the semiconductor device 100 of the present example, the width Wct is greater than the width Wcc. In the present example, the example in which the arrangement direction is the Y-axis direction has been described. However, the arrangement direction may be a direction different from the Y-axis direction.

A doping concentration in the third cathode region 84 may be the same as a doping concentration in the second cathode region 83. That is, in the region C8, the second cathode region 83 and the third cathode region 84 may be coupled as second conductivity-type cathode regions having the same doping concentration.

Figure 9D:
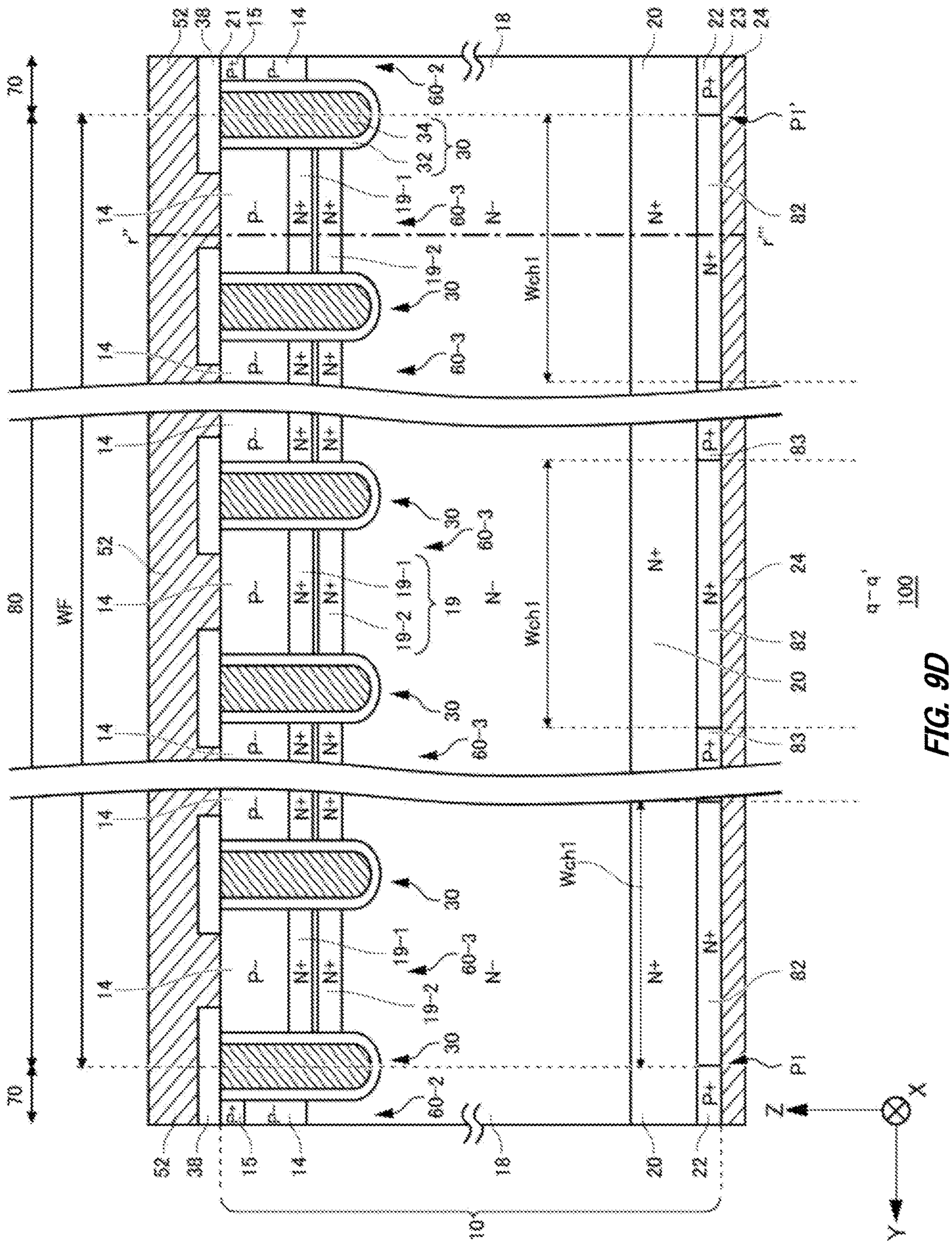
FIG. 9D shows an example of a cross-sectional view taken along a line q-q' in FIG. 9B.

FIG. 9D shows an example of a cross-sectional view taken along a line q-q' in FIG. 9B. The configuration on the q-q' cross-section of the semiconductor device 100 of the present example is the same as the configuration on the a-a' cross-section of the semiconductor device 100 shown in FIG. 2D, except the floating region 17.

Figure 9E:
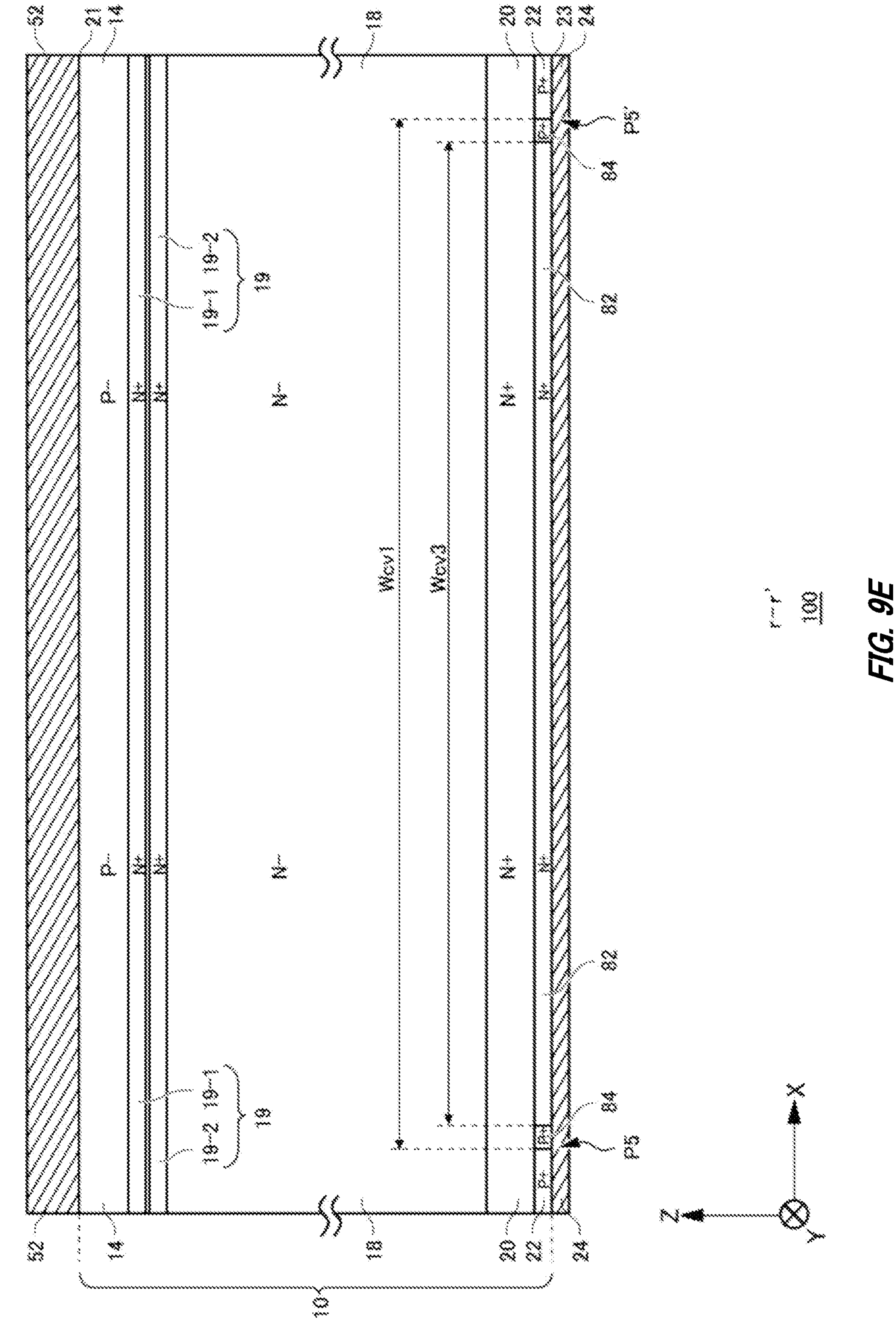
FIG. 9E shows an example of a cross-sectional view taken along a line r-r' in FIG. 9B.

FIG. 9E shows an example of a cross-sectional view taken along a line r-r' in FIG. 9B. As shown in FIG. 9E, in the semiconductor device 100 of the present example, the third cathode regions 84 are respectively provided to be in contact with the first cathode region 82 on the positive and negative sides of the X-axis direction in the first cathode region 82, on the r-r' cross-section. The third cathode region 84 on the positive side of the X-axis direction may be sandwiched in the X-axis direction between the first cathode region 82 and the collector region 22 provided on the positive side of the X-axis direction in the first cathode region 82. The third cathode region 84 on the negative side of the X-axis direction may be sandwiched in the X-axis direction between the first cathode region 82 and the collector region 22 provided on the negative side of the X-axis direction in the first cathode region 82.

In the semiconductor device 100 of the present example, the third cathode region 84 is provided to be in contact with the second cathode region 83 at an end portion U1 of the second cathode region 83 on the positive side of the X-axis direction, in a direction (the X-axis direction) parallel to the boundary between the first cathode region 82 and the second cathode region 83. For this reason, it is possible to suppress the surge voltage upon reverse recovery of the diode section 80.

Figure 10A:
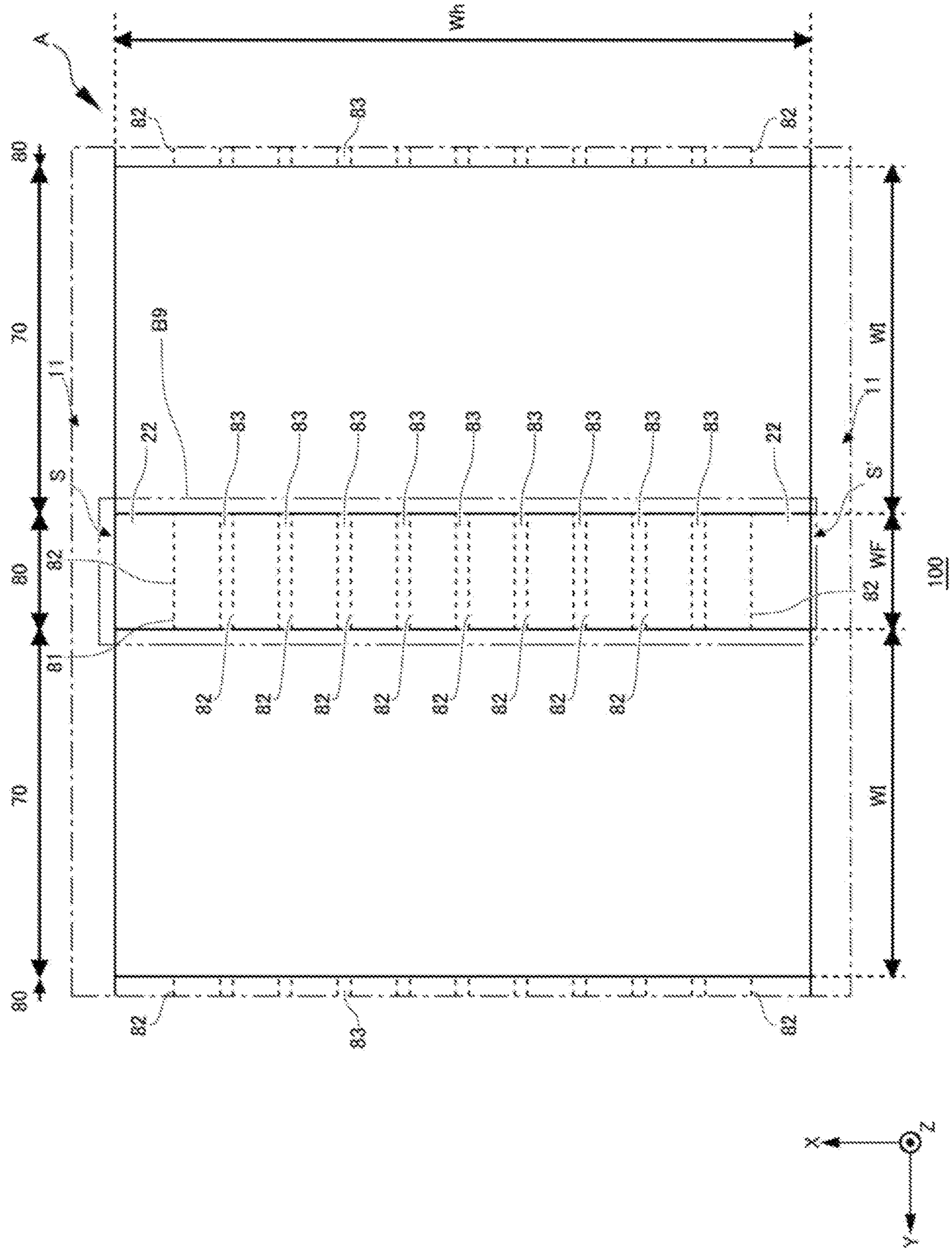
FIG. 10A is another enlarged view of the region A in FIG. 1A.

FIG. 10A is another enlarged view of the region A in FIG. 1A. The semiconductor device 100 of the present example is different from the semiconductor device 100 shown in FIG. 4A, in that the floating region 17 is not provided on the inner side of the first cathode region 82 in the semiconductor device 100 shown in FIG. 4A, as seen from above the semiconductor substrate 10.

Figure 10B:
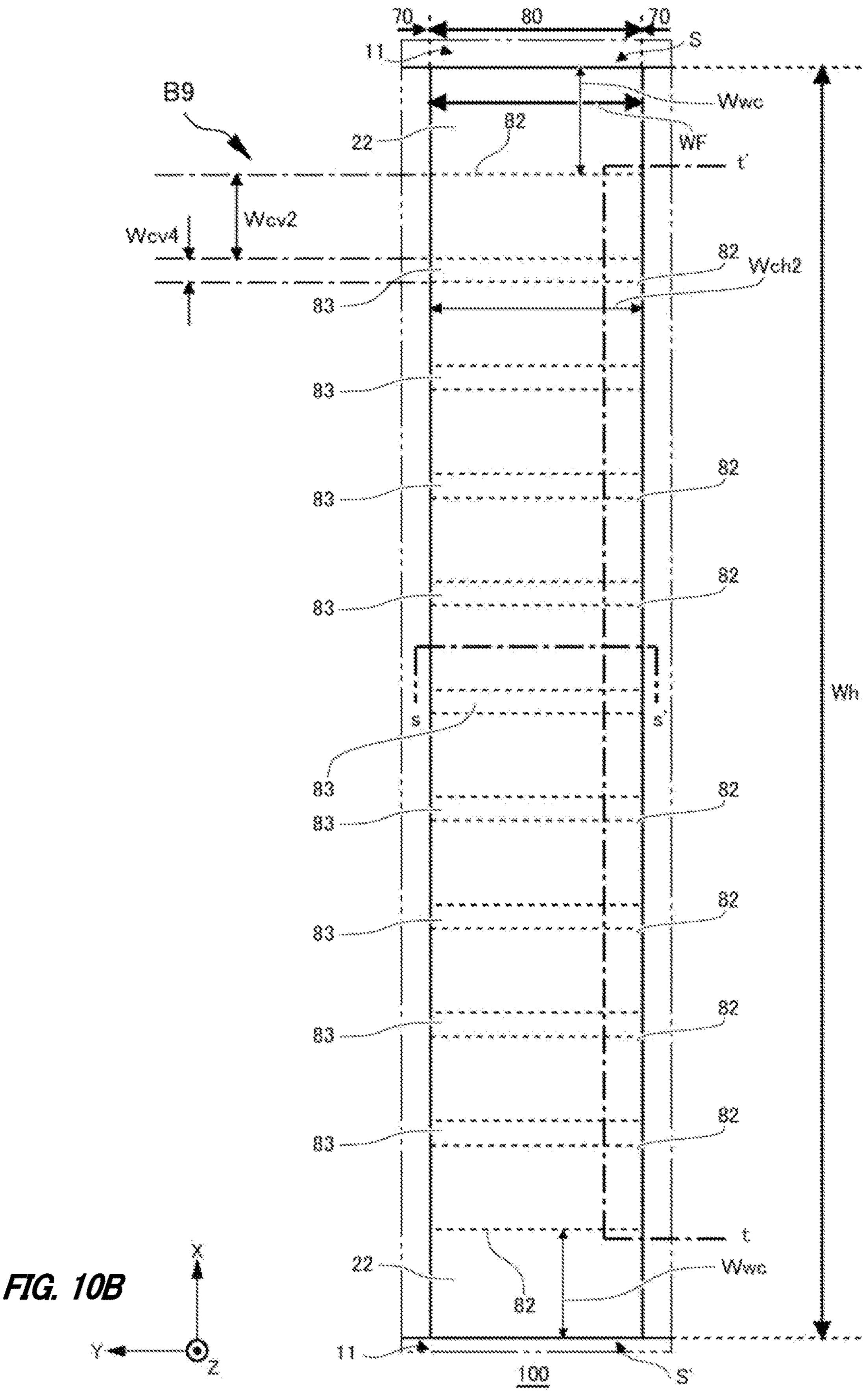
FIG. 10B is an enlarged view of a region B9 in FIG. 10A.

FIG. 10B is an enlarged view of a region B9 in FIG. 10A. FIG. 10B is an enlarged view from the end S of the well region 11 on the positive side of the X-axis direction to the end S' of the well region 11 on the negative side of the X-axis direction, in the diode section 80 of FIG. 10A. As shown in FIG. 10B, in the diode section 80 of the semiconductor device 100 of the present example, the first cathode regions 82 alternate with the second cathode regions 83 in the X-axis direction. In the diode section 80 of the semiconductor device 100 of the present example, the ten first cathode regions 82 are provided in the X-axis direction, and the nine second cathode regions 83 are provided in the X-axis direction.

A width Wch2 may be the same as the width Wch2 in the example of FIG. 4B. A width Wcv2 may be the same as the width Wcv2 in the example of FIG. 4B.

A width Wcv4 is a width of the second cathode region 83 in the X-axis direction, as seen from above the semiconductor substrate 10. The width Wcv4 may be 5% or greater and 30% or less of the width Wcv2.

As seen from above the semiconductor substrate 10, an area ratio, expressed in percentage, of the first cathode region 82 to a total area of the first cathode region 82 and the second cathode region 83 may be 60% or greater and 90% or less. An area ratio, expressed in percentage, of the second cathode region 83 to the total area may be 10% or greater and 40% or less. As an example, an area ratio, expressed in percentage, of the first cathode region 82 to the total area of the first cathode region 82 and the second cathode region 83 is 80%. As an example, the area ratio of the second cathode region 83 to the total area of the first cathode region 82 and the second cathode region 83 is 20%.

Figure 10C:
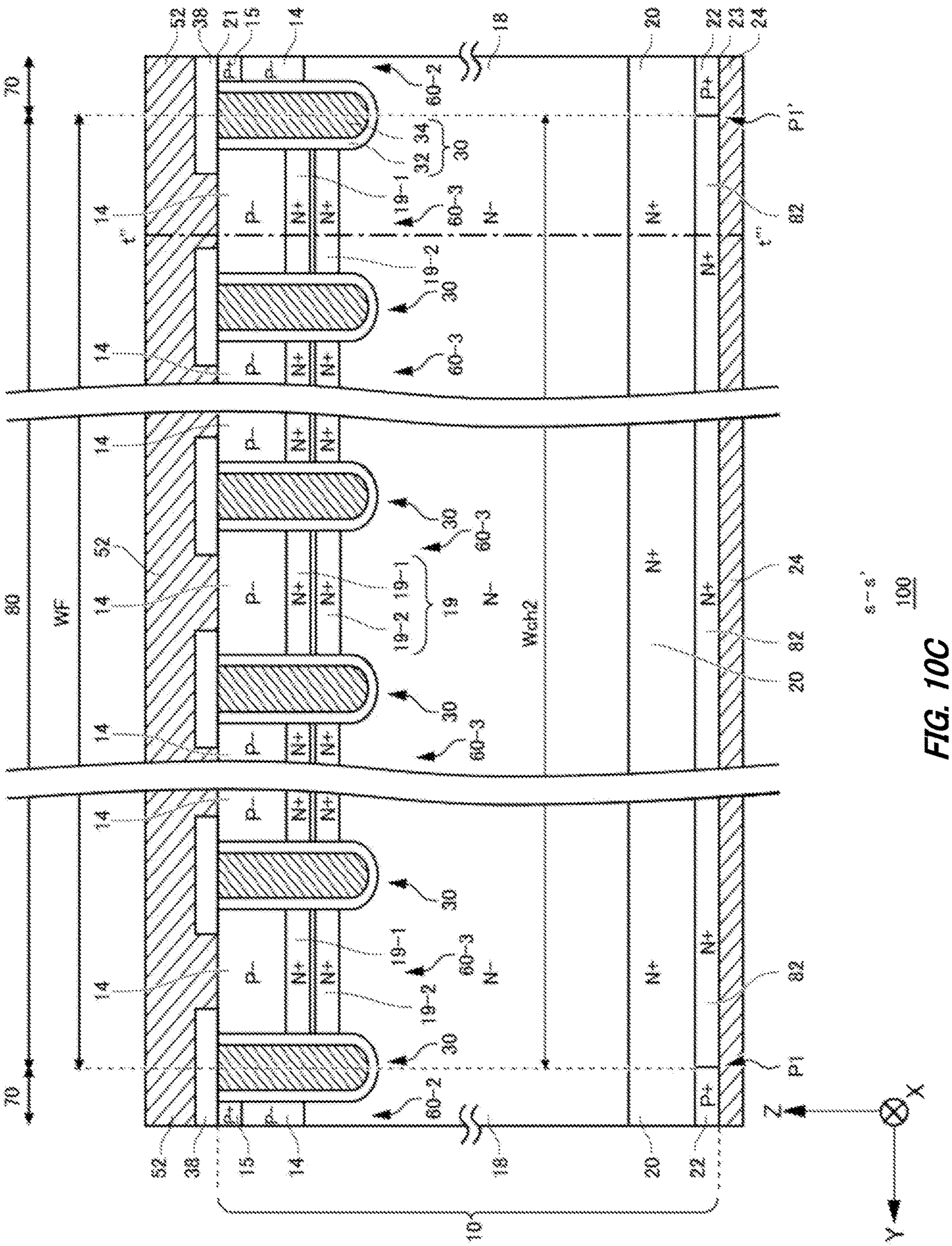
FIG. 10C shows an example of a cross-sectional view taken along a line s-s' in FIG. 10B.

FIG. 10C shows an example of a cross-sectional view taken along a line s-s' in FIG. 10B. The configuration on the s-s' cross-section of the semiconductor device 100 of the present example is the same as the configuration on the e-e' cross-section of the semiconductor device 100 shown in FIG. 4C, except the floating region 17.

Figure 10D:
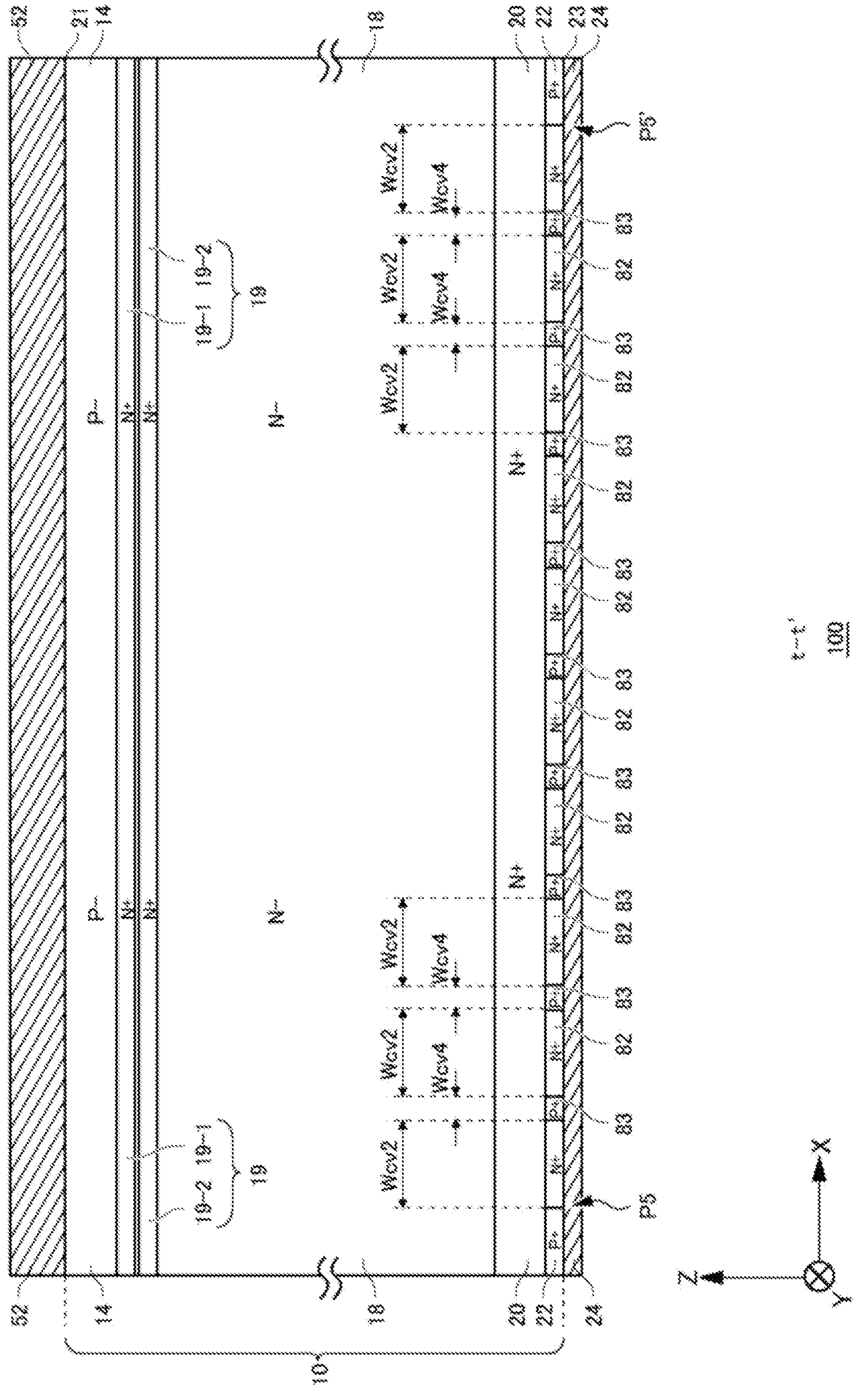
FIG. 10D shows an example of a cross-sectional view taken along a line t-t' in FIG. 10B.

FIG. 10D shows an example of a cross-sectional view taken along a line t-t' in FIG. 10B. The semiconductor device 100 of the present example includes the first cathode regions 82 and the second cathode regions 83 in contact with the lower surface 23, on the t-t' cross-section. The first cathode regions 82 alternate with the second cathode regions 83 in the X-axis direction. For this reason, the semiconductor device 100 of the present example can suppress the surge voltage upon reverse recovery of the diode section 80.

Figure 11A:
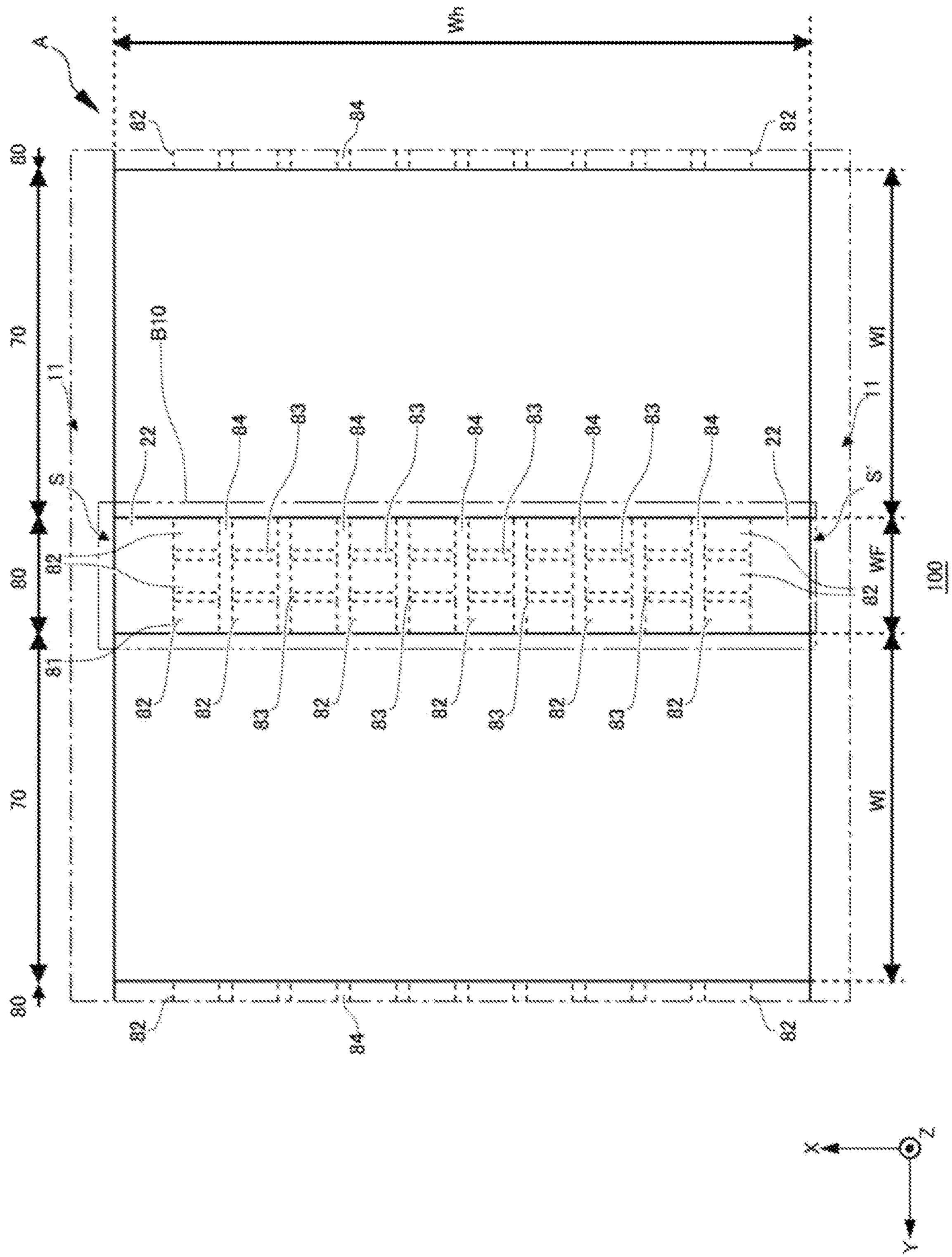
FIG. 11A is another enlarged view of the region A in FIG. 1A.

FIG. 11A is another enlarged view of the region A in FIG. 1A. The semiconductor device 100 of the present example is different from the semiconductor device 100 shown in FIG. 6A, in that the floating regions 17 are not provided on the inner sides of the first cathode regions 82 provided in the lattice shape in the semiconductor device 100 shown in FIG. 6A, as seen from above the semiconductor substrate 10.

Figure 11B:
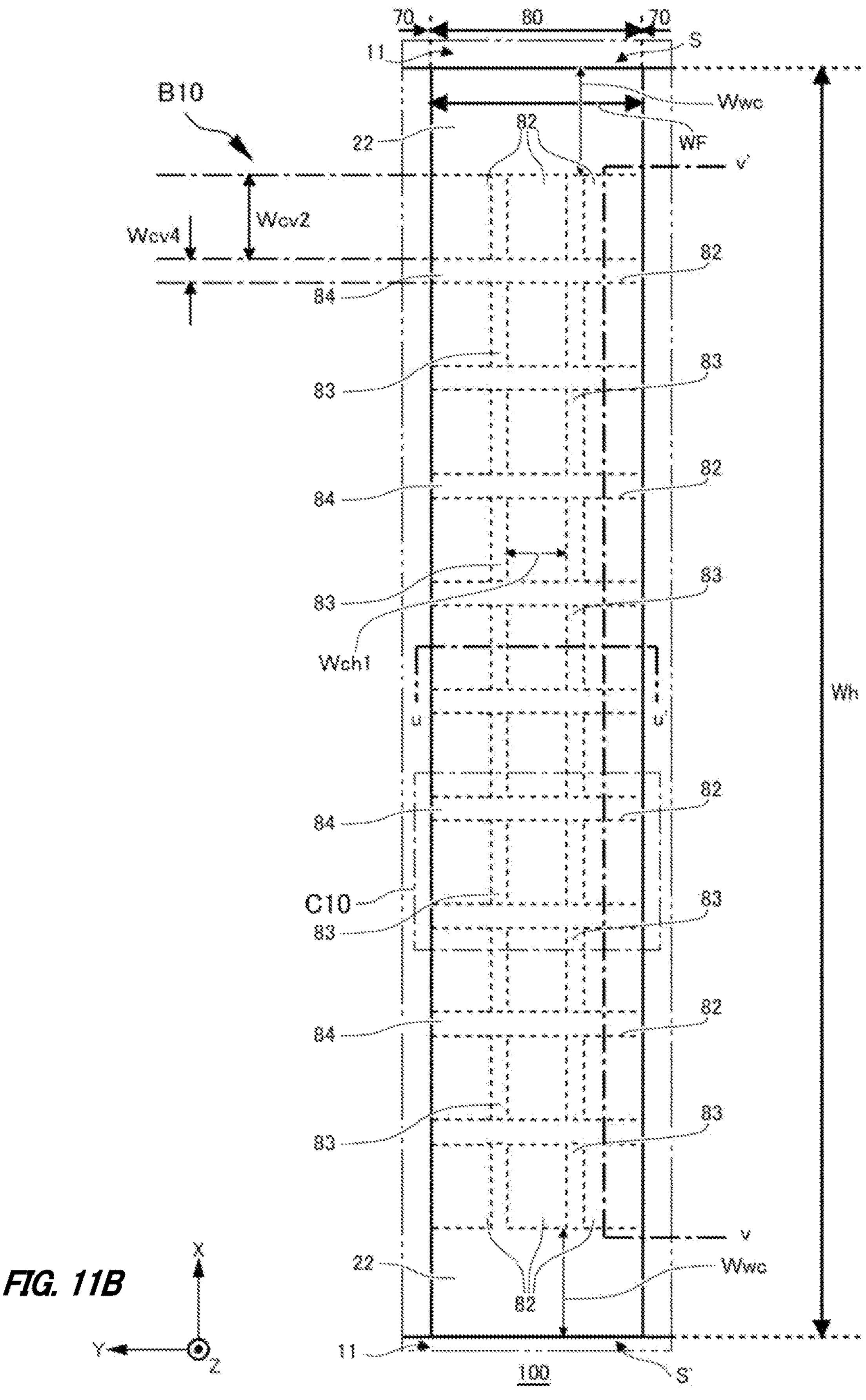
FIG. 11B is an enlarged view of a region B10 in FIG. 11A.

FIG. 11B is an enlarged view of a region B10 in FIG. 11A. FIG. 11B is an enlarged view from the end S of the well region 11 on the positive side of the X-axis direction to the end S' of the well region 11 on the negative side of the X-axis direction, in the diode section 80 of FIG. 11A. As shown in FIG. 11B, in the diode section 80 of the semiconductor device 100 of the present example, the ten first cathode regions 82 are provided in the X-axis direction and the three first cathode regions 82 are provided in the Y-axis direction.

A width Wch1 may be the same as the width Wch1 in the example of FIG. 2B. A width Wcv2 may be the same as the width Wcv2 in the example of FIG. 4B. A width Wcv4 may be the same as the width Wcv4 in the example of FIG. 10B.

As seen from above the semiconductor substrate 10, an area ratio, expressed in percentage, of the first cathode region 82 to a total area of the first cathode region 82, the second cathode region 83 and the third cathode region 84 may be 60% or greater and 90% or less. A ratio, expressed in percentage, of a total area of the second cathode region 83 and the third cathode region 84 to the total area may be 10% or greater and 40% or less. As an example, an area ratio, expressed in percentage, of the first cathode region 82 to the total area of the first cathode region 82, the second cathode region 83 and the third cathode region 84 is 80%. As an example, the ratio of the total area of the second cathode region 83 and the third cathode region 84 to the total area of the first cathode region 82, the second cathode region 83 and the third cathode region 84 is 20%.

Figure 11C:
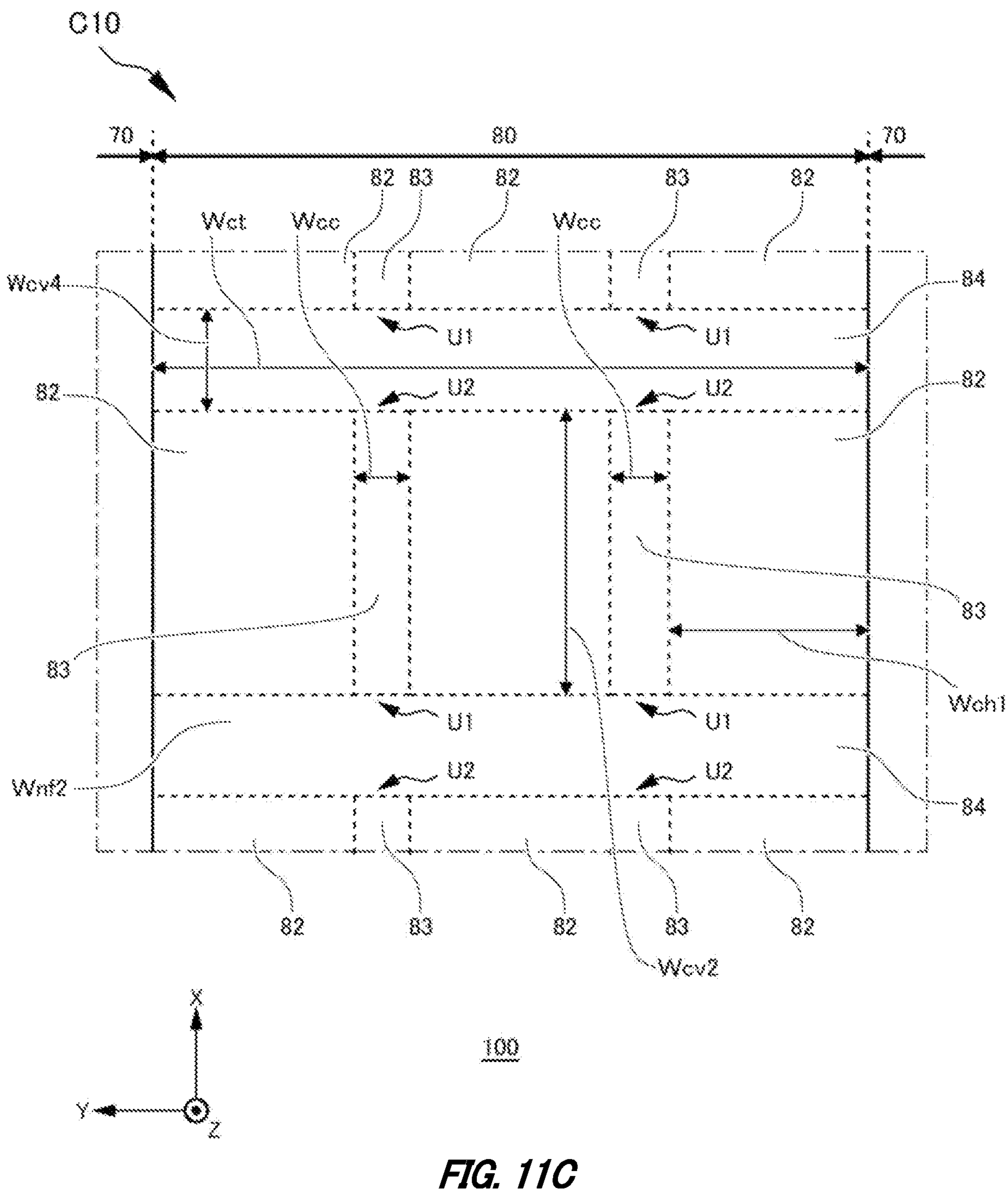
FIG. 11C is an enlarged view of a region C10 in FIG. 11B.

FIG. 11C is an enlarged view of a region C10 in FIG. 11B. As shown in FIG. 11C, in the semiconductor device 100 of the present example, the third cathode regions 84 are provided so as to sandwich the first cathode region 82 and the second cathode region 83, as seen from above the semiconductor substrate 10. That is, as seen from above the semiconductor substrate 10, the third cathode regions 84 are provided to be in contact with the second cathode regions 83 at end portions U1 of the second cathode regions 83 on the positive side of the X-axis direction, in a direction (the X-axis direction, in the present example) in which the third cathode regions 84 sandwich the first cathode region 82 and the second cathode region 83. Also, the third cathode regions 84 are provided to be in contact with the second cathode regions 83 at end portions U2 of the second cathode regions 83 on the negative side of the X-axis direction.

As shown in FIG. 11C, the third cathode region 84 may be provided to be in contact with each of the two end portions of the second cathode region 83. That is, the third cathode region 84 may be provided to be in contact with each of one end portion U1 and the other end portion U2 of the second cathode region 83.

Also, the plurality of second cathode regions 83 and the plurality of third cathode regions 84 may be in contact with each other, as seen from above the semiconductor substrate 10. That is, as shown in FIG. 11C, each of the plurality of third cathode regions 84 may be provided to be in contact with an end portion of each of the plurality of second cathode regions 83. That is, in the region C10, the third cathode region 84 may be provided to be in contact with both the end portion U1 of the second cathode region 83 on the negative side of the Y-axis direction and the end portion U1 of the second cathode region 83 on the positive side of the Y-axis direction. Also, the third cathode region 84 may be provided to be in contact with both an end portion U2 of the second cathode region 83 arranged to be adjacent, on the positive side of the X-axis direction, to the second cathode region 83 provided on the positive side of the Y-axis direction, and an end portion U2 of the second cathode region 83 arranged to be adjacent, on the positive side of the X-axis direction, to the second cathode region 83 provided on the negative side of the Y-axis direction.

As seen from above the semiconductor substrate 10, a width of the second cathode region 83 in the direction (the X-axis direction, the present example), in which the third cathode regions 84 sandwich the first cathode region 82 and the second cathode region 83, may be the same as the width Wcv2. The width Wcv2 may be greater than the width Wcc. That is, the second cathode region 83 may have a rectangular shape that is long in the X-axis direction.

As seen from above the semiconductor substrate 10, a width of the first cathode region 82 in the arrangement direction (the Y-axis direction, the present example) of the first cathode regions 82 and the second cathode regions 83 may be the same as the width Wch1. The width Wcv2 may be greater than the width Wch1.

The width Wcc may be smaller than the width Wch1. The width Wct may be greater than the width Wch1. The width Wct may be the same as the width WF of the diode section 80 in the Y-axis direction.

The doping concentration in the third cathode region 84 may be the same as the doping concentration in the second cathode region 83. That is, in the region C10, the second cathode region 83 and the third cathode region 84 may be coupled as second conductivity-type cathode regions having the same doping concentration.

Also, as seen from above the semiconductor substrate 10 (FIGS. 11A and 11B), the doping concentrations of all of the second cathode regions 83 and the third cathode regions 84 may be the same in one diode section 80. Also, all of the second cathode regions 83 and the third cathode regions 84 in one diode section 80 may be coupled as second conductivity-type cathode regions having the same doping concentration. In other words, all of the second cathode regions 83 and the third cathode regions 84 in one diode section 80 may be integrally formed as second conductivity-type cathode regions having the same doping concentration.

Figure 11D:
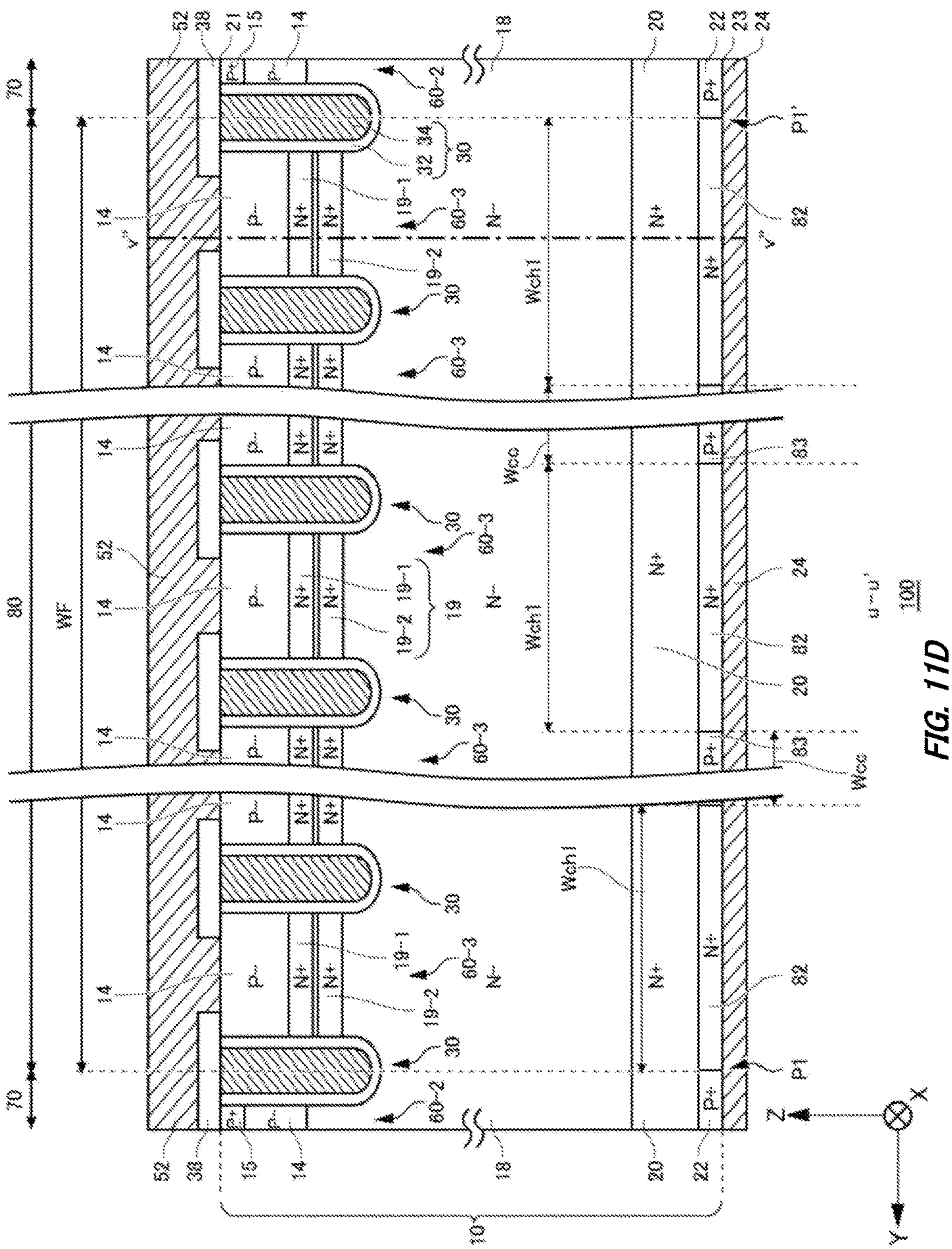
FIG. 11D shows an example of a cross-sectional view taken along a line u-u' in FIG. 11B.

FIG. 11D shows an example of a cross-sectional view taken along a line u-u' in FIG. 11B. The configuration on the u-u' cross-section of the semiconductor device 100 of the present example is the same as the configuration on the q-q' cross-section of the semiconductor device 100 shown in FIG. 9D.

Figure 11E:
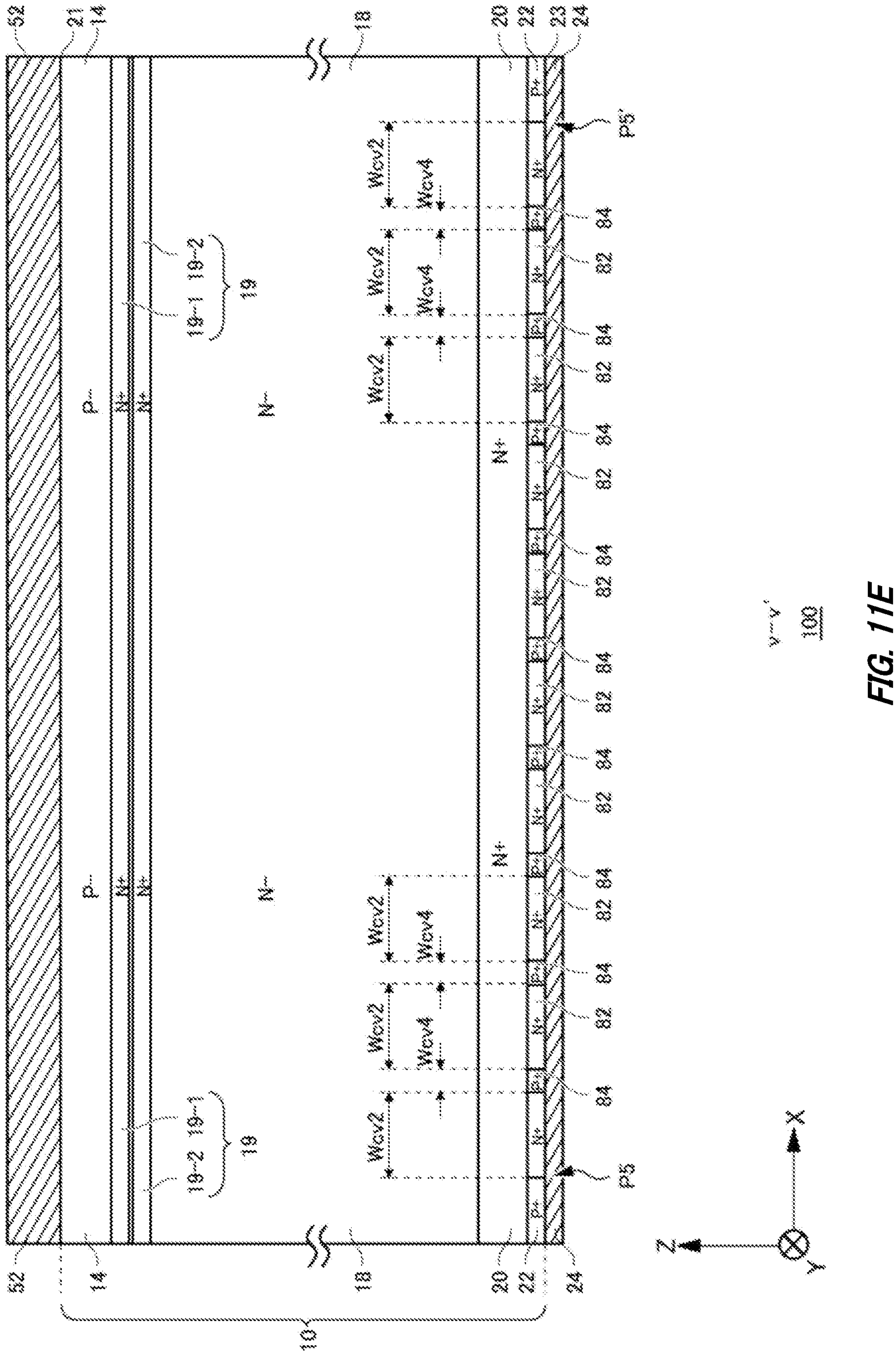
FIG. 11E shows an example of a cross-sectional view taken along a line v-v' in FIG. 11B.

FIG. 11E shows an example of a cross-sectional view taken along a line v-v' in FIG. 11B. The v-v' cross-section is the XZ plane passing a line v''-v''' in FIG. 11D. The semiconductor device 100 of the present example includes the first cathode regions 82 and the third cathode regions 84 in contact with the lower surface 23, on the v-v' cross-section. The first cathode regions 82 alternate with the third cathode regions 84 in the X-axis direction.

In the semiconductor device 100 of the present example, the third cathode region 84 is provided to be in contact with each of one end portion U1 and the other end portion U2 of the second cathode region 83. Also, the third cathode regions 84 are provided to be in contact with an end portion of the plurality of respective second cathode regions 83. For this reason, it is possible to suppress the surge voltage upon reverse recovery of the diode section 80.

Figure 12A:
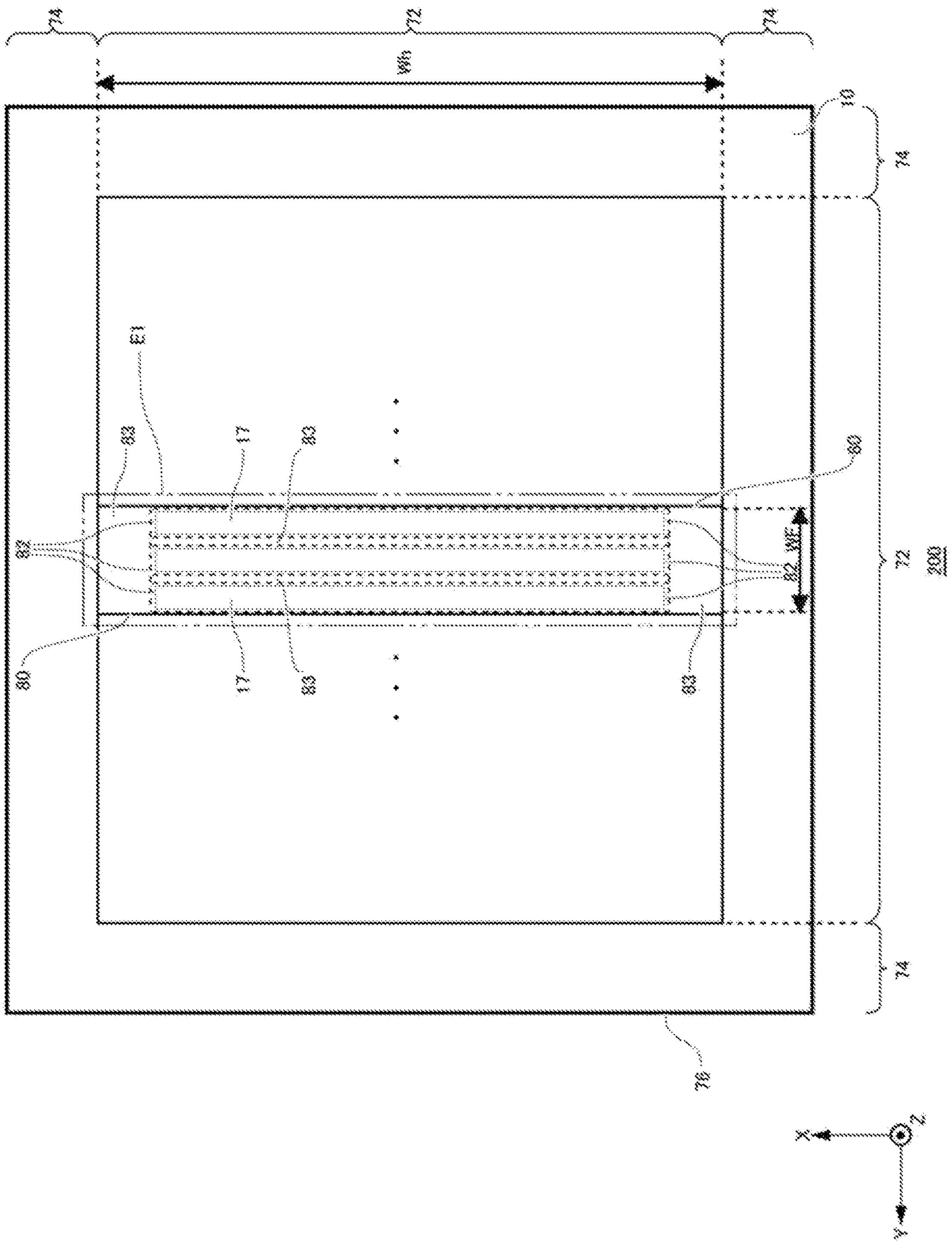
FIG. 12A shows an example of an upper surface of a semiconductor device 200 in accordance with the present embodiment.

FIG. 12A shows an example of an upper surface of a semiconductor device 200 in accordance with the present embodiment. The semiconductor device 200 is a diode such as an FWD. The semiconductor substrate 10 is provided with an active section 72 and an outer periphery region 74, which are similar to those of the semiconductor device 100. However, the active section 72 of the present example may be provided with the diode section 80 and may not be provided with the transistor section 70.

In the active section 72, a plurality of diode sections 80 may be provided in the Y-axis direction. The diode section 80 includes first cathode regions 82 and second cathode regions 83.

In the semiconductor device 200 of the present example, the first cathode region 82 is of a first conductivity-type. The first cathode region of the present example is of, for example, N+ type. The second cathode region 83 has a conductivity type different from that of the first cathode region 82. The second cathode region 83 of the present example is of, for example, P+ type.

A width Wh is a width of the semiconductor device 200 in the X-axis direction, as seen from above the semiconductor substrate 10. A width WF is a width of the semiconductor device 200 in the Y-axis direction, as seen from above the semiconductor substrate 10. In FIG. 12A, the configurations except the first cathode region 82 and the second cathode region 83, i.e., the configurations of the dummy trench part 30 and the like are not shown.

The semiconductor device 200 of the present example includes a plurality of floating regions 17 provided to be separated from each other and distributed among all the first cathode regions 82 as seen from above the semiconductor. The floating region 17 is of a second conductivity-type. The floating region 17 of the present example is of, for example, P+ type.

The floating region 17 is arranged to at least partially overlap the first cathode region 82, as seen from above the semiconductor substrate 10. FIG. 12A shows an example in which the entire floating region 17 is arranged to overlap the first cathode region 82, as seen from above the semiconductor substrate 10.

In the semiconductor device 200 of the present example, the first cathode region 82 extends beyond the floating region 17 in the Y-axis direction, as seen from above the semiconductor substrate 10. In the semiconductor device 200 of the present example, both sides of the first cathode region 82 extend beyond the floating region 17 in the Y-axis direction, as seen from above the semiconductor substrate 10. That is, the first cathode region 82 has parts, which are not covered by the floating region 17, on both sides of the floating region 17 in the Y-axis direction.

Also, in the semiconductor device 200 of the present example, the first cathode region 82 extends beyond the floating region 17 in the X-axis direction. In the semiconductor device 200 of the present example, both sides of the first cathode region 82 in the X-axis direction extend beyond the floating region 17, as seen from above the semiconductor substrate 10. That is, the first cathode region 82 has parts, which are not covered by the floating region 17, on both sides of the floating region 17 in the X-axis direction.

In the semiconductor device 200 of the present example, as seen from above the semiconductor substrate 10, the entire floating region 17 is arranged to overlap the first cathode region 82. That is, in the semiconductor device 200 of the present example, as seen from above the semiconductor substrate 10, the floating region 17 is provided on an inner side of the first cathode region 82. The floating regions 17 are provided to be separated from each other and distributed to all the first cathode regions 82. In the meantime, at least a part of the floating region 17 may be arranged to overlap the first cathode region 82.

Figure 12B:
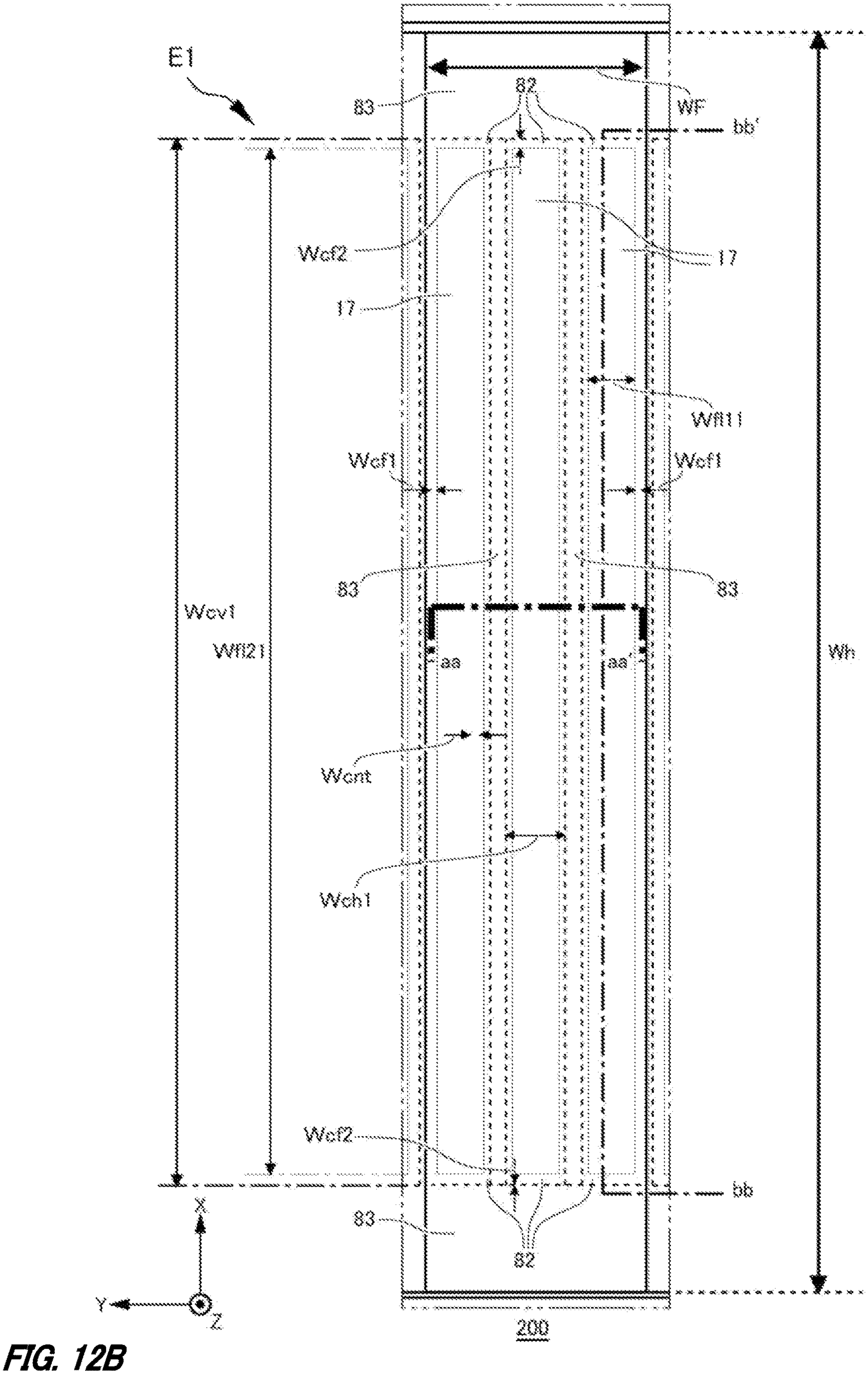
FIG. 12B is an enlarged view of a region E1 in FIG. 12A.

FIG. 12B is an enlarged view of a region E1 in FIG. 12A. As shown in FIG. 12B, in the semiconductor device 200 of the present example, the floating region 17 is provided on the inner side of the first cathode region 82, as seen from above the semiconductor substrate 10. The floating regions 17 are provided to be separated from each other and distributed to all the first cathode regions 82, and arranged to at least partially overlap the first cathode regions 82. The present example is an example in which the entire floating region 17 is arranged to overlap the first cathode region 82, as seen from above the semiconductor substrate 10. The floating region 17 may be provided to be in contact with the first cathode region 82.

Figure 12C:
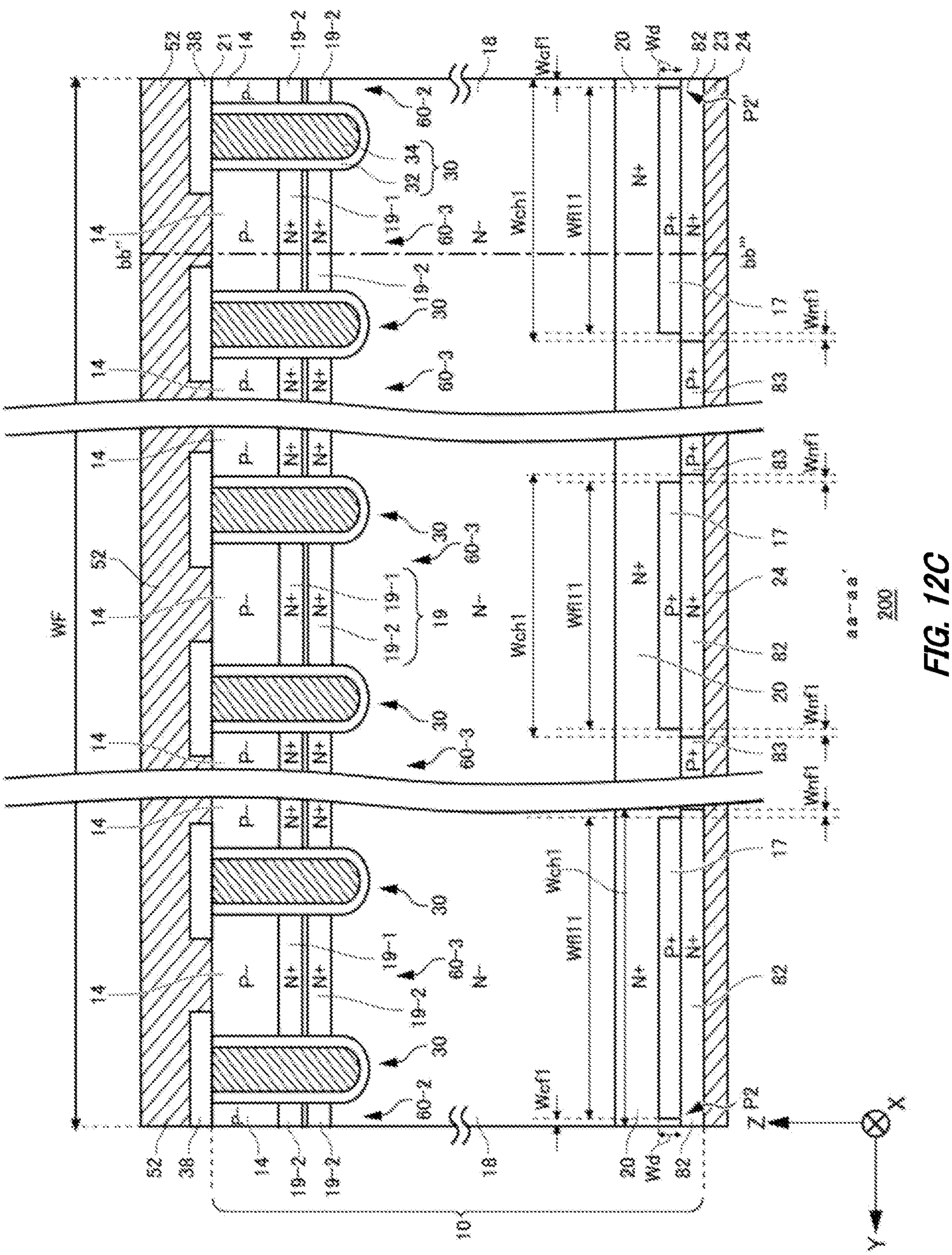
FIG. 12C shows an example of a cross-sectional view taken along a line aa-aa' in FIG. 12B.

FIG. 12C shows an example of a cross-sectional view taken along a line aa-aa' in FIG. 12B. The semiconductor device 200 of the present example includes a semiconductor substrate 10, an interlayer dielectric film 38, an emitter electrode 52 and a collector electrode 24, in the aa-aa' cross section. The emitter electrode 52 is provided on an upper surface 21 and an upper surface of the interlayer dielectric film 38. The collector electrode 24 is provided on a lower surface 23.

The semiconductor device 200 of the present example includes first conductivity-type drift regions 18 provided in the semiconductor substrate 10. Also, the semiconductor device 200 of the present example includes second conductivity-type base regions 14 being in contact with the upper surface 21 and provided above the drift regions 18. Also, the semiconductor device 200 of the present example includes a plurality of first cathode regions 82 of a first conductivity-type separated from each other and a plurality of second cathode regions 83 separated from each other, the first cathode regions and the second cathode regions being in contact with the lower surface 23 and provided below the drift regions 18. The semiconductor device 200 may not be provided with the high-concentration regions 19. Also, in a case in which the semiconductor device 200 is not provided with the high-concentration region 19, the semiconductor device 200 may not be provided with the dummy trench parts 30.

Figure 12D:
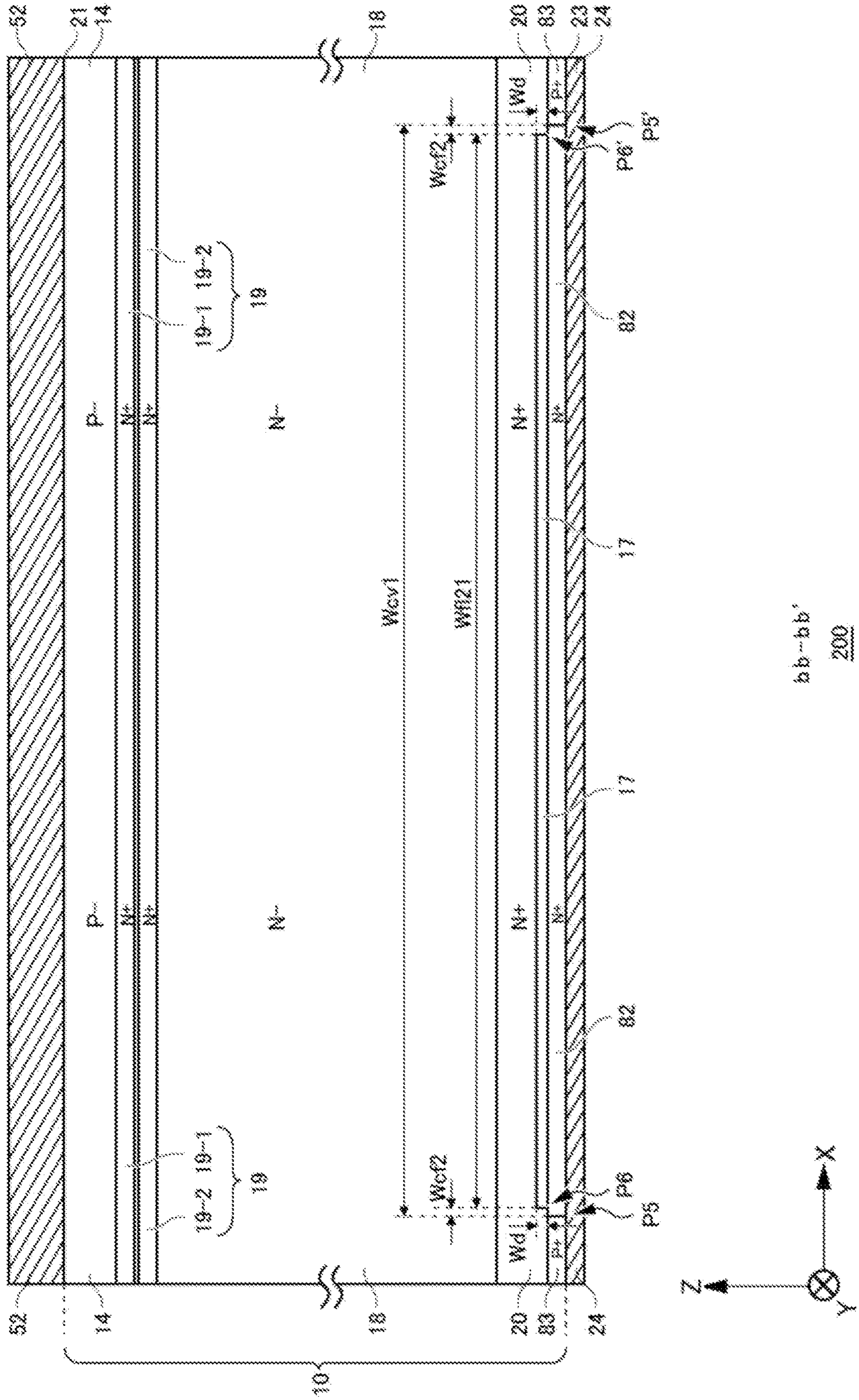
FIG. 12D shows an example of a cross-sectional view taken along a line bb-bb' in FIG. 12B.

FIG. 12D shows an example of a cross-sectional view taken along a line bb-bb' in FIG. 12B. The bb-bb' cross-section is the XZ plane passing a line bb''-bb''' in FIG. 12C. In the semiconductor device 200 of the present example, the floating region 17 is continuously provided from the end position P6 to the end position P6' in the X-axis direction above the first cathode region 82, on the bb-bb' cross-section. The floating region 17 may be provided to be in contact with the first cathode region 82.

In the meantime, the second cathode region 83 on the positive side of the X-axis direction in FIG. 12D may extend to the outer periphery region 74 on the positive side of the X-axis direction in FIG. 12A. Also, the second cathode region 83 on the negative side of the X-axis direction may extend to the outer periphery region 74 on the negative side of the X-axis direction in FIG. 12A. Below the outer periphery region 74, the lower surface 23 may be provided with a first conductivity-type termination region of which a doping concentration is smaller than that of the first cathode region 82, instead of the second cathode region 83. The doping concentration in the termination region may be 1/10 of the doping concentration in the first cathode region 82 or less.

In the semiconductor device 200 of the present example, the floating regions 17 are provided to be separated from each other and distributed to all the first cathode regions 82, and provided above the first cathode regions 82 for all the first cathode regions 82. For this reason, it is possible to suppress the surge voltage upon reverse recovery of the semiconductor device 200.

Figure 13A:
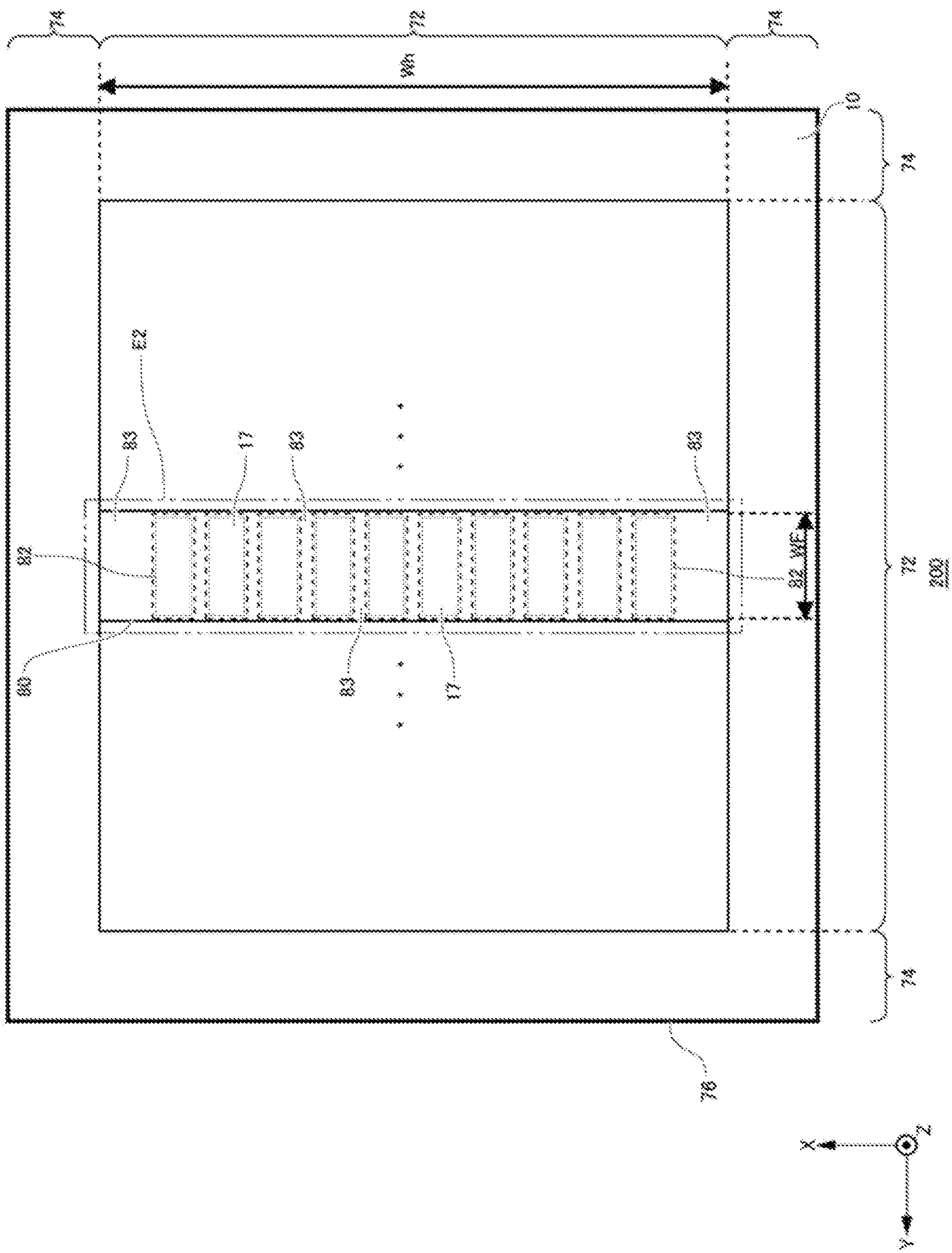
FIG. 13A shows another example of the upper surface of the semiconductor device 200 in accordance with the present embodiment.

FIG. 13A shows another example of the upper surface of the semiconductor device 200 in accordance with the present embodiment. The semiconductor device 200 of the present example is different from the semiconductor device 200 shown in FIG. 12A, in that the first cathode region 82 is continuously provided from an end region of a unit structure of diodes, which is shown in the region E2, on the positive side of the Y-axis direction to an end region on the negative side of the semiconductor device 200 shown in FIG. 12A. Also, the semiconductor device 200 of the present example is different from the semiconductor device 200 shown in FIG. 12A, in that the first cathode regions 82 alternate with the second cathode regions 83 in the X-axis direction in the semiconductor device 200 shown in FIG. 12A.

Figure 13B:
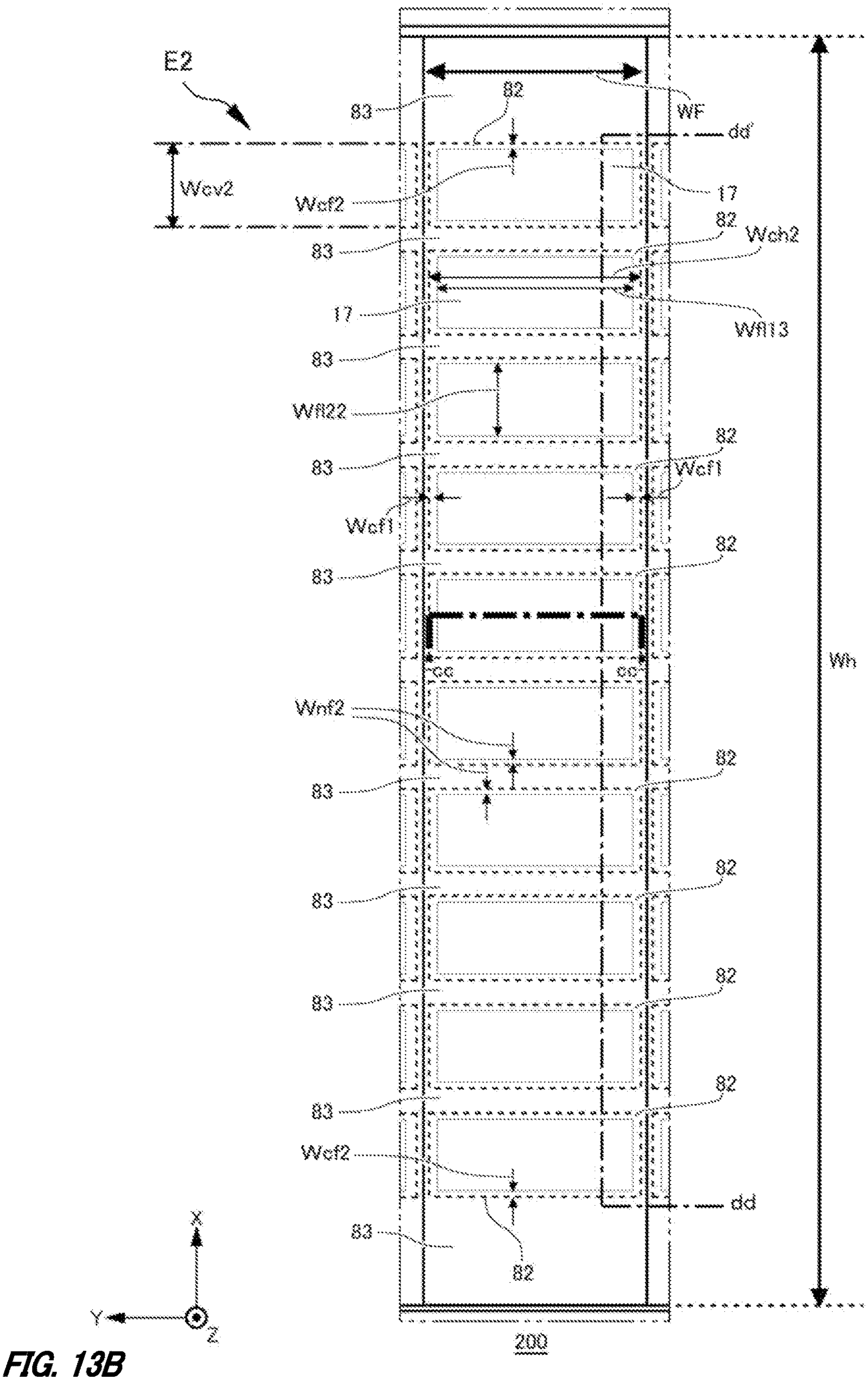
FIG. 13B is an enlarged view of a region E2 in FIG. 13A.

FIG. 13B is an enlarged view of the region E2 in FIG. 13A. As shown in FIG. 13B, in the semiconductor device 200 of the present example, the first cathode region 82 is continuously provided from an end region of a unit structure of diodes on the positive side of the Y-axis direction to an end region on the negative side. Also, the first cathode regions 82 alternate with the second cathode regions 83 in the X-axis direction.

In the semiconductor device 200 of the present example, as seen from above the semiconductor substrate 10, the floating regions 17 are provided on the inner sides of the first cathode regions 82. The ten floating regions 17 are provided in the X-axis direction. The floating regions 17 are provided above the first cathode regions 82. The floating regions 17 may be provided to be in contact with the first cathode regions 82.

Figure 13C:
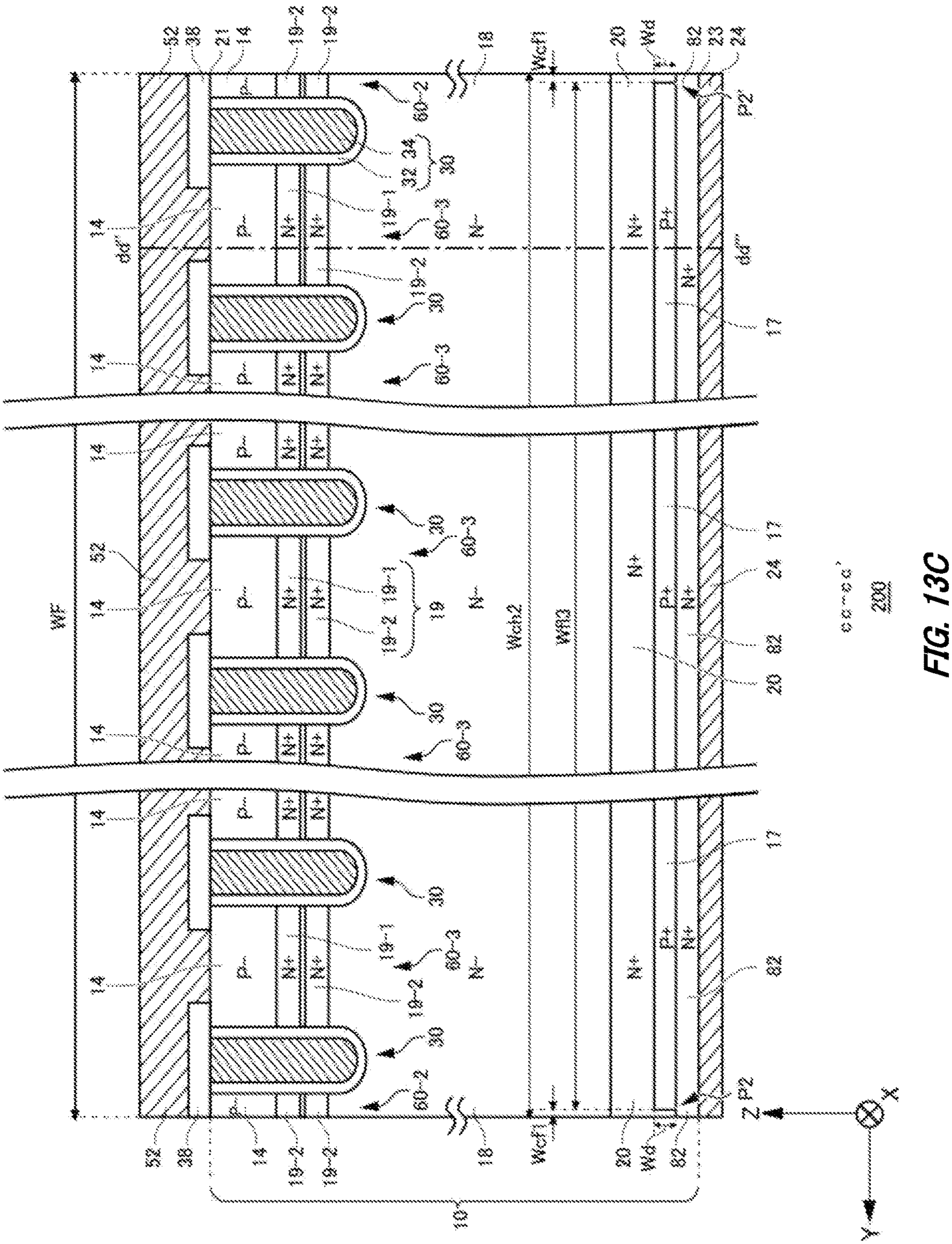
FIG. 13C shows an example of a cross-sectional view taken along a line cc-cc' in FIG. 13B.

FIG. 13C shows an example of a cross-sectional view taken along a line cc-cc' in FIG. 13B. In the semiconductor device 200 of the present example, the first cathode region 82 is continuously provided in the Y-axis direction from an end region of the semiconductor device 200 on the positive side of the Y-axis direction to an end region on the negative side, on the cc-cc' cross-section. A width Wch2 of the first cathode region 82 in the Y-axis direction is the same as the width WF of the semiconductor device 200 in the Y-axis direction.

Figure 13D:
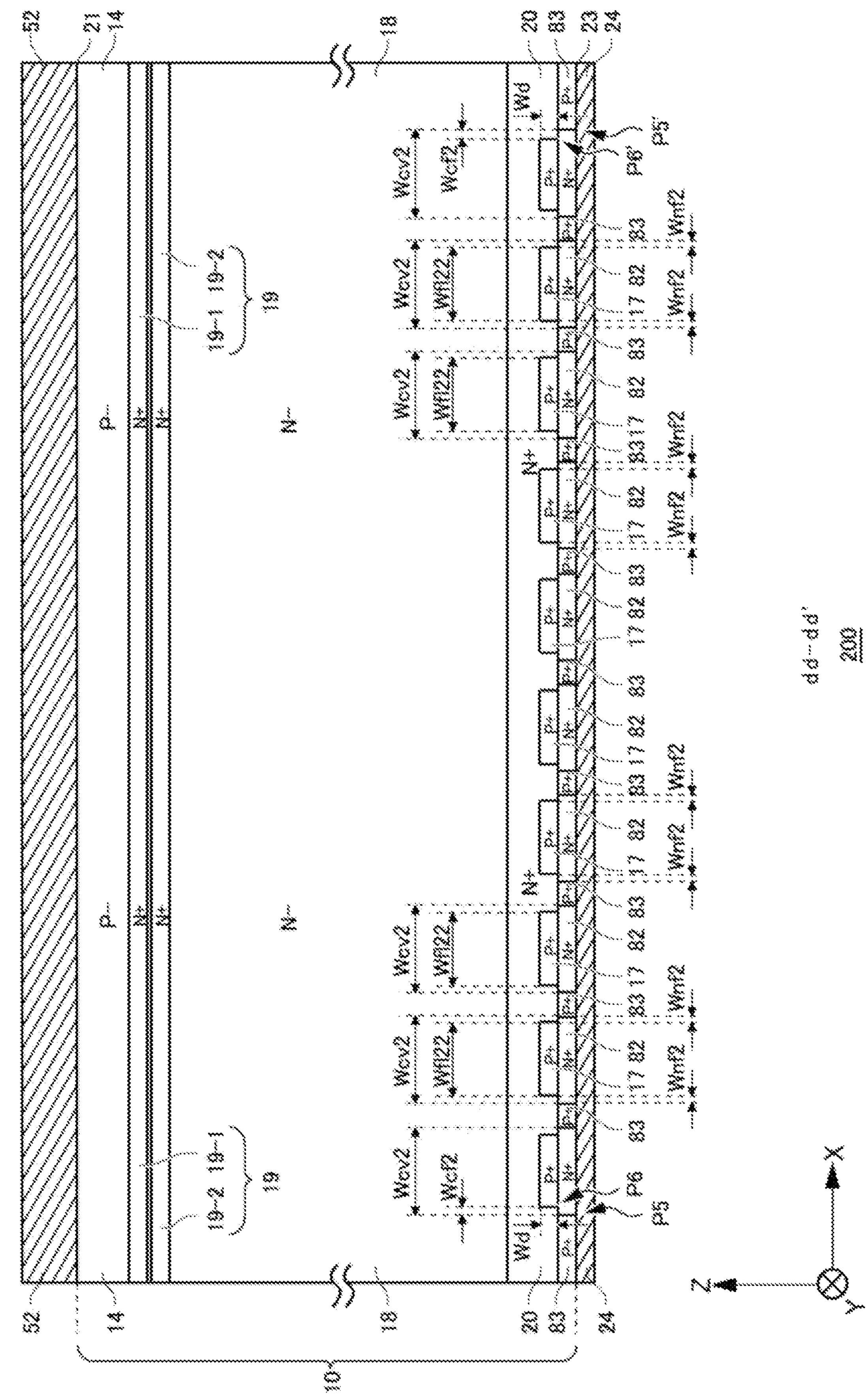
FIG. 13D shows an example of a cross-sectional view taken along a line dd-dd' in FIG. 13B.

FIG. 13D shows an example of a cross-sectional view taken along a line dd-dd' in FIG. 13B. The dd-dd' cross-section is the XZ plane passing a line dd''-dd''' in FIG. 13C. In the semiconductor device 200 of the present example, the first cathode regions 82 alternate with the second cathode regions 83 in the X-axis direction with being in contact with the lower surface 23. Also, the floating region 17 is provided above the first cathode region 82 with being in contact with the first cathode region 82. For this reason, it is possible to suppress the surge voltage upon reverse recovery of the semiconductor device 200.

Figure 14A:
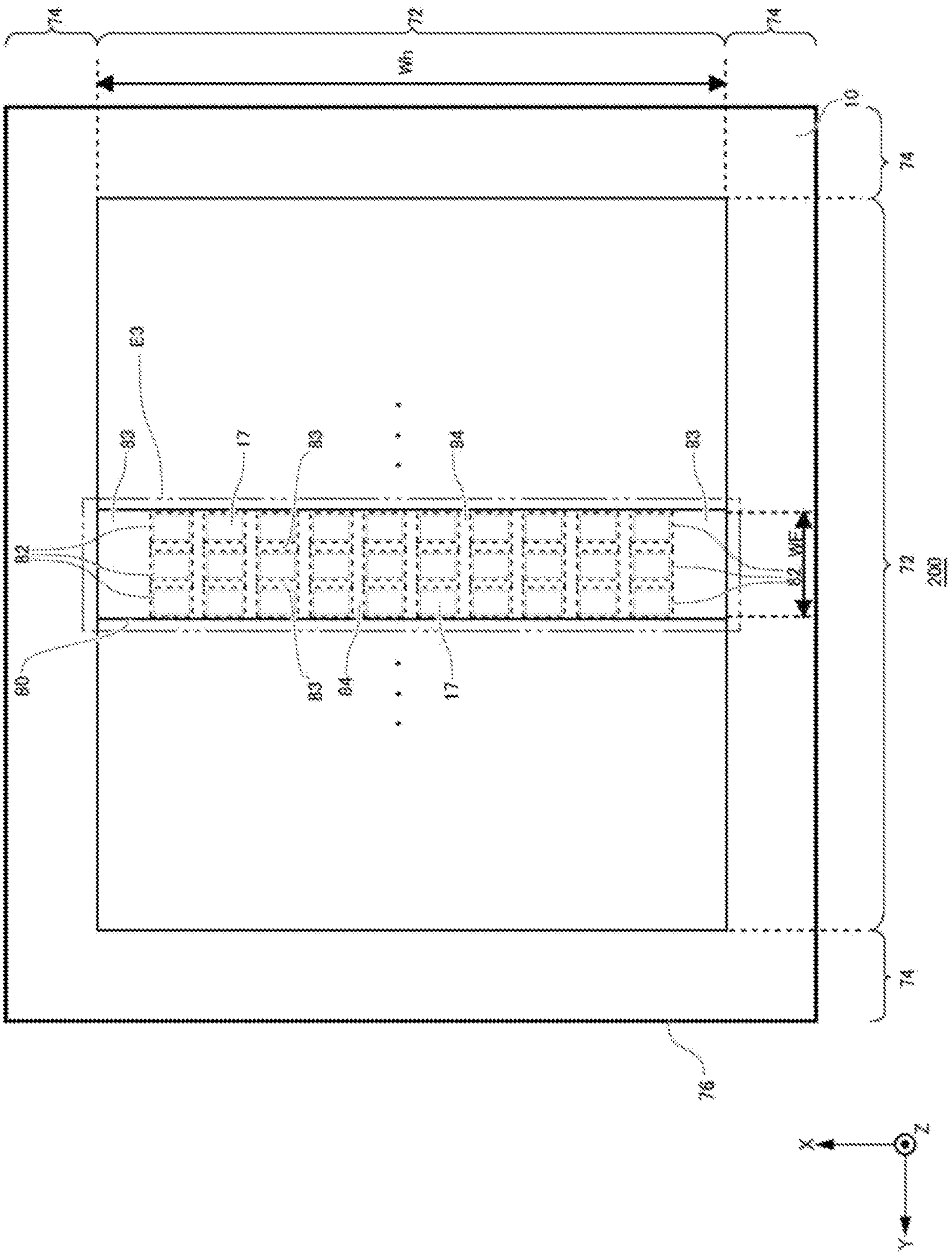
FIG. 14A shows another example of the upper surface of the semiconductor device 200 in accordance with the present embodiment.

FIG. 14A shows another example of the upper surface of the semiconductor device 200 in accordance with the present embodiment. In the semiconductor device 200 of the present example, as seen from above the semiconductor substrate 10, the first cathode regions 82 are separated from each other and provided in a lattice shape. FIG. 14A shows an example in which the ten first cathode regions 82 are provided in the X-axis direction and the three first cathode regions 82 are provided in the Y-axis direction in a unit structure of diodes, in the region E3.

Figure 14B:
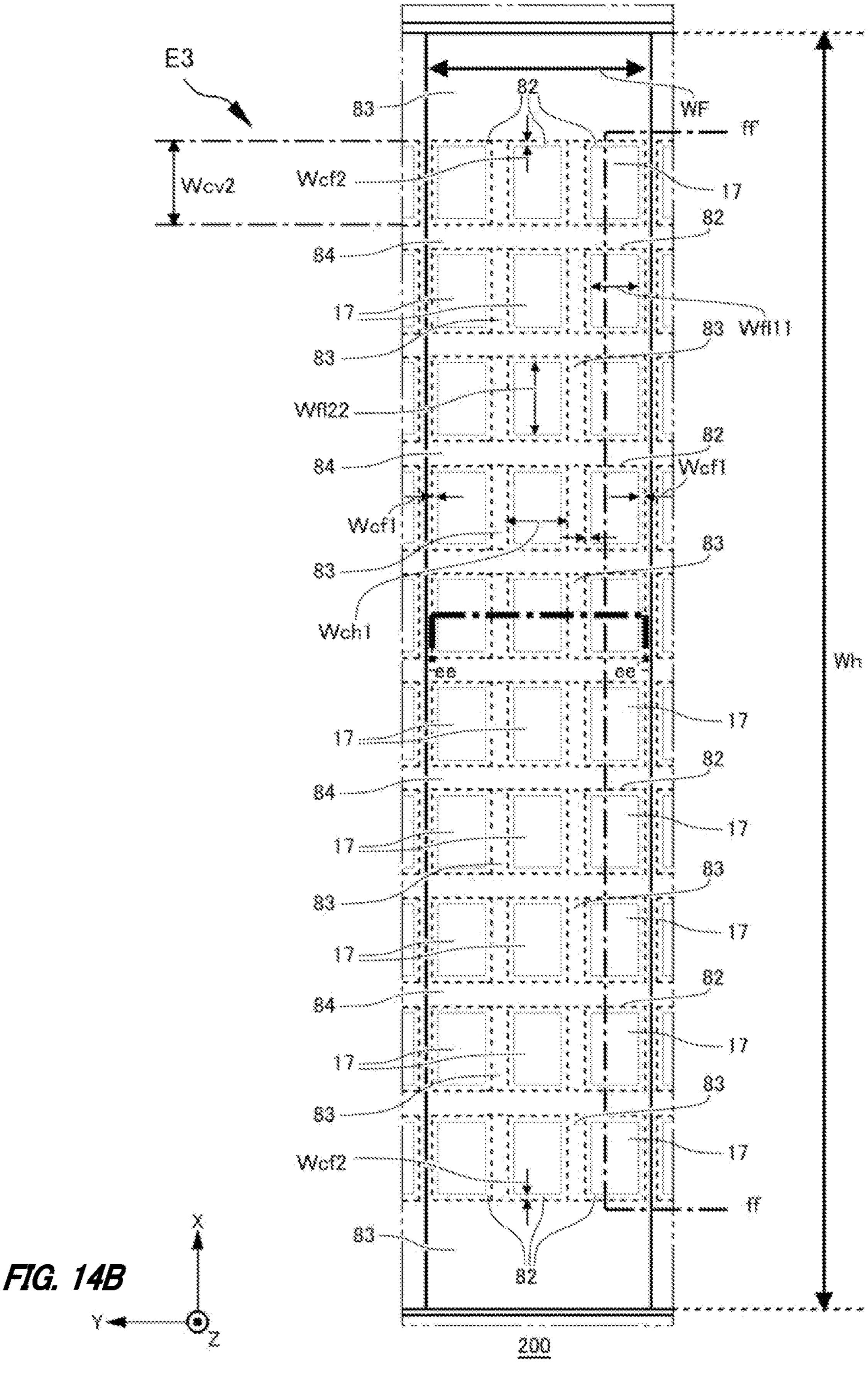
FIG. 14B is an enlarged view of a region E3 in FIG. 14A.

FIG. 14B is an enlarged view of the region E3 in FIG. 14A. As shown in FIG. 14B, in the semiconductor device 200 of the present example, the floating regions 17 are provided on the inner sides of the first cathode regions 82, as seen from above the semiconductor substrate 10. The ten floating regions 17 are provided in the X-axis direction, and the three floating regions 17 are provided in the Y-axis direction.

As seen from above the semiconductor substrate 10, the second cathode region 83 is provided between the two first cathode regions 82 adjacent to each other in the Y-axis direction. A third cathode region 84 of a second conductivity-type is provided between the two first cathode regions 82 adjacent to each other in the X-axis direction. The third cathode region 84 is also provided between the two second cathode regions 83 adjacent to each other in the X-axis direction, as seen from above the semiconductor substrate 10.

The third cathode region 84 is of, for example, P+ type. A doping concentration in the third cathode region 84 may be the same as the doping concentration in the second cathode region 83. The second cathode region 83 and the third cathode region 84 may be coupled as cathode regions having the same doping concentration.

Figure 14C:
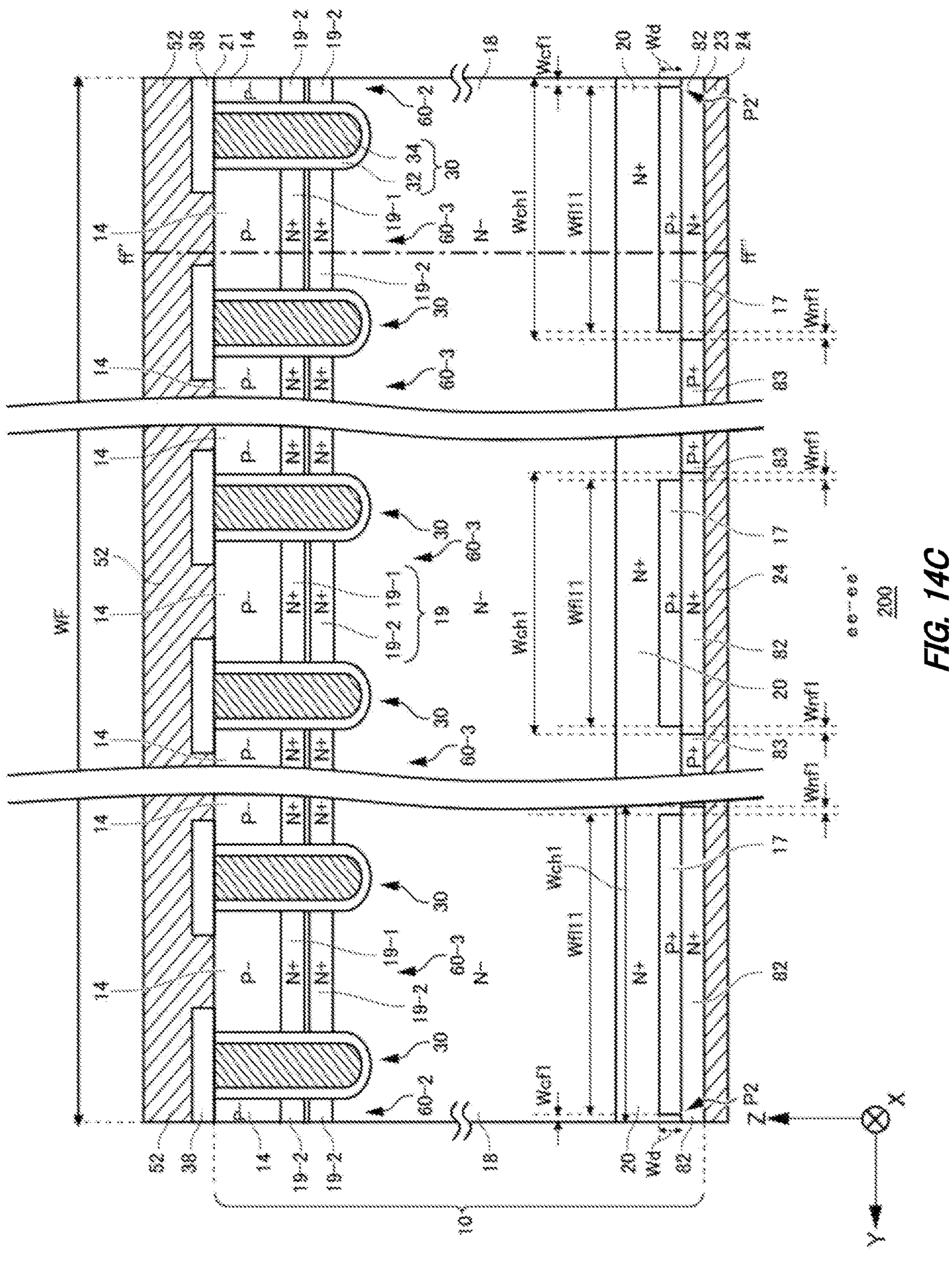
FIG. 14C shows an example of a cross-sectional view taken along a line ee-ee' in FIG. 14B.

FIG. 14C shows an example of a cross-sectional view taken along a line ee-ee' in FIG. 14B. The configuration on the ee-ee' cross-section of the semiconductor device 200 of the present example is the same as the configuration on the aa-aa' cross-section of the semiconductor device 200 shown in FIG. 12C.

Figure 14D:
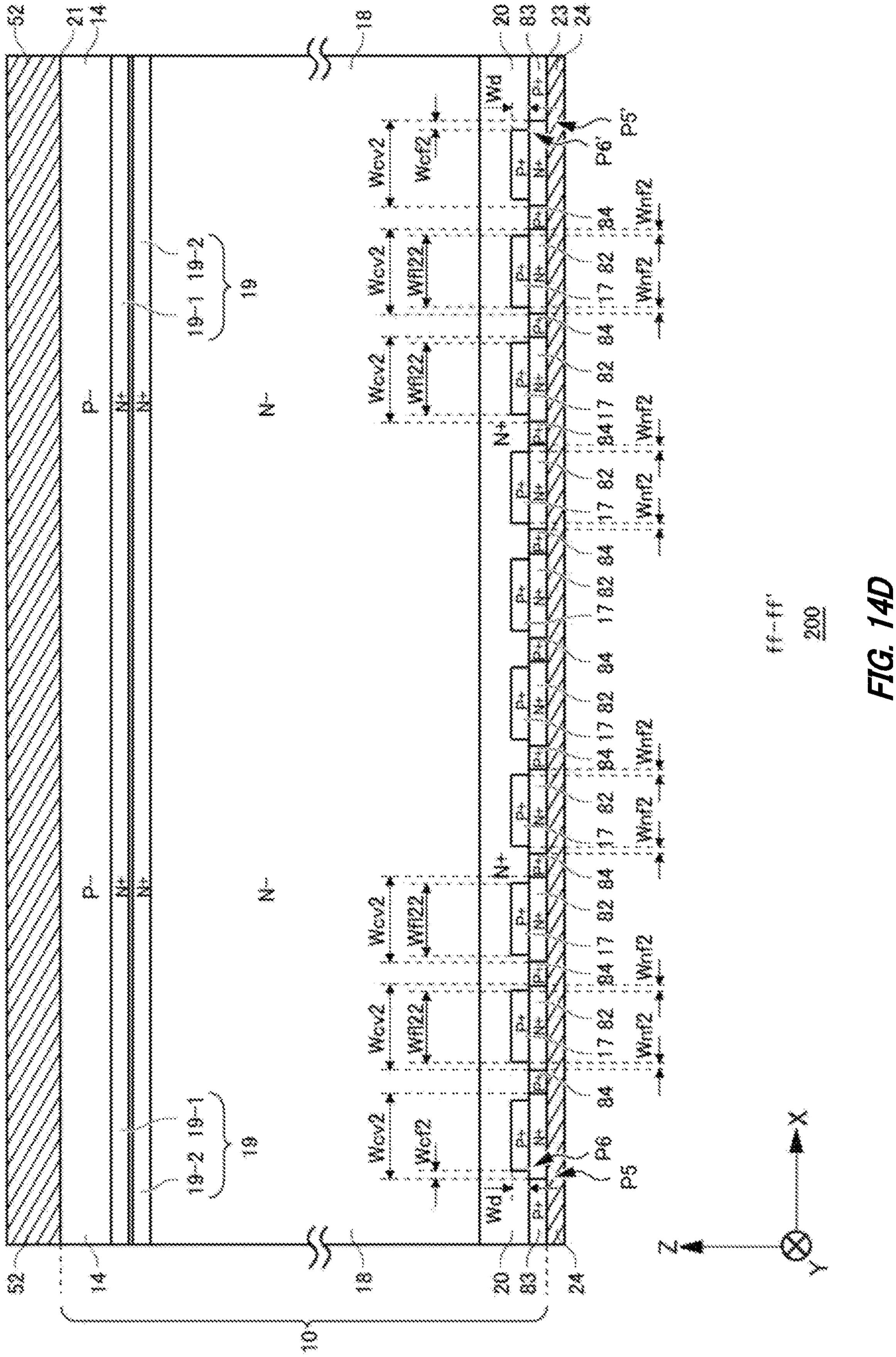
FIG. 14D shows an example of a cross-sectional view taken along a line ff-ff' in FIG. 14B.

FIG. 14D shows an example of a cross-sectional view taken along a line ff-ff' in FIG. 14B. The ff-ff' cross-section is the XZ plane passing a line ff"-ff"' in FIG. 14C. The configuration on the ff-ff' cross-section of the semiconductor device 200 of the present example is different from the configuration on the dd-dd' cross-section shown in FIG. 13D, in that the third cathode regions 84 are provided, instead of the second cathode region 83, on the dd-dd' cross-section shown in FIG. 13D.

In the semiconductor device 200 of the present example, the first cathode regions 82 alternate with the third cathode region 84 in the X-axis direction with being in contact with the lower surface 23, and the floating regions 17 are provided above the first cathode regions 82 with being in contact with the first cathode regions 82. For this reason, it is possible to suppress the surge voltage upon reverse recovery of the semiconductor device 200.

Figure 15A:
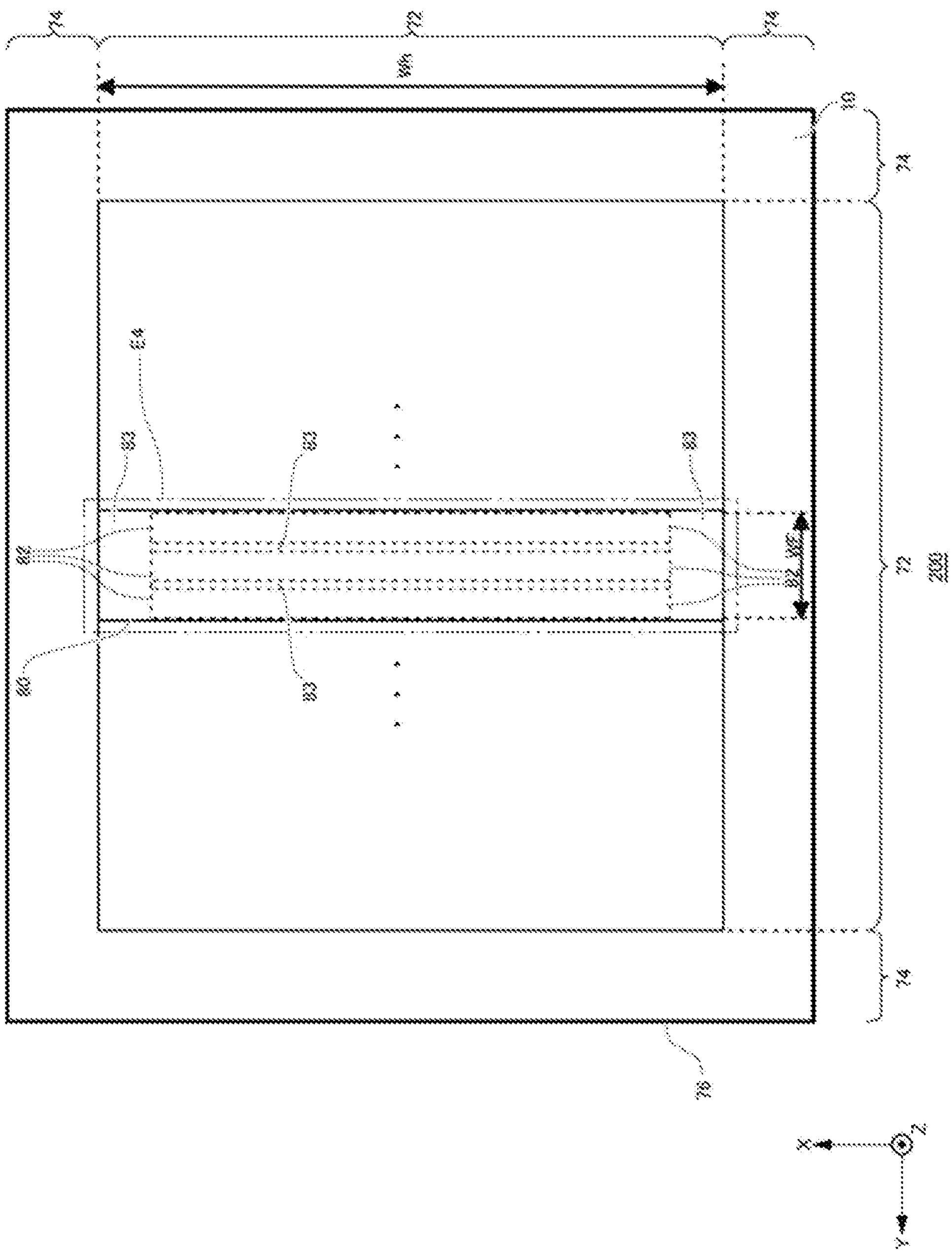
FIG. 15A shows another example of the upper surface of the semiconductor device 200 in accordance with the present embodiment.

FIG. 15A shows another example of the upper surface of the semiconductor device 200 in accordance with the present embodiment. The semiconductor device 200 shown in FIG. 15A is different from the semiconductor device 200 shown in FIG. 12A, in that the floating region 17 is not provided in the semiconductor device 200 shown in FIG. 12A. In the semiconductor device 200 of the present example, the unit structures of diodes in the region E4 are arranged in the Y-axis direction.

Figure 15B:
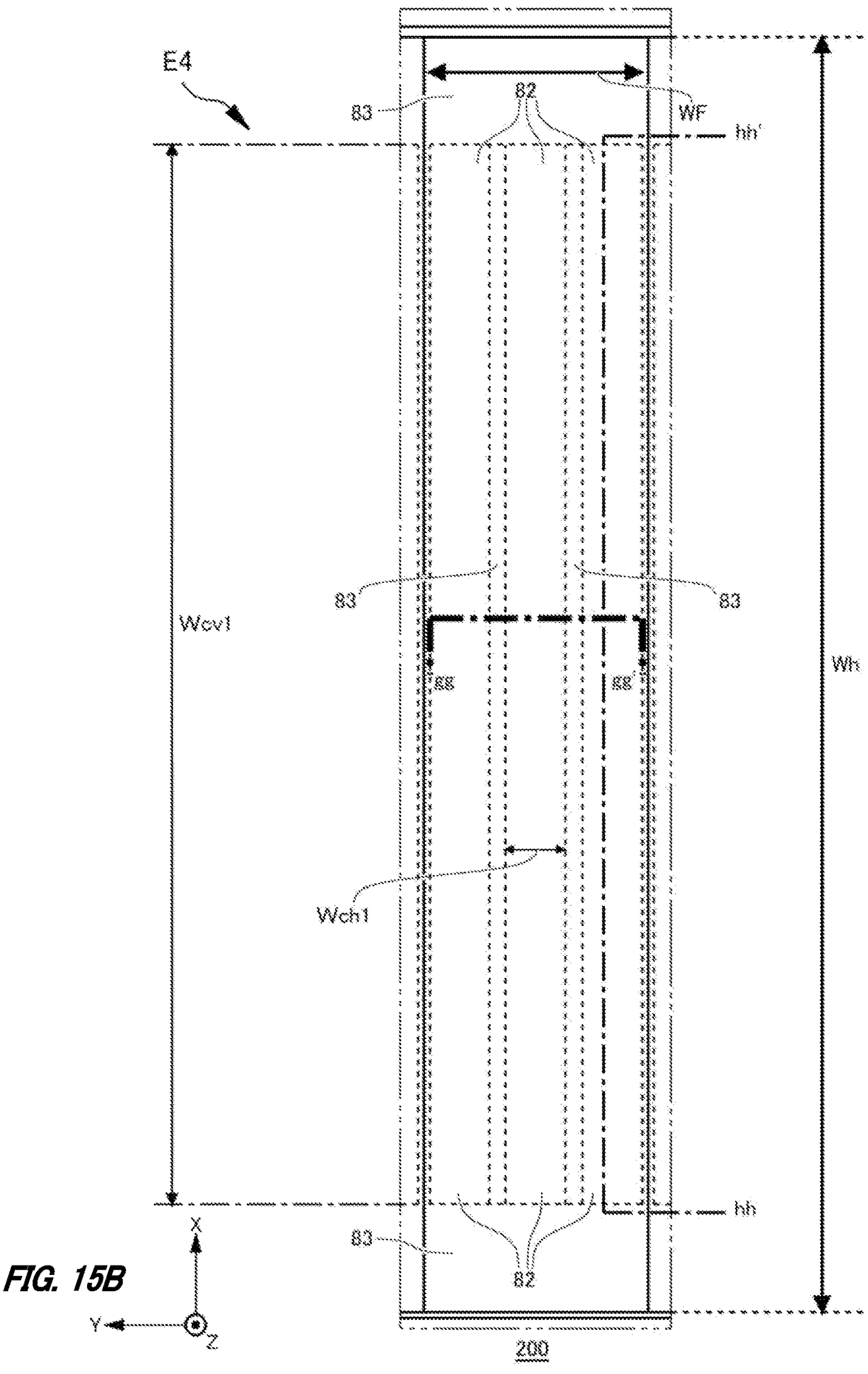
FIG. 15B is an enlarged view of a region E4 in FIG. 15A.

FIG. 15B is an enlarged view of a region E4 in FIG. 15A. As shown in FIG. 15B, in the semiconductor device 200 of the present example, the second cathode regions 83 are respectively provided to be in contact with the lower surface 23 on the positive and negative sides of the X-axis direction in the first cathode region 82. The second cathode region 83 may be coupled with the second cathode region 83 adjacent to the first cathode region 82 in the Y-axis direction.

Figure 15C:
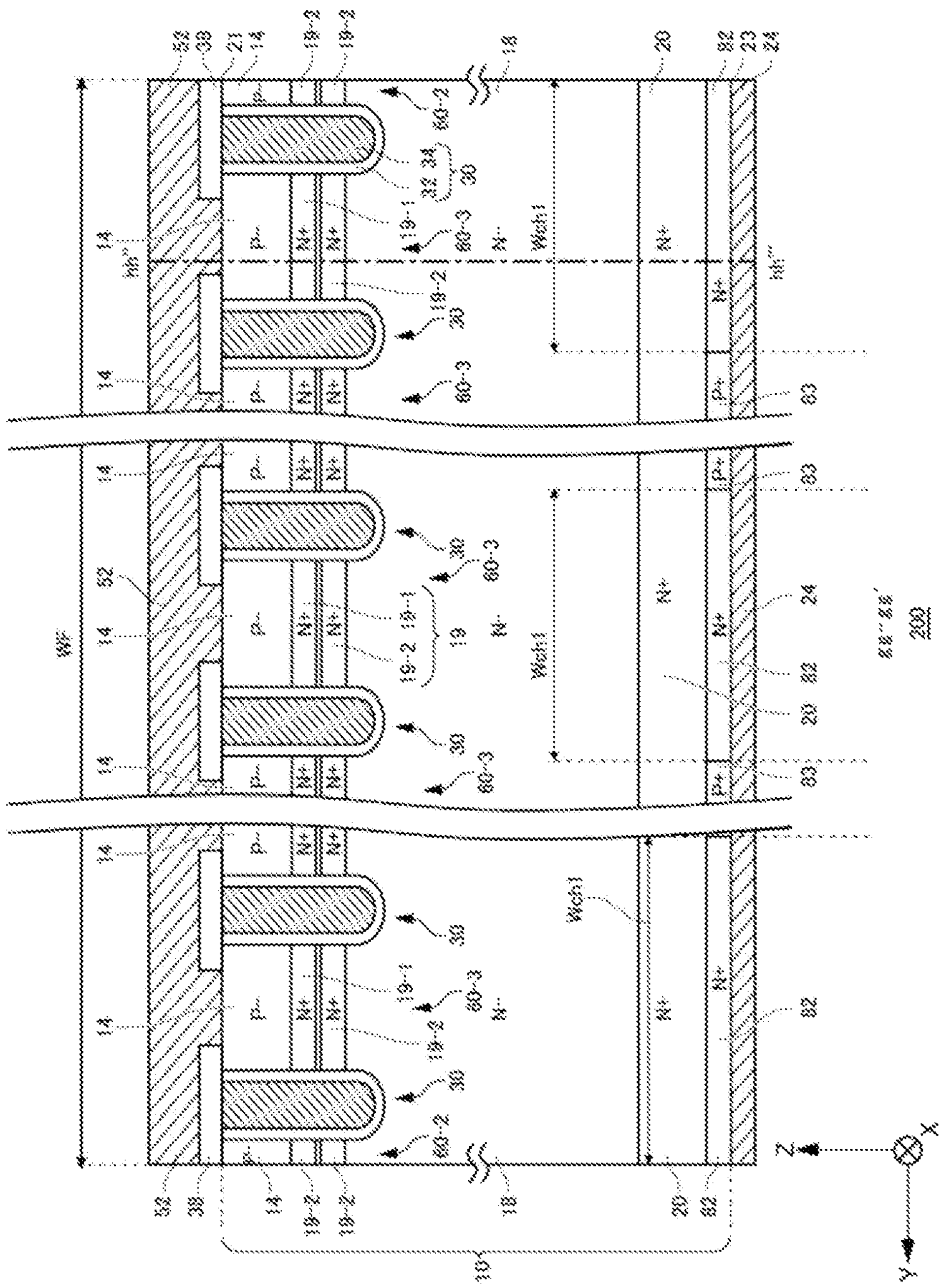
FIG. 15C shows an example of a cross-sectional view taken along a line gg-gg' in FIG. 15B.

FIG. 15C shows an example of a gg-gg' cross-section in FIG. 15B. The configuration on the gg-gg' cross-section of the semiconductor device 200 of the present example is different from the configuration on the aa-aa' cross-section shown in FIG. 12C, in that the floating region 17 is not provided above the first cathode region 82 on the aa-aa' cross-section shown in FIG. 12C.

Figure 15D:
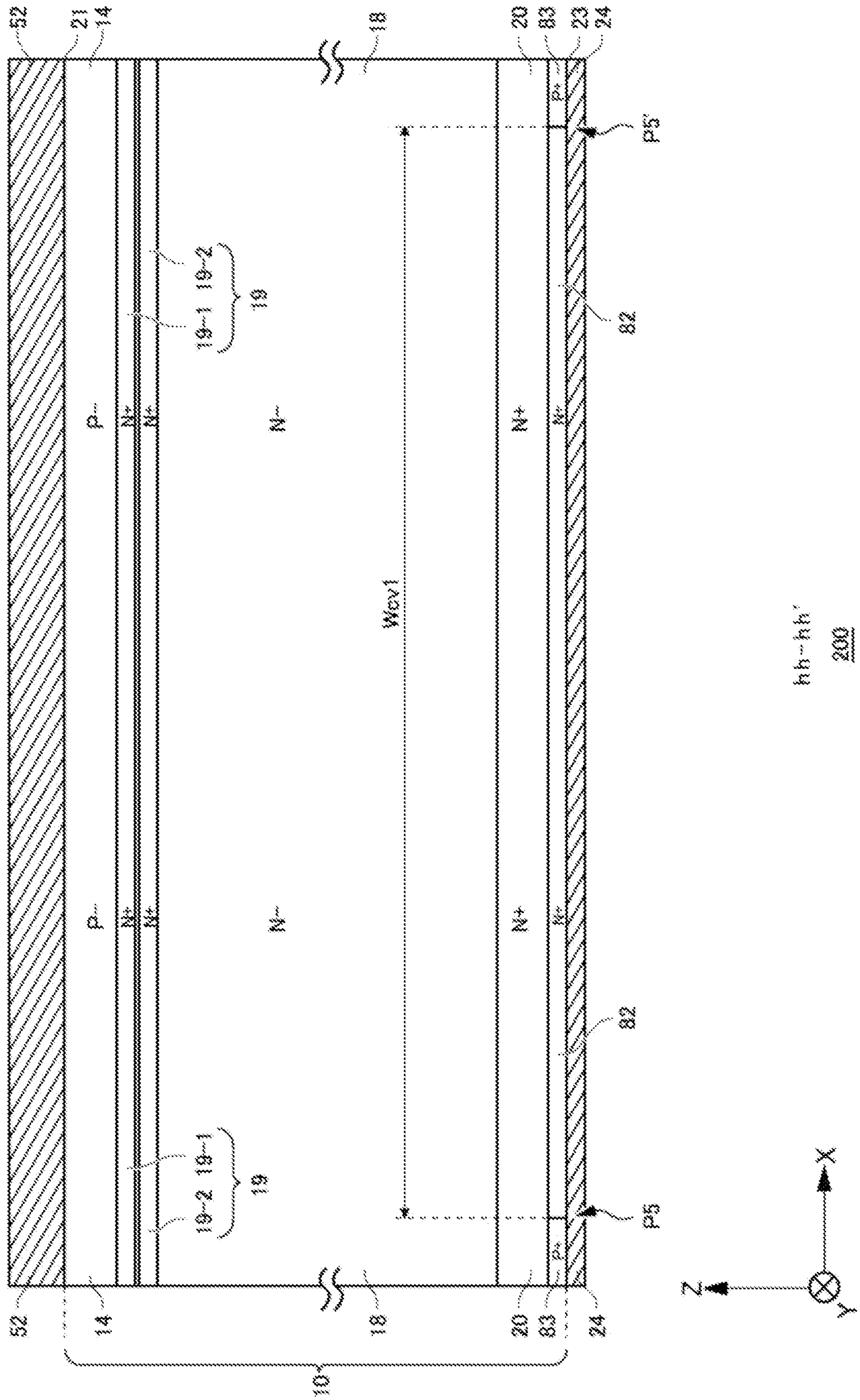
FIG. 15D shows an example of a cross-sectional view taken along a line hh-hh' in FIG. 15B.

FIG. 15D shows an example of a cross-sectional view taken along a line hh-hh' in FIG. 15B. The hh-hh' cross-section is the XZ plane passing a line hh"-hh"' in FIG. 15C.

The configuration on the hh-hh' cross-section of the semiconductor device 200 of the present example is the same as the configuration on the b-b' cross-section of the semiconductor device 100 shown in FIG. 2E, except that the floating regions 17 are not provided, the collector regions 22 are not provided on both ends in the X-axis direction and the second cathode regions 83 are instead provided in the semiconductor device 100 shown in FIG. 2E.

The semiconductor device 200 of the present example includes the first cathode regions 82 and the second cathode regions 83 in contact with the lower surface 23. The second cathode regions 83 are provided on both ends in the X-axis direction. The first cathode region 82 is sandwiched between the second cathode regions 83 in the X-axis direction. The second cathode region 83 is different from the first cathode region 82, in terms of the conductivity type or the doping concentration. For this reason, it is possible to suppress the surge voltage upon reverse recovery of the semiconductor device 200.

Figure 16A:
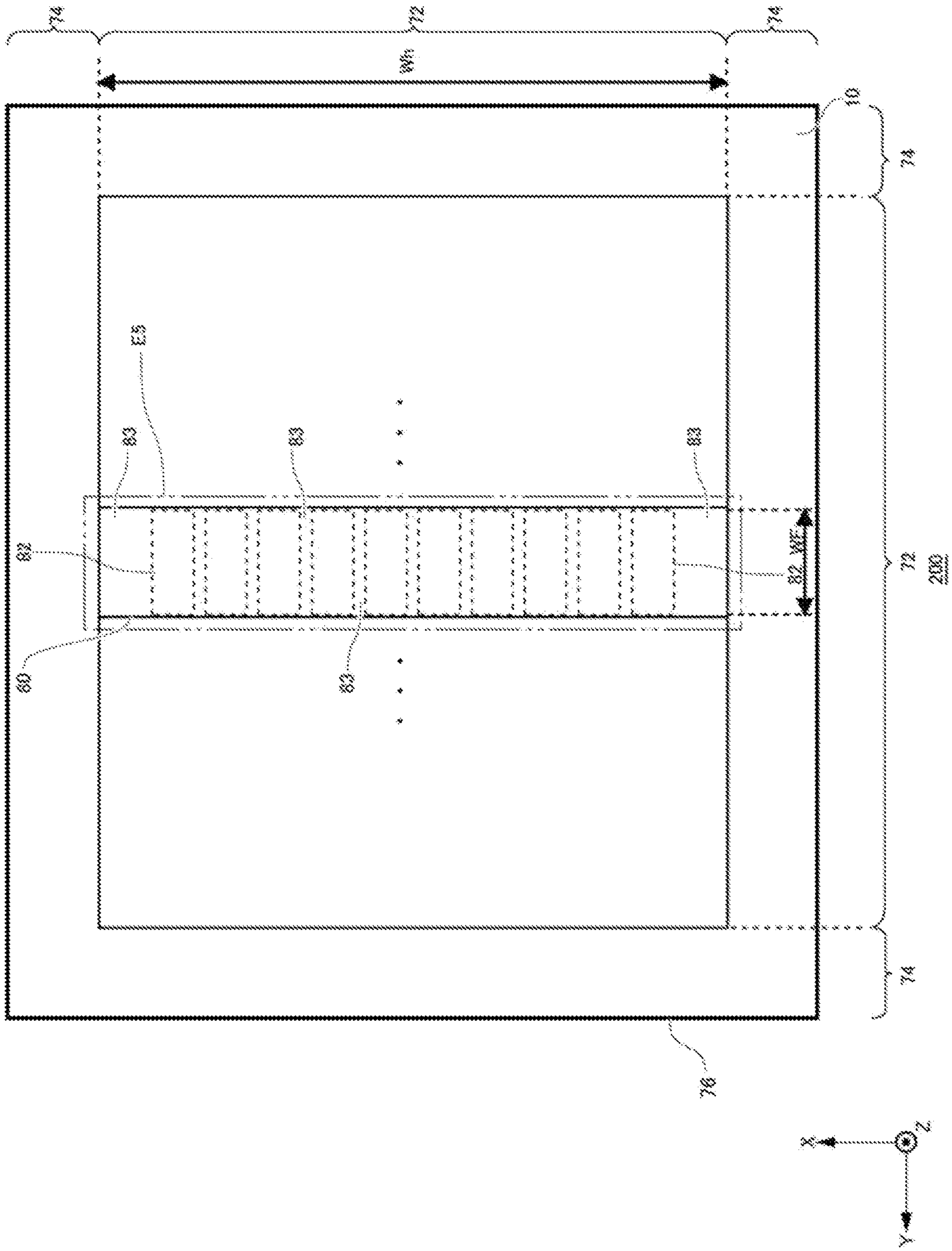
FIG. 16A shows another example of the upper surface of the semiconductor device 200 in accordance with the present embodiment.

FIG. 16A shows another example of the upper surface of the semiconductor device 200 in accordance with the present embodiment. The semiconductor device 200 of the present example is different from the semiconductor device 200 shown in FIG. 13A, in that the floating regions 17 are not provided in the semiconductor device 200 shown in FIG. 13A. In the semiconductor device 200 of the present example, the unit structures of diodes in the region E5 are arranged in the Y-axis direction.

Figure 16B:
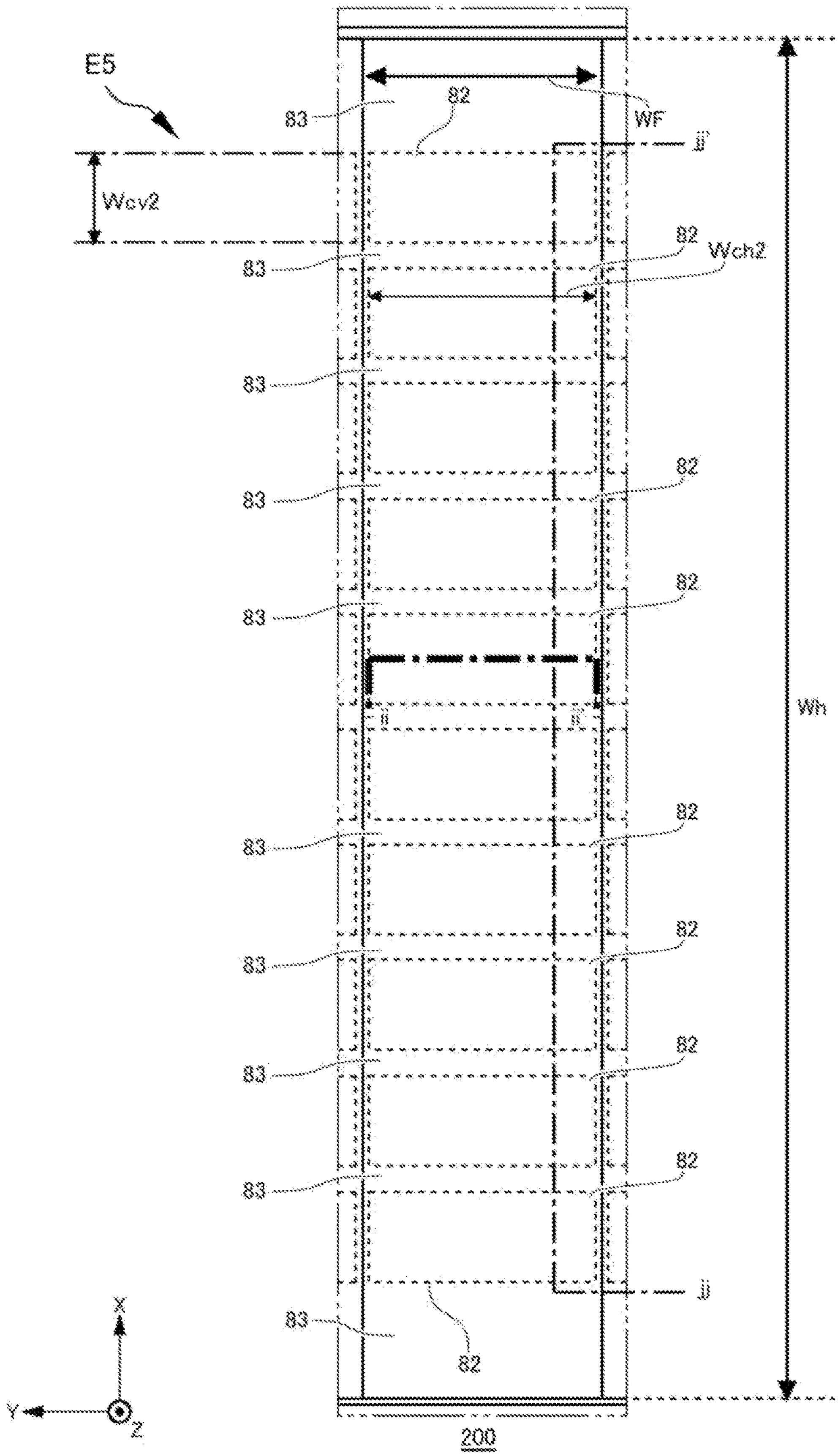
FIG. 16B is an enlarged view of a region E5 in FIG. 16A.

FIG. 16B is an enlarged view of a region E5 in FIG. 16A. As shown in FIG. 16B, in the semiconductor device 200 of the present example, the first cathode region 82 is continuously provided from an end region of a unit structure of diodes on the positive side of the Y-axis direction to an end region on the negative side. Also, the first cathode regions 82 alternate with the second cathode regions 83 in the X-axis direction.

Figure 16C:
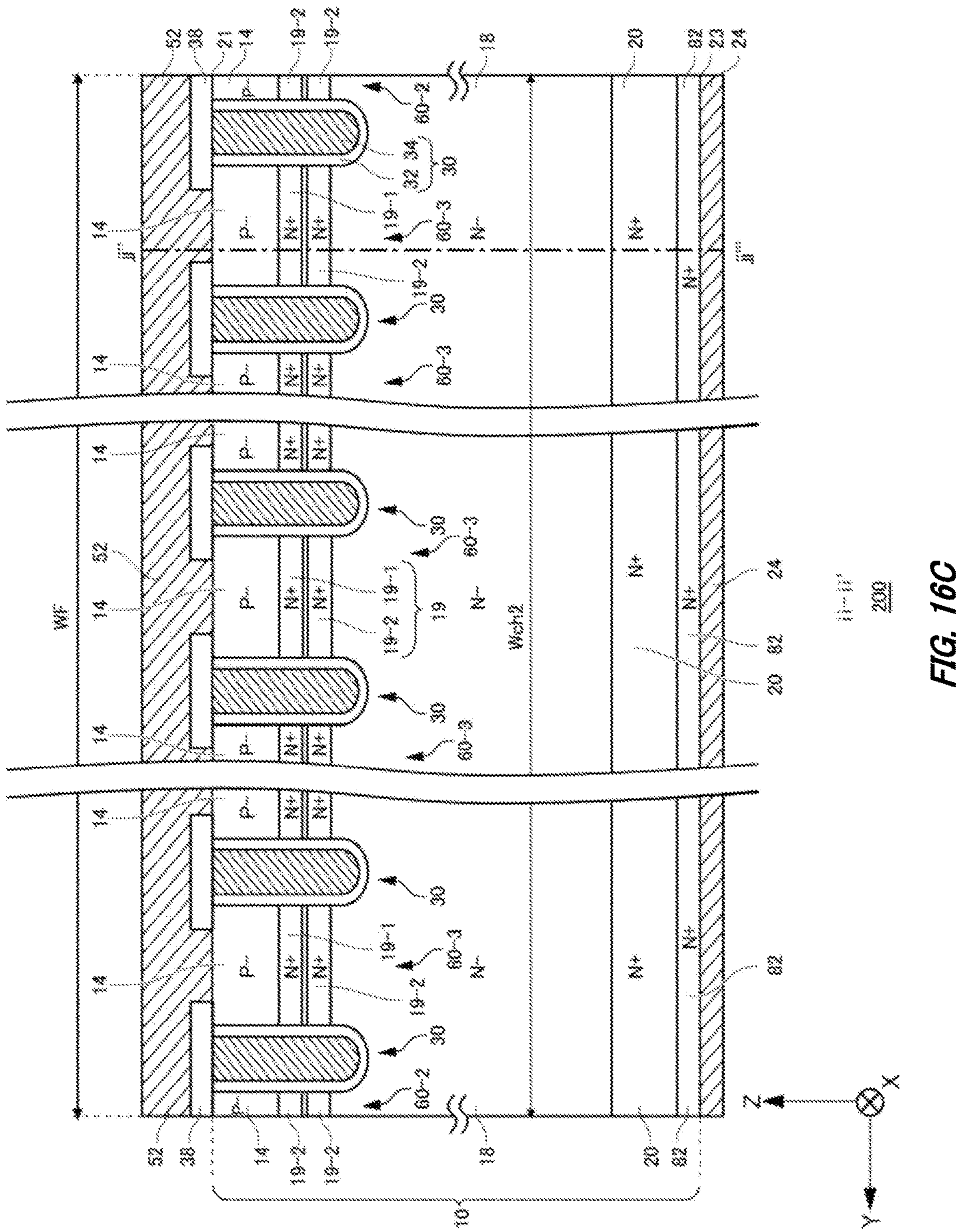
FIG. 16C shows an example of a cross-sectional view taken along a line ii-ii' in FIG. 16B.

FIG. 16C shows an example of a cross-sectional view taken along a line ii-ii' in FIG. 16B. The configuration on the ii-ii' cross-section of the semiconductor device 200 of the present example is different from the configuration on the cc-cc' cross-section shown in FIG. 13C, in that the floating region 17 is not provided above the first cathode region 82 on the cc-cc' cross-section shown in FIG. 13C.

Figure 16D:
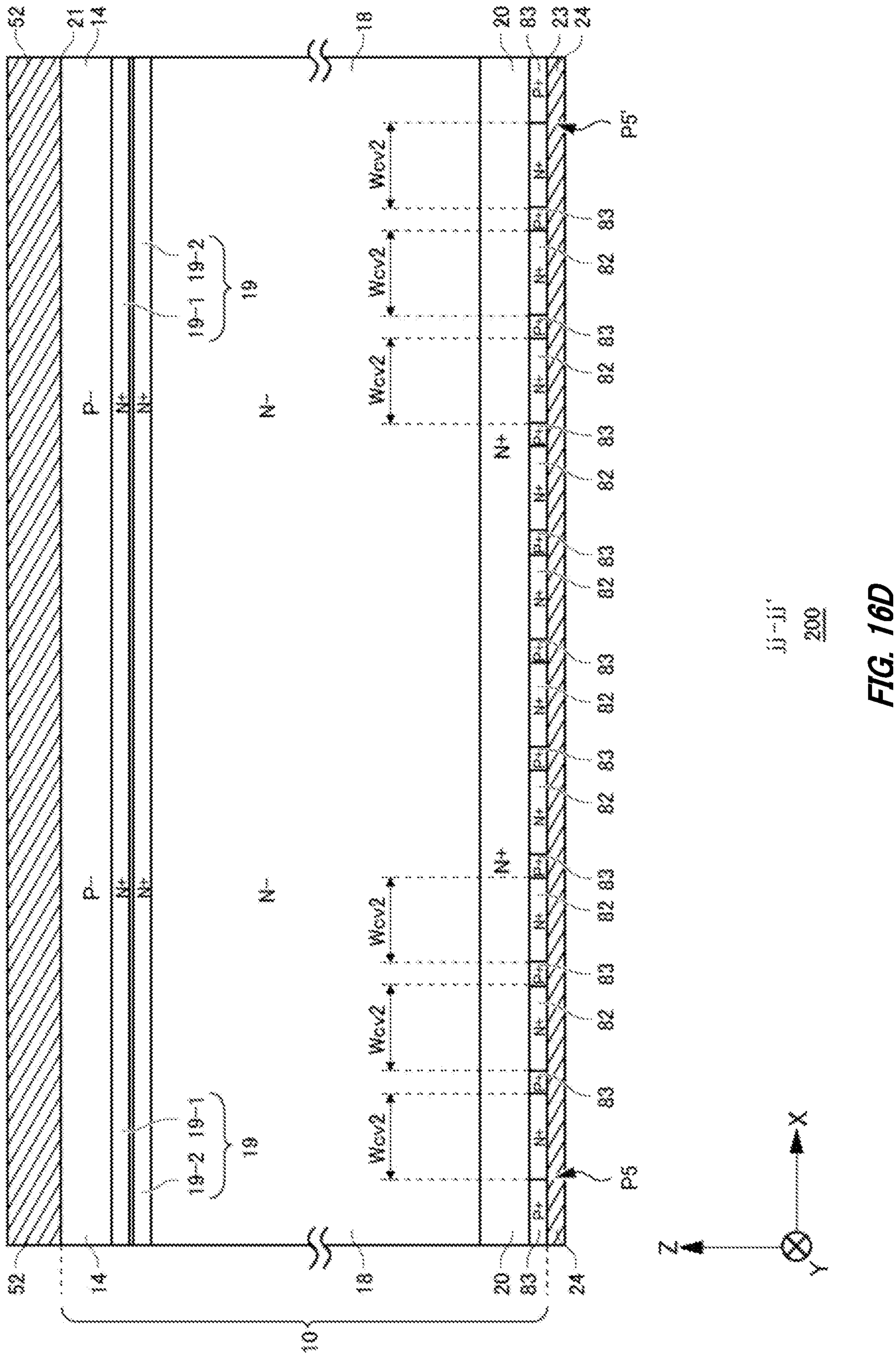
FIG. 16D shows an example of a cross-sectional view taken along a line jj-jj' in FIG. 16B.

FIG. 16D shows an example of a cross-sectional view taken along a line jj-jj' in FIG. 16B. The jj-jj' cross-section is the XZ plane passing a line jj"-jj"' in FIG. 16C. In the semiconductor device 200 of the present example, the first cathode regions 82 alternate with the second cathode regions 83 in the X-axis direction with being in contact with the lower surface 23. For this reason, it is possible to suppress the surge voltage upon reverse recovery of the semiconductor device 200.

Figure 17A:
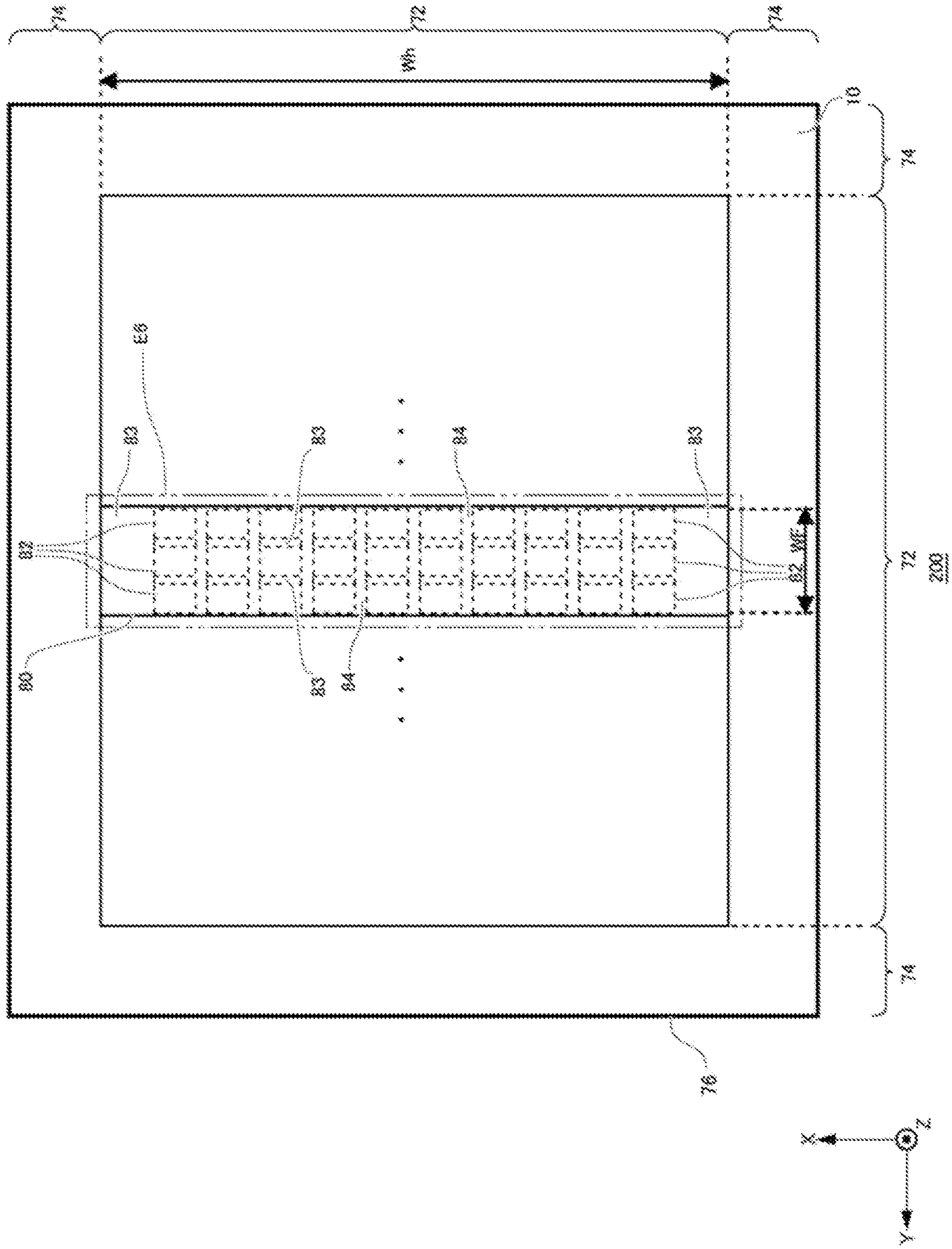
FIG. 17A shows another example of the upper surface of the semiconductor device 200 in accordance with the present embodiment.

FIG. 17A shows another example of the upper surface of the semiconductor device 200 in accordance with the present embodiment. The semiconductor device 200 of the present example is different from the semiconductor device 200 shown in FIG. 14A, in that the floating regions 17 are not provided in the semiconductor device 200 shown in FIG. 14A. In the semiconductor device 200 of the present example, the unit structures of diodes in the region E6 are arranged in the Y-axis direction.

Figure 17B:
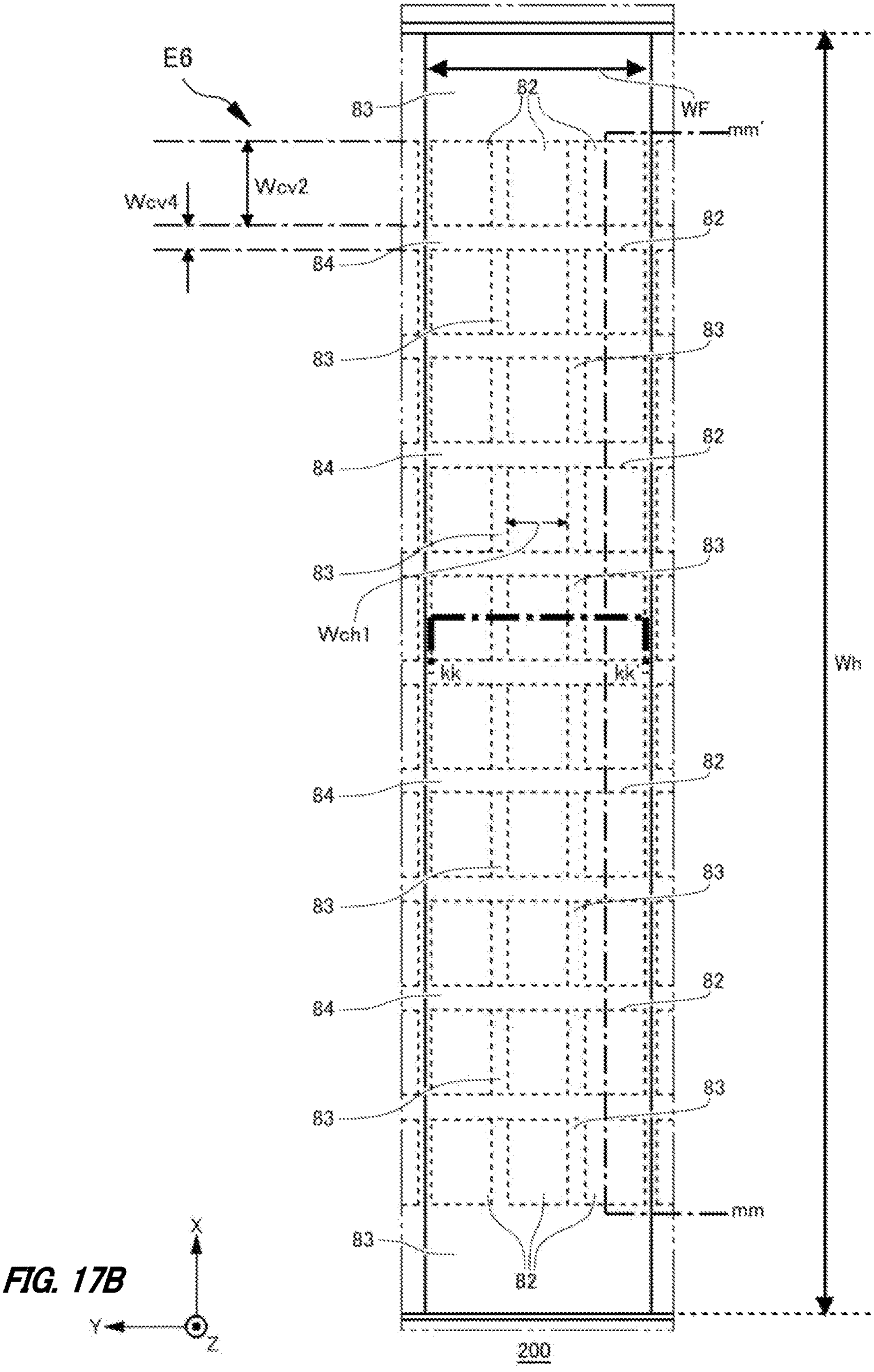
FIG. 17B is an enlarged view of a region E6 in FIG. 17A.

FIG. 17B is an enlarged view of a region E6 in FIG. 17A. As shown in FIG. 17B, in the unit structure of diodes of the semiconductor device 200 of the present example, the first cathode regions 82 are separated from each other and provided in a lattice shape, as seen from above the semiconductor substrate 10.

Figure 17C:
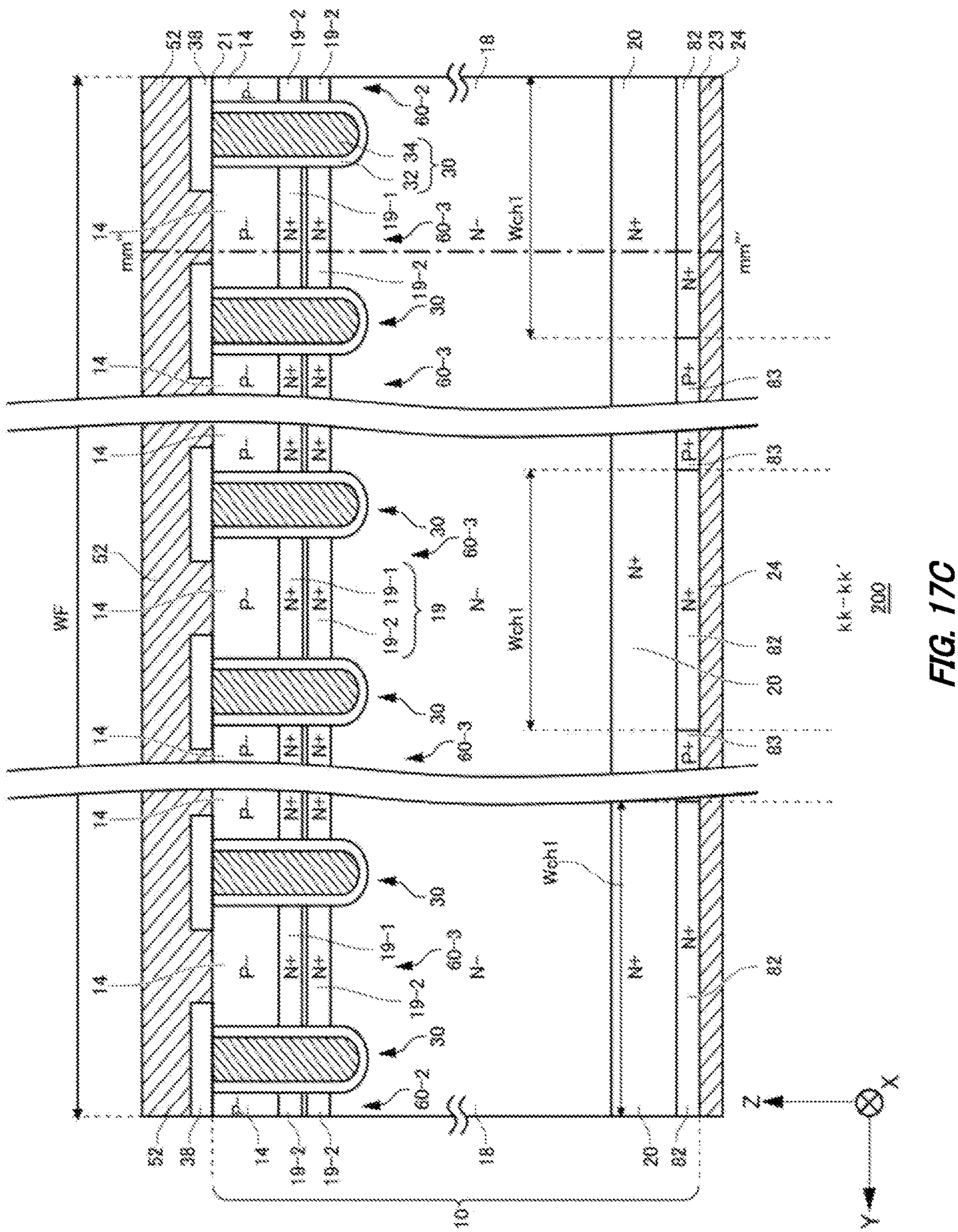
FIG. 17C shows an example of a cross-sectional view taken along a line kk-kk' in FIG. 17B.

FIG. 17C shows an example of a cross-sectional view taken along a line kk-kk' in FIG. 17B. The configuration on the kk-kk' cross-section of the semiconductor device 200 of the present example is the same as the configuration on the gg-gg' cross-section of the semiconductor device 200 shown in FIG. 15C.

Figure 17D:
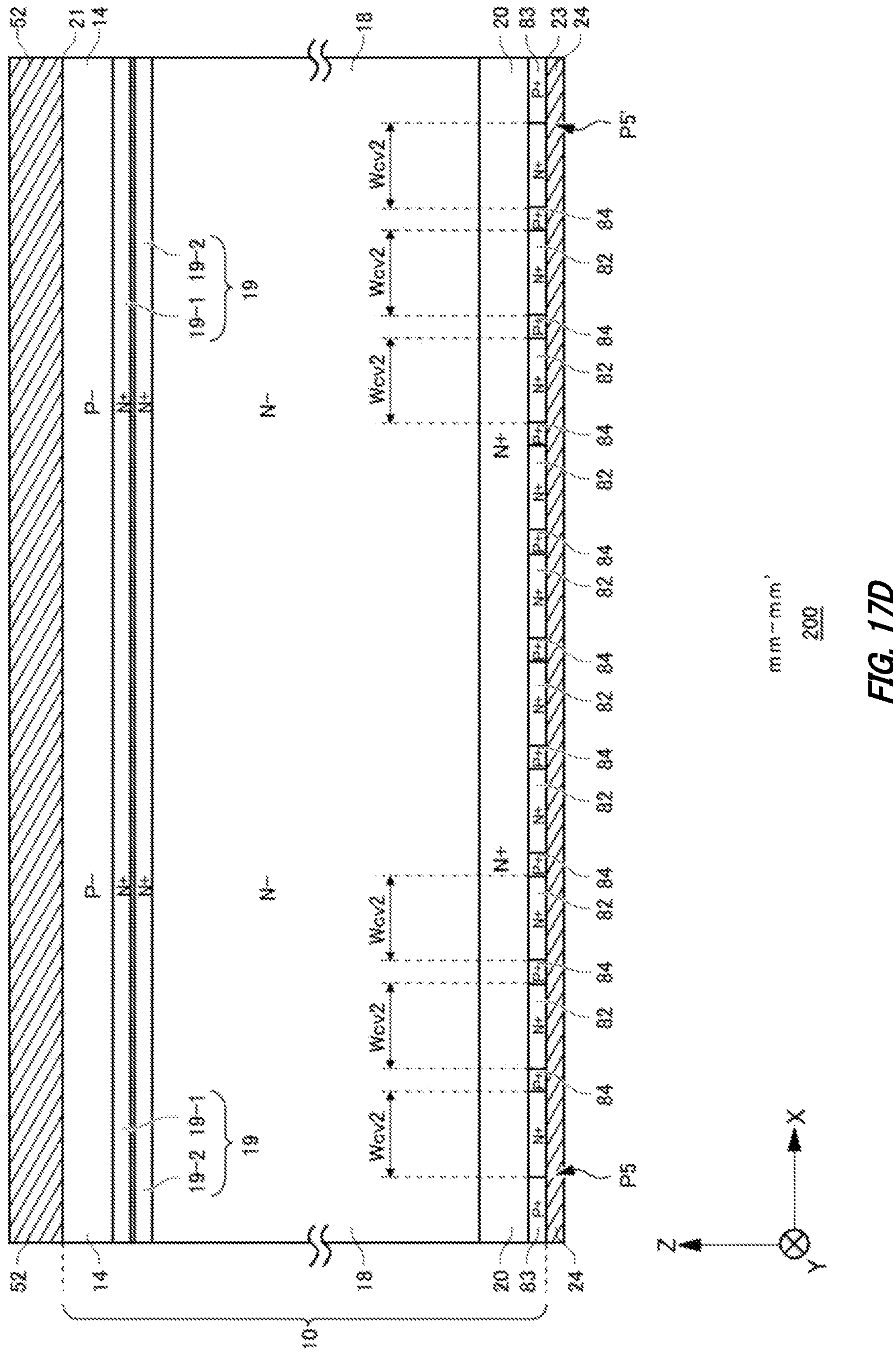
FIG. 17D shows an example of a cross-sectional view taken along a line mm-mm' in FIG. 17B.

FIG. 17D shows an example of a cross-sectional view taken along a line mm-mm' in FIG. 17B The mm-mm' cross-section is the XZ plane passing a line mm"-mm"' in FIG. 17C. The configuration on the mm-mm' cross-section of the semiconductor device 200 of the present example is different from the configuration on the jj-jj' cross-section shown in FIG. 16D, in that the third cathode regions 84 are provided, instead of the second cathode regions 83, on the jj-jj' cross-section of the semiconductor device 200 shown in FIG. 16D.

In the semiconductor device 200 of the present example, the first cathode regions 82 alternate with the third cathode regions 84 in the X-axis direction with being in contact with the lower surface 23. For this reason, it is possible to suppress the surge voltage upon reverse recovery of the semiconductor device 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . well region, 12 . . . emitter region, 14 . . . base region, 15 . . . contact region, 17 . . . floating region, 18 . . . drift region, 20 . . . buffer region, 21 . . . upper surface, 22 . . . collector region, 23 . . . lower surface, 24 . . . collector electrode, 29 . . . linear portion, 30 . . . dummy trench part, 31 . . . edge portion, 32 . . . dummy dielectric film, 34 . . . dummy conductive portion, 38 . . . interlayer dielectric film, 39 . . . linear portion, 40 . . . gate trench part, 41 . . . edge portion, 48 . . . gate runner, 49 . . . contact hole, 50 . . . gate metal layer, 52 . . . emitter electrode, 53 . . . , the Kelvin pad, 54 . . . contact hole, 55 . . . gate pad, 56 . . . contact hole, 58 . . . current sensing pad, 59 . . . current sensing part, 60 . . . mesa part, 70 . . . transistor section, 72 . . . active section, 74 . . . outer periphery region, 76 . . . outer peripheral end, 80 . . . diode section, 81 . . . cathode region, 82 . . . first cathode region, 83 . . . second cathode region, 84 . . . third cathode region, 90 . . . temperature sensing part, 92 . . . temperature sensing wire, 94 . . . temperature measuring pad, 96 . . . detection part, 100 . . . semiconductor device, 200 . . . semiconductor device

What is claimed is:

1. A semiconductor device comprising:

a semiconductor substrate;

a first transistor section and a second transistor section provided on the semiconductor substrate; and a diode section provided on the semiconductor substrate, the first transistor section, the diode section and the second transistor section being arranged in a predetermined arrangement direction such that the diode section is adjacent to and sandwiched between the first transistor section and the second transistor section in the arrangement direction, wherein the diode section includes:

a drift region of a first conductivity-type provided in the semiconductor substrate;

a base region of a second conductivity-type extending to a height of an upper surface of the semiconductor substrate and provided above the drift region;

a plurality of first cathode regions of the first conductivity-type extending to a height of a lower surface of the semiconductor substrate in a depth direction and provided below the drift region; and a plurality of second cathode regions of the second conductivity-type extending to the height of the lower surface of the semiconductor substrate in the depth direction and provided below the drift region, the first transistor section and the second transistor section each include a collector region of the second conductivity-type extending to the height of the lower surface of the semiconductor substrate in the depth direction, the plurality of first cathode regions are provided continuously between the collector region of the first transistor section and the collector region of the second transistor section, one end of the plurality of first cathode regions in the arrangement direction is in contact with the collector region of the first transistor section and another end of the plurality of first cathode regions in the arrangement direction is in contact with the collector region of the second transistor section, and the plurality of first cathode regions and the plurality of second cathode regions are in contact with each other and alternating in a direction orthogonal to the arrangement direction.

2. The semiconductor device according to claim 1, wherein the diode section includes:

a plurality of third cathode regions of the second conductivity-type extending to the height of the lower surface of the semiconductor substrate, and provided below the drift region, the plurality of first cathode regions and the plurality of second cathode regions being sandwiched between the plurality of third cathode regions, and a width of the plurality of third cathode regions in the arrangement direction is greater than a width of the plurality of second cathode regions in the arrangement direction, as seen from above the semiconductor substrate.

3. The semiconductor device according to claim 2, wherein a width of the plurality of second cathode regions in a direction in which the plurality of first cathode regions and the plurality of second cathode regions are sandwiched between the plurality of third cathode regions is greater than the width of the plurality of second cathode regions in the arrangement direction, as seen from above the semiconductor substrate.

4. The semiconductor device according to claim 2, wherein the plurality of second cathode regions are in contact with the plurality of third cathode regions, as seen from above the semiconductor substrate.

5. The semiconductor device according to claim 2, wherein a doping concentration of the plurality of third cathode regions is the same as a doping concentration of the plurality of second cathode regions.

6. The semiconductor device according to claim 2, wherein a ratio, expressed in percentage, of a total area of the plurality of second cathode regions and the plurality of third cathode regions to a total area of the plurality of first cathode regions, the plurality of second cathode regions and the plurality of third cathode regions is 10% or more and 40% or less.

7. The semiconductor device according to claim 2, wherein the plurality of first cathode regions are provided to alternate with the plurality of third cathode regions in the direction orthogonal to the arrangement direction.

8. The semiconductor device according to claim 2, wherein the plurality of third cathode regions are provided to be in contact with an end portion of each of the plurality of second cathode regions.

9. The semiconductor device of claim 1, wherein a width of each of the plurality of first cathode regions is greater than a width of each of the plurality of second cathode regions, in the direction orthogonal to the arrangement direction.

10. The semiconductor device of claim 1, wherein the plurality of first cathode regions and the plurality of second cathode regions are provided below a buffer region of the first conductivity-type.

11. The semiconductor device of claim 1, wherein the diode section further includes two collector regions of the second conductivity-type, extending to the height of the lower surface of the semiconductor substrate; and the plurality of first cathode regions and the plurality of second cathode regions are sandwiched between the two collector regions in the direction orthogonal to the arrangement direction.

12. The semiconductor device of claim 1 further comprising a buffer region of the first conductivity-type, situated below the drift region; and a collector electrode below the lower surface of the semiconductor substrate.

13. The semiconductor device of claim 12, wherein the plurality of first cathode regions and the plurality of second cathode regions are sandwiched between the buffer region and the collector electrode in the depth direction.

14. The semiconductor device of claim 1, wherein a ratio of an area of the plurality of second cathode regions to a total area of the plurality of first cathode regions and the plurality of second cathode regions is 10% or more and 40% or less.

15. The semiconductor device of claim 1, wherein the plurality of second cathode regions are provided continuously between the collector region of the first transistor section and the collector region of the second transistor section, one end of the plurality of second cathode regions in the arrangement direction is in contact with the collector region of the first transistor section and another end of the plurality of second cathode regions in the arrangement direction is in contact with the collector region of the second transistor section.

* * * * *